(12) United States Patent
Kawasaki et al.

(10) Patent No.: US 10,854,513 B2
(45) Date of Patent: Dec. 1, 2020

(54) CAVITY-DISRUPTING BACKSIDE TRENCH FILL STRUCTURES FOR A THREE-DIMENSIONAL MEMORY DEVICE AND METHOD OF MAKING THE SAME

(71) Applicant: SANDISK TECHNOLOGIES LLC, Addison, TX (US)

(72) Inventors: Motoki Kawasaki, Yokkaichi (JP); Toshiyuki Sega, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 29 days.

(21) Appl. No.: 16/249,352

(22) Filed: Jan. 16, 2019

(65) Prior Publication Data
US 2020/0227318 A1 Jul. 16, 2020

(51) Int. Cl.
*H01L 21/768* (2006.01)
*H01L 27/11524* (2017.01)
(Continued)

(52) U.S. Cl.
CPC .. *H01L 21/76895* (2013.01); *H01L 21/76805* (2013.01); *H01L 21/76816* (2013.01);
(Continued)

(58) Field of Classification Search
CPC ......... H01L 21/76895; H01L 21/76805; H01L 21/76816; H01L 21/76849; H01L 21/76846; H01L 23/5283; H01L 23/535; H01L 27/11524; H01L 27/11556; H01L 27/1157; H01L 27/11582
See application file for complete search history.

(56) References Cited

U.S. PATENT DOCUMENTS 5,915,167 A 6/1999 Leedy
9,230,984 B1 1/2016 Takeguchi
(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

*Primary Examiner* — Christine A Enad
(74) *Attorney, Agent, or Firm* — The Marbury Law Group, PLLC

(57) ABSTRACT

An alternating stack of insulating layers and sacrificial material layers is formed over a semiconductor material layer. Memory stack structures are formed through the alternating stack. A backside trench is formed through the alternating stack. The sacrificial material layers are replaced with electrically conductive layers. An insulating spacer is formed on sidewalls of the backside trench. A first doped semiconductor material is deposited within the backside trench. Vertical cavities are formed by vertically recessing the first doped semiconductor material at discrete locations that are laterally spaced apart. A second doped semiconductor material is deposited in the vertical cavities. The second doped semiconductor material disrupts a laterally-extending cavity in the first doped semiconductor material, thereby providing a structurally reinforced network of the first and second doped semiconductor materials for a backside contact via structure that is formed in the backside trench.

20 Claims, 55 Drawing Sheets

(51) Int. Cl.
*H01L 27/11556* (2017.01)
*H01L 27/1157* (2017.01)
*H01L 27/11582* (2017.01)
*H01L 23/528* (2006.01)
*H01L 23/535* (2006.01)

(52) U.S. Cl.
CPC .. *H01L 21/76846* (2013.01); *H01L 21/76849* (2013.01); *H01L 23/5283* (2013.01); *H01L 23/535* (2013.01); *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 9,343,358 B1 | 5/2016 | Xu | |
| 9,419,135 B2 | 8/2016 | Baenninger et al. | |
| 9,437,543 B2 | 9/2016 | Nakada et al. | |
| 9,443,861 B1 | 9/2016 | Pachamuthu et al. | |
| 9,455,267 B2 | 9/2016 | Zhang et al. | |
| 9,524,981 B2 | 12/2016 | Pachamuthu et al. | |
| 9,698,223 B2 | 7/2017 | Sharangpani et al. | |
| 9,799,671 B2 | 10/2017 | Pachamuthu et al. | |
| 9,887,207 B2 | 2/2018 | Zhang et al. | |
| 9,917,093 B2 | 3/2018 | Chu et al. | |
| 10,103,161 B2 | 10/2018 | Ito et al. | |
| 2009/0090960 A1* | 4/2009 | Izumi | H01L 27/115 257/324 |
| 2016/0049421 A1 | 2/2016 | Zhang et al. | |
| 2016/0086969 A1 | 3/2016 | Zhang et al. | |
| 2016/0141419 A1 | 5/2016 | Baenninger et al. | |
| 2016/0149002 A1 | 5/2016 | Sharangpani et al. | |
| 2016/0218059 A1* | 7/2016 | Nakada | H01L 27/11556 |
| 2016/0300848 A1 | 10/2016 | Pachamuthu et al. | |
| 2016/0329343 A1* | 11/2016 | Pachamuthu | H01L 27/11582 |
| 2017/0373078 A1 | 12/2017 | Chu et al. | |
| 2017/0373087 A1 | 12/2017 | Ito et al. | |
| 2018/0006049 A1 | 1/2018 | Inomata et al. | |
| 2018/0374865 A1 | 12/2018 | Shimabukuro et al. | |
| 2019/0305095 A1* | 10/2019 | Choi | H01L 29/41741 |
| 2019/0305096 A1* | 10/2019 | Choi | H01L 27/11582 |
| 2019/0348433 A1* | 11/2019 | Choi | H01L 27/11582 |

* cited by examiner

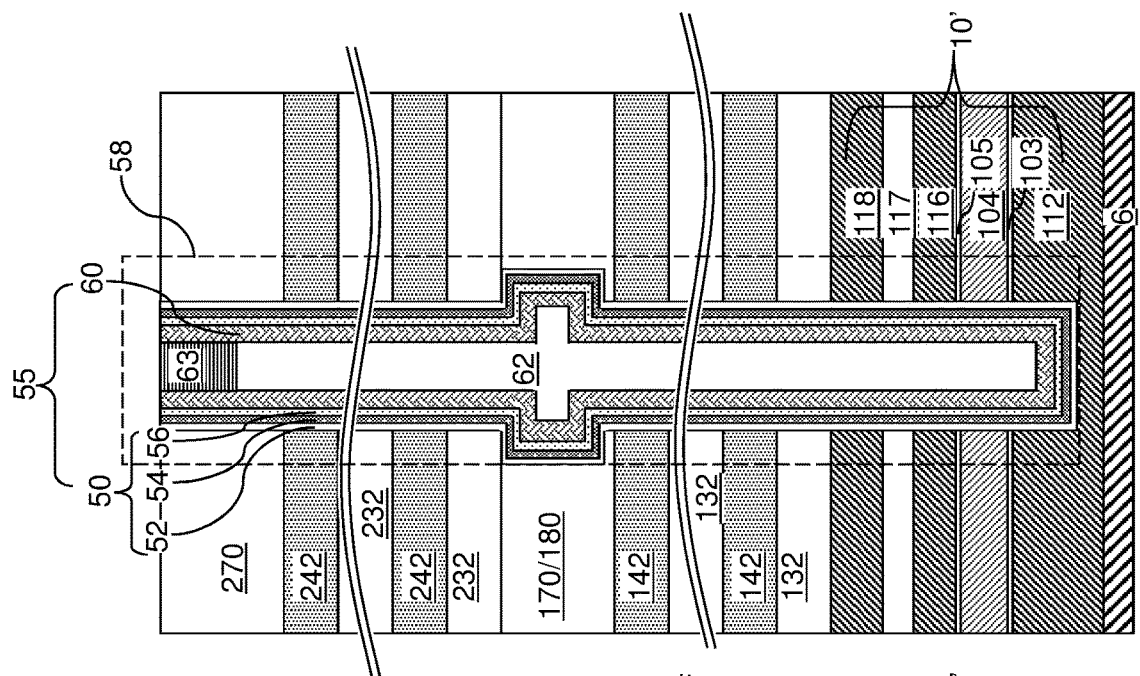
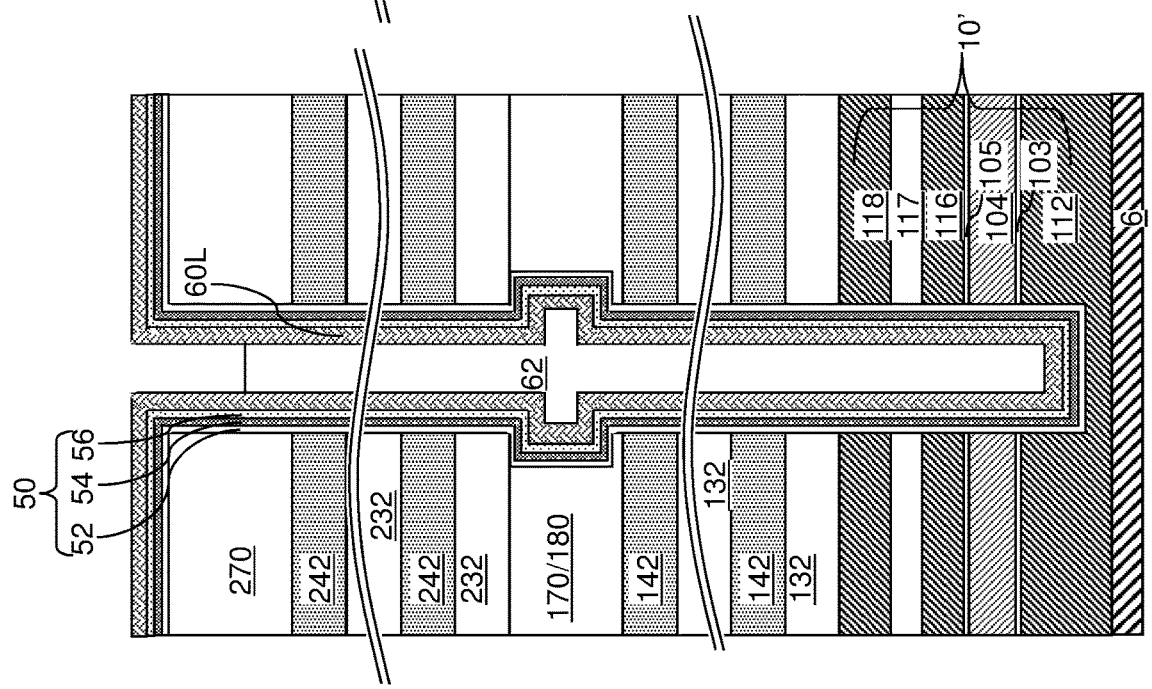

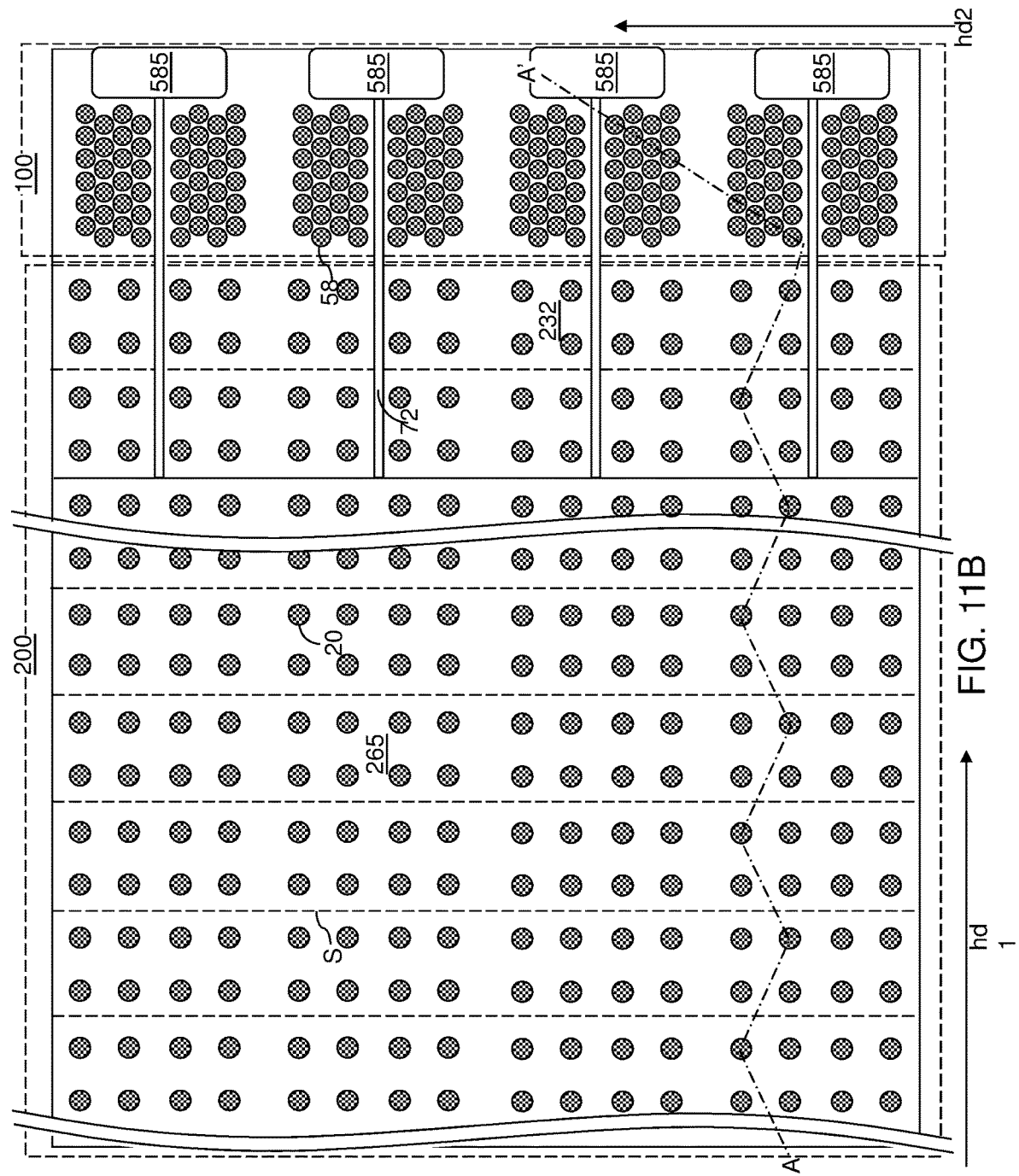

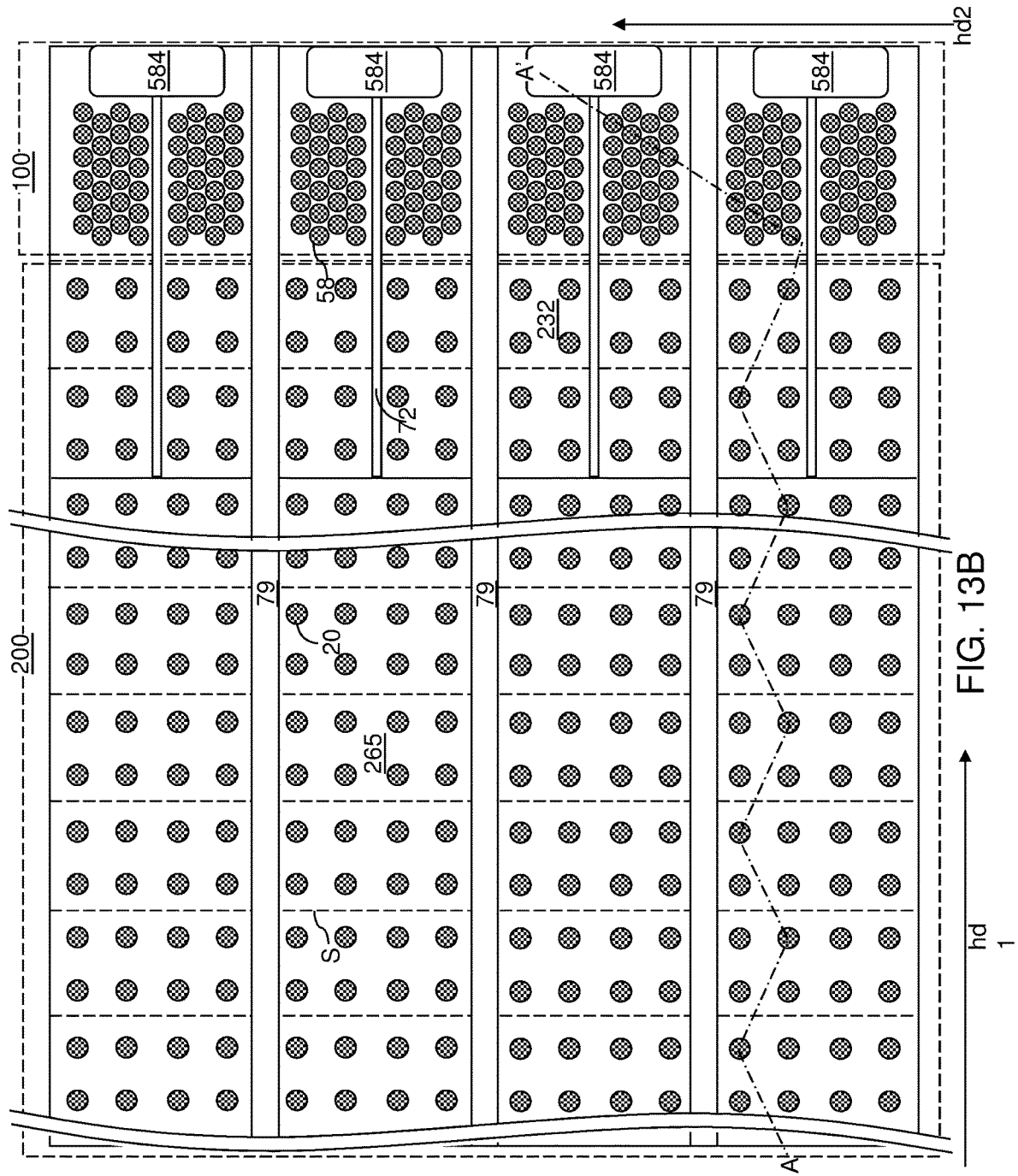

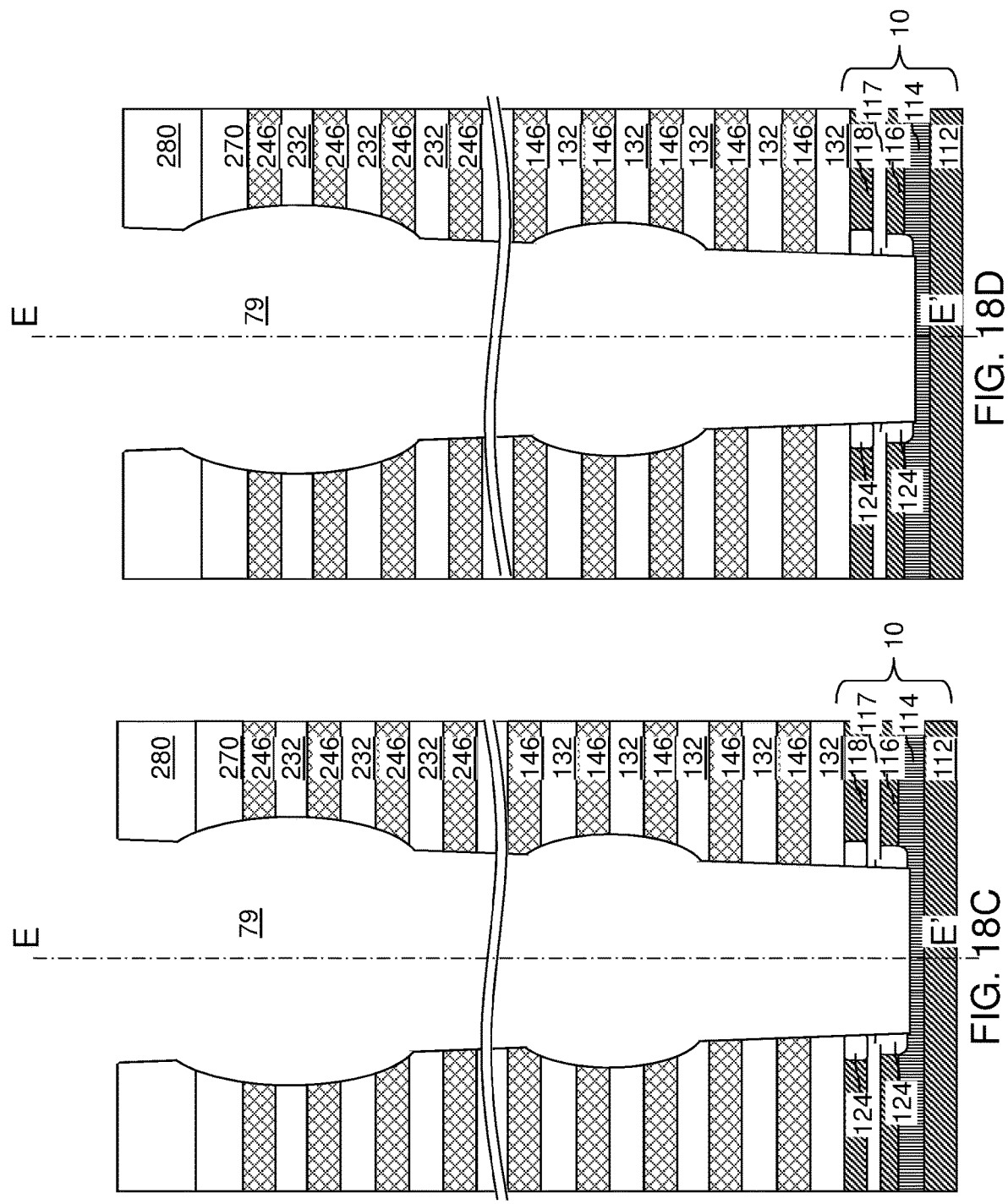

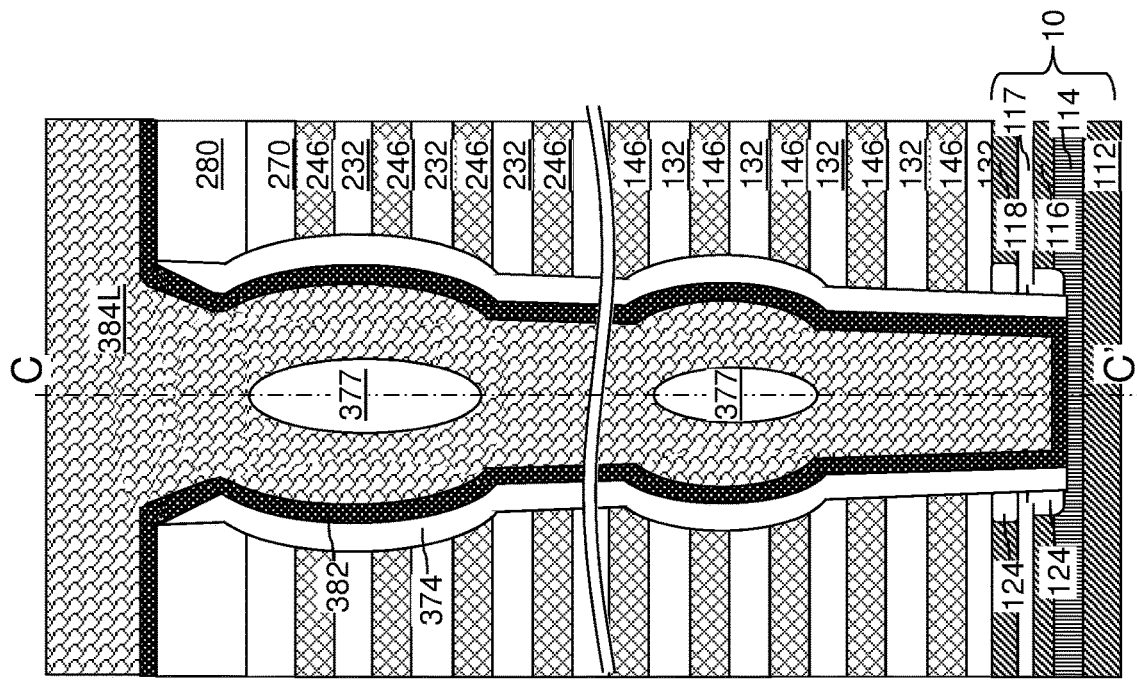
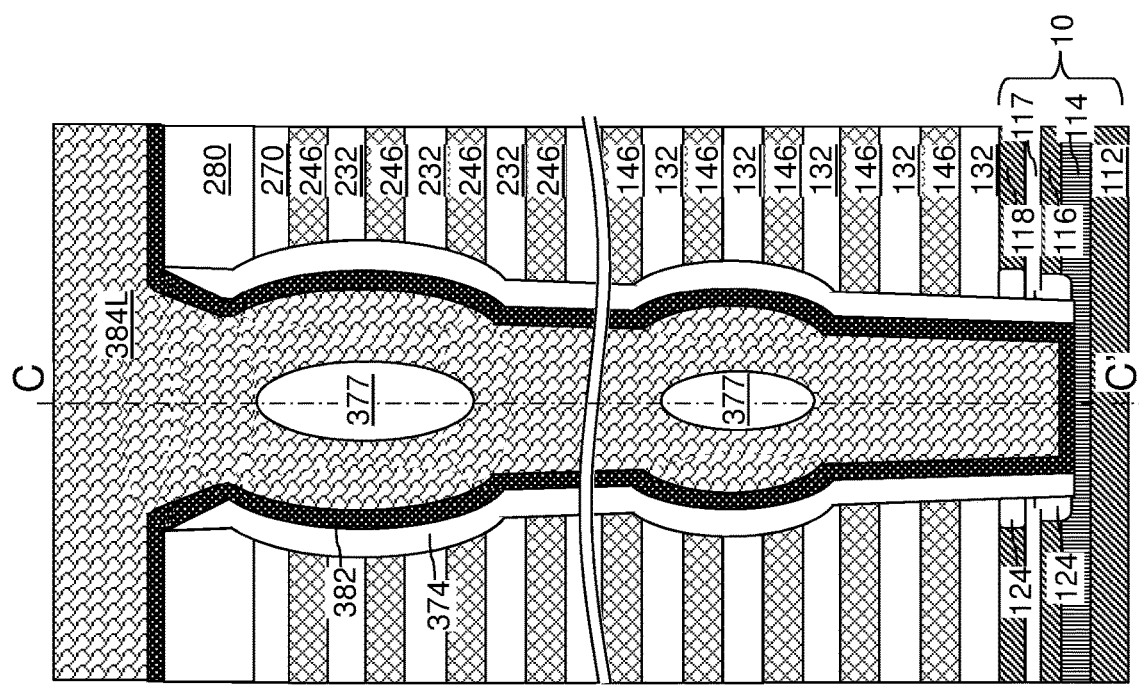

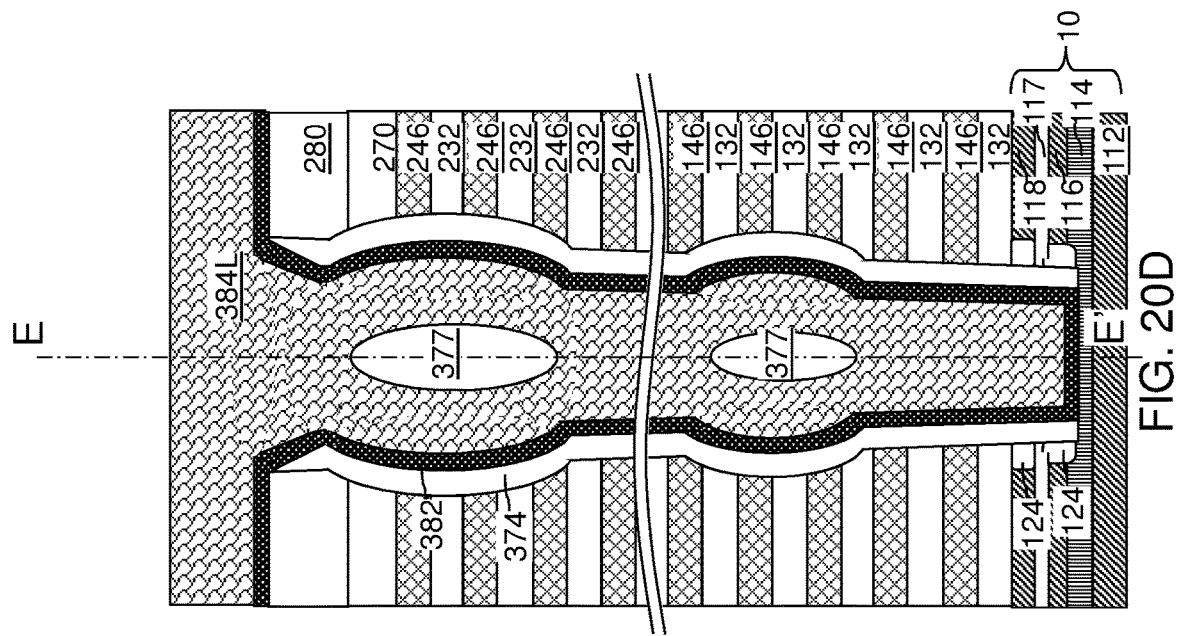
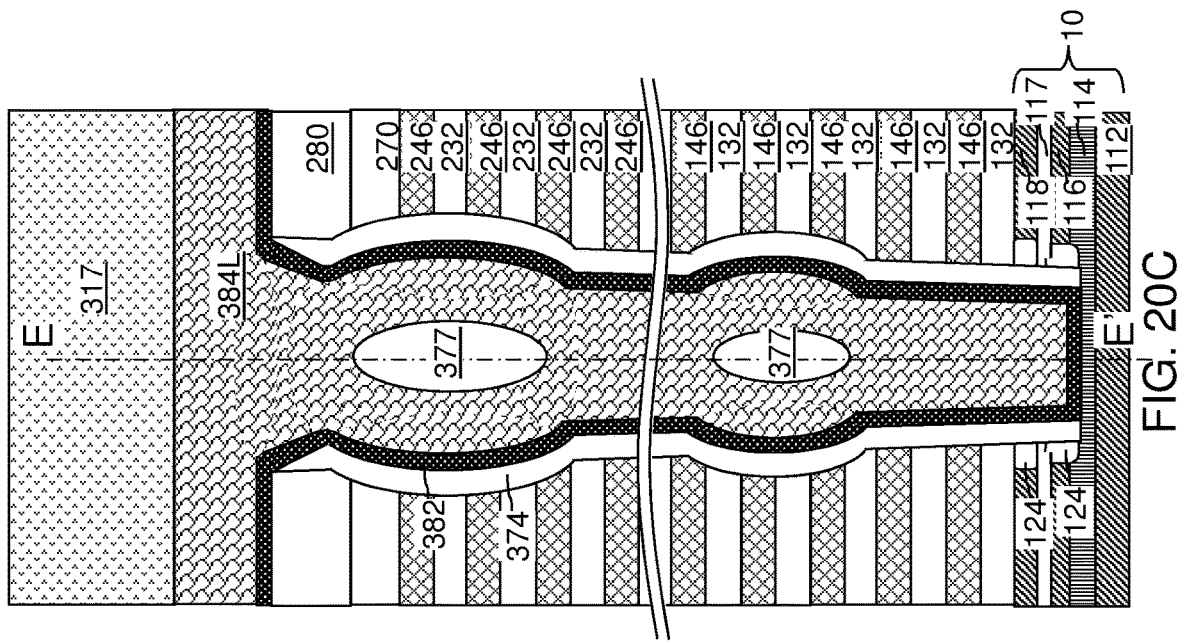

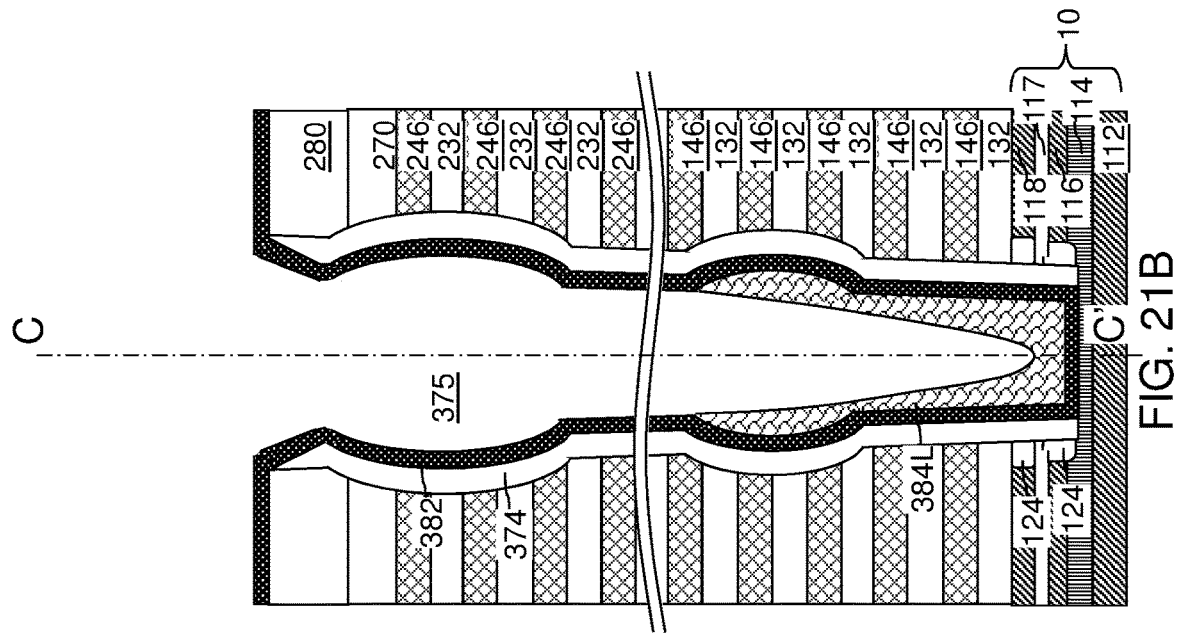
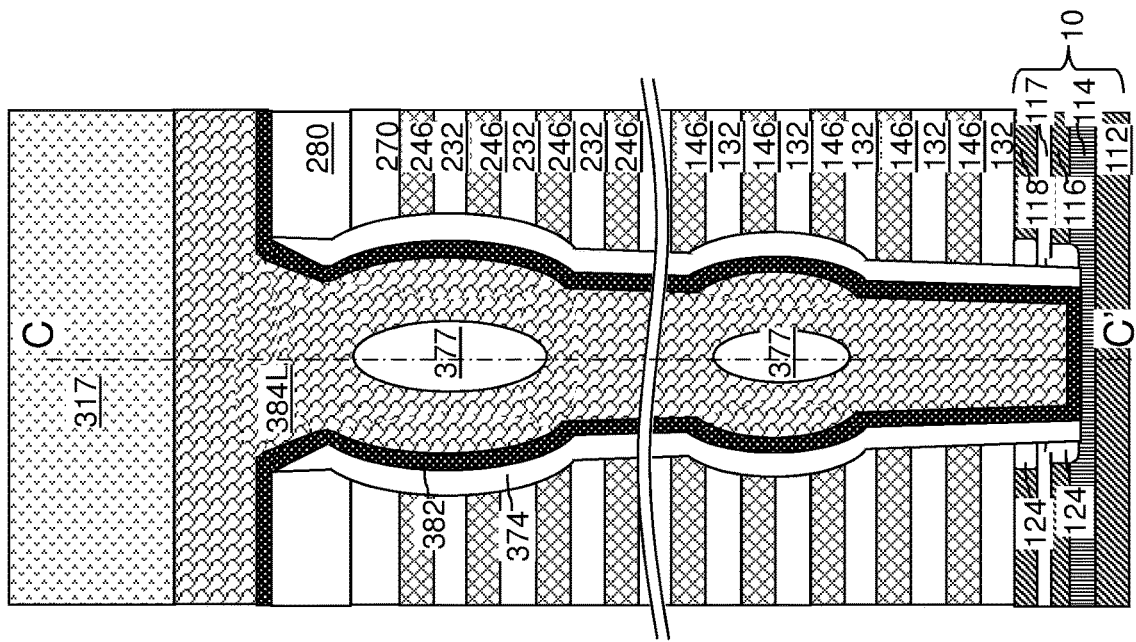

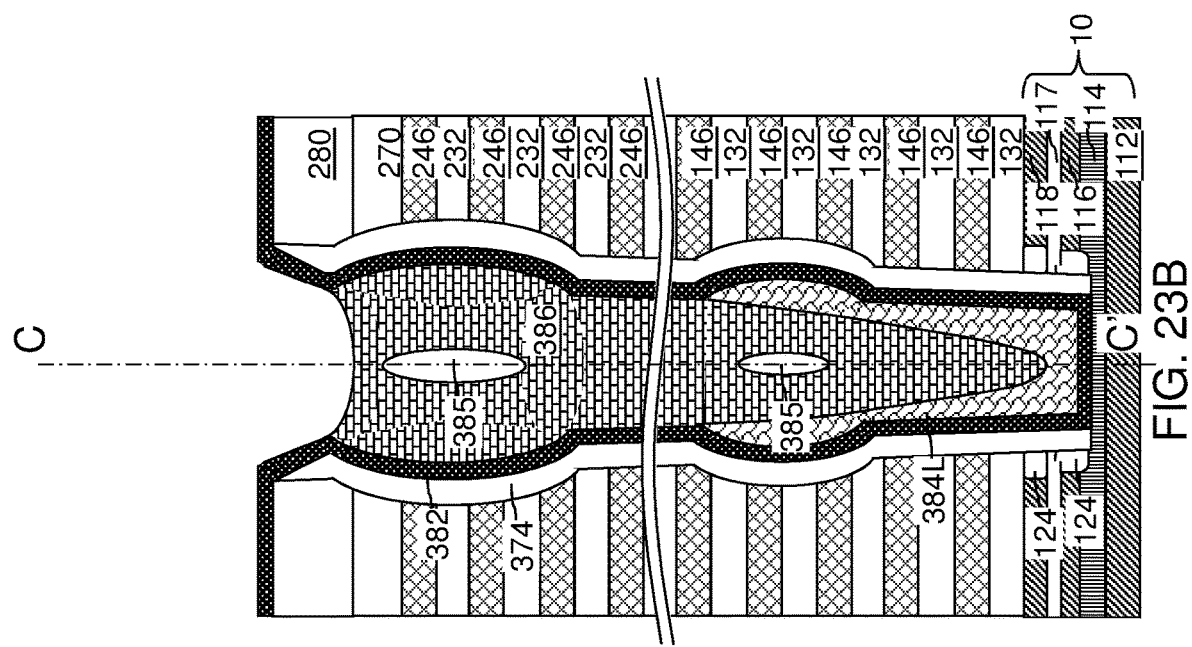
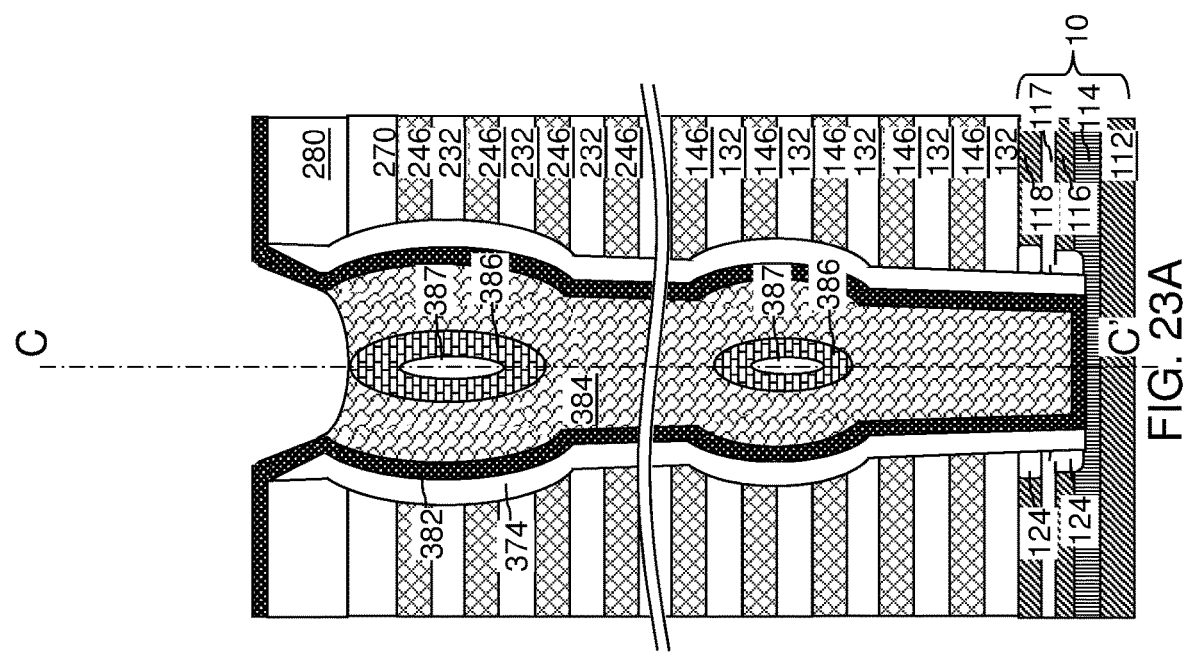

CAVITY-DISRUPTING BACKSIDE TRENCH FILL STRUCTURES FOR A THREE-DIMENSIONAL MEMORY DEVICE AND METHOD OF MAKING THE SAME

FIELD

The present disclosure relates generally to the field of semiconductor devices, and particular to a three-dimensional memory device including backside trench fill structures that prevents formation of continuous cavities therein and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: alternating stacks of insulating layers and electrically conductive layers located over a semiconductor material layer, wherein a neighboring pair of alternating stacks is laterally spaced apart from each other by a backside trench that laterally extends along a first horizontal direction; memory stack structures vertically extending through a respective one of the alternating stacks comprising a respective vertical semiconductor channel; an insulating spacer contacting sidewalls of the backside trench; and a backside contact via structure located within the insulating spacer and comprising: at least one first doped semiconductor material portion comprising a first semiconductor material and located within a volume laterally surrounded by the insulating spacer; and at least one second doped semiconductor material portion comprising a second semiconductor material and located within the volume, wherein the backside contact via structure has at least one feature selected from: the second semiconductor material has a different material composition than the first semiconductor material; or an interfacial semiconductor oxide layer having a thickness that provides conductive electrical contact thereacross is located at an interface between each neighboring pair of the at least one first doped semiconductor material portion and the at least one second doped semiconductor material portion.

According to another embodiment of the present disclosure, a method of forming a three-dimensional semiconductor device is provided, which comprises the steps of: forming an alternating stack of insulating layers and sacrificial material layers over a semiconductor material layer; forming memory stack structures vertically extending through the alternating stack; forming a backside trench vertically extending through the alternating stack and laterally extending along a first horizontal direction; replacing the sacrificial material layers with electrically conductive layers; forming an insulating spacer on sidewalls of the backside trench; depositing a first doped semiconductor material within the backside trench; vertically recessing first portions of the first doped semiconductor material at discrete locations that are laterally spaced apart along the first horizontal direction while not removing second portions of the first doped semiconductor material between the discrete locations; and depositing a second doped semiconductor material in volumes formed by removal of the first portions of the first doped semiconductor material, wherein a backside contact via structure is formed within the insulating spacer, the backside contact via structure comprising at least one first doped semiconductor material portion comprising the first semiconductor material and at least one second doped semiconductor material portion comprising the second semiconductor material.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

FIG. 18C is a vertical cross-sectional view of the exemplary structure along the vertical plane C-C' of FIG. 18B. The vertical plane E-E' is the plane of the vertical cross-section of FIG. 18E.

FIG. 18D is a vertical cross-sectional view of the exemplary structure along the vertical plane D-D' of FIG. 18B. The vertical plane E-E' is the plane of the vertical cross-section of FIG. 18E.

FIG. 19A is a vertical cross-sectional view of the exemplary structure after deposition of a first doped semiconductor material along a vertical plane that corresponds to the vertical plane C-C' of FIG. 18B according to an embodiment of the present disclosure. The vertical plane C-C' is the plane of the vertical cross-section of FIG. 19C.

FIG. 19B is a vertical cross-sectional view of the exemplary structure of FIG. 19A along a vertical plane that corresponds to the vertical plane D-D' of FIG. 18B. The vertical plane C-C' is the plane of the vertical cross-section of FIG. 19C.

FIG. 20C is a vertical cross-sectional view of the exemplary structure along the vertical plane C-C' of FIG. 20B. The vertical plane E-E' is the plane of the vertical cross-section of FIG. 20E.

FIG. 20D is a vertical cross-sectional view of the exemplary structure along the vertical plane D-D' of FIG. 20B. The vertical plane E-E' is the plane of the vertical cross-section of FIG. 20E.

FIG. 21A is a vertical cross-sectional view of the exemplary structure after an anisotropic etch that vertically recesses the first doped semiconductor material along a vertical plane that corresponds to the vertical plane C-C' of FIG. 20B according to an embodiment of the present disclosure. The vertical plane C-C' is the plane of the vertical cross-section of FIG. 21C.

FIG. 21B is a vertical cross-sectional view of the exemplary structure of FIG. 21A along a vertical plane that corresponds to the vertical plane D-D' of FIG. 20B. The vertical plane C-C' is the plane of the vertical cross-section of FIG. 21C.

FIG. 23A is a vertical cross-sectional view of the exemplary structure after vertically recessing first and second doped semiconductor materials along a vertical plane that corresponds to the vertical plane C-C' of FIG. 20B according to an embodiment of the present disclosure. The vertical plane C-C' is the plane of the vertical cross-section of FIG. 23C.

FIG. 23B is a vertical cross-sectional view of the exemplary structure of FIG. 23A along a vertical plane that corresponds to the vertical plane D-D' of FIG. 20B. The vertical plane C-C' is the plane of the vertical cross-section of FIG. 23C.

DETAILED DESCRIPTION

Figure 1A:
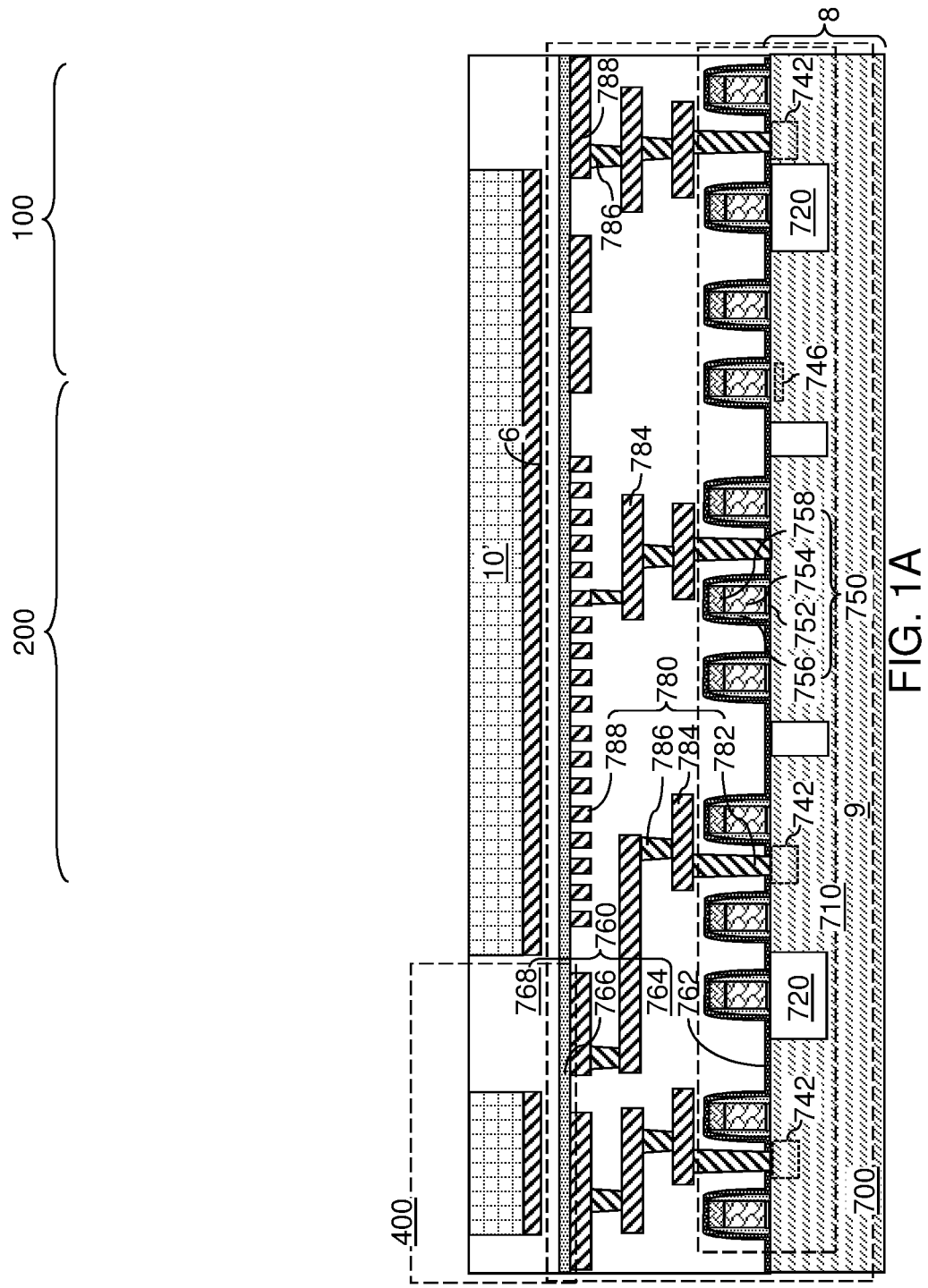
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

Neighboring alternating stacks of insulating layers and electrically conductive layers (e.g., word lines) in a three-dimensional NAND memory device may be laterally spaced apart by backside trenches. The backside trenches are filled with backside trench fill structures which are prone to formation of continuous cavities extending along the lengthwise direction of the backside trenches. The continuous cavities structurally weaken the device structure, thereby rendering the device structure vulnerable to deformation or collapse. As discussed above, the embodiments of the present disclosure provide a three-dimensional memory device including backside trench fill structures that prevent or reduce formation of continuous cavities therein and methods of manufacturing the same, the various aspects of which are described herein in detail. The embodiments of the present disclosure may be used to form various semiconductor devices such as three-dimensional monolithic memory array devices comprising a plurality of NAND memory strings. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device.

For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
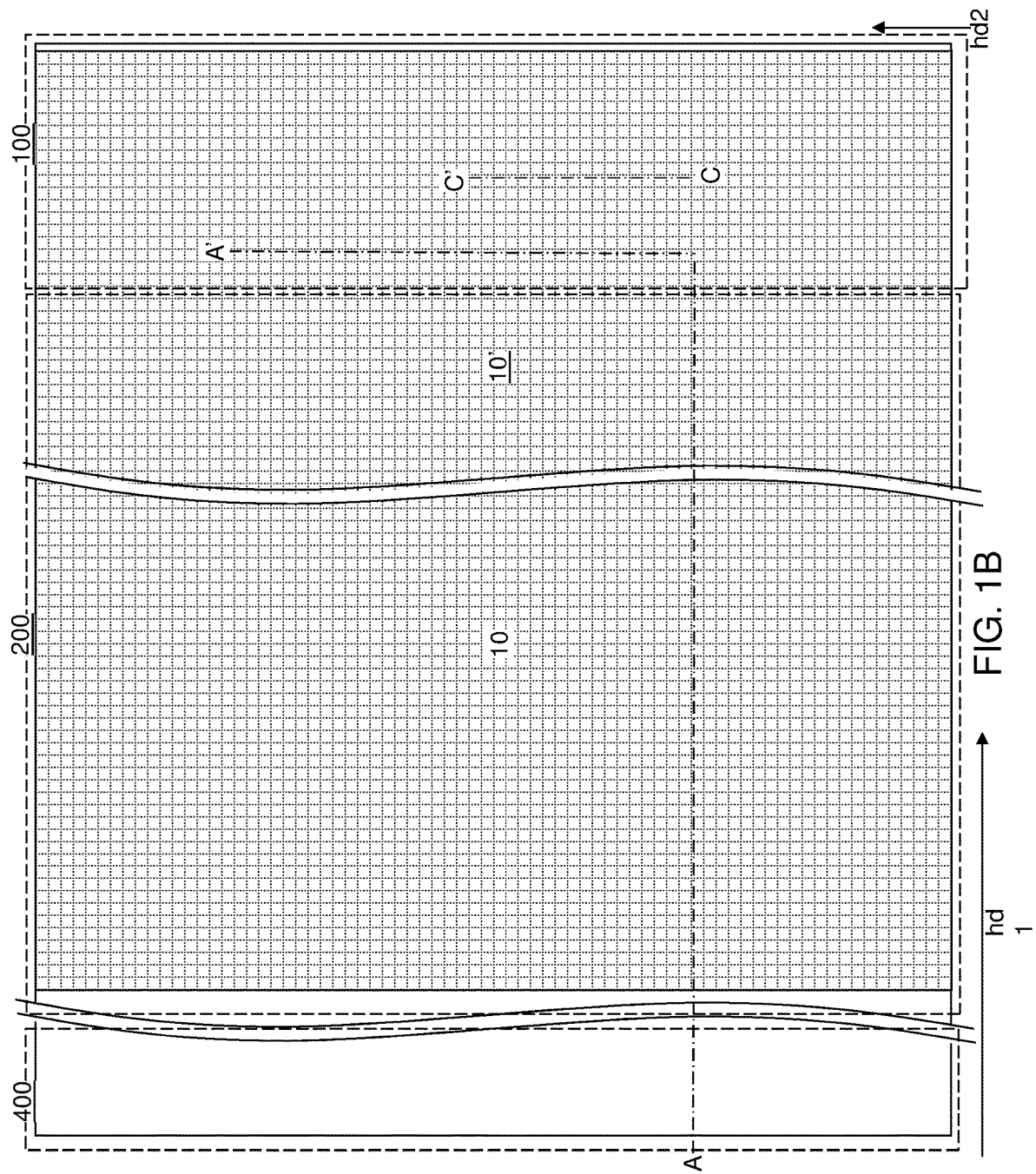
FIG. 1B is a top-down view of the exemplary structure of FIG. 1A. The hinged vertical plane A-A' is the plane of the vertical cross-sectional view of FIG. 1A.
Figure 1C:
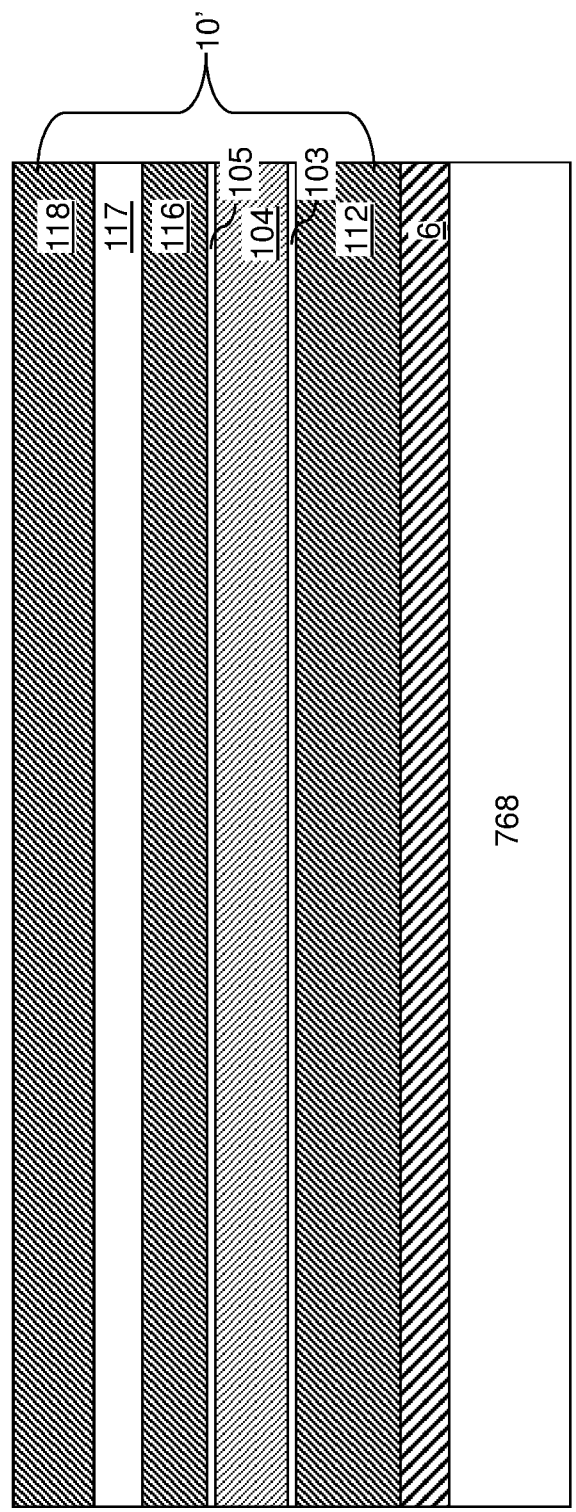
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
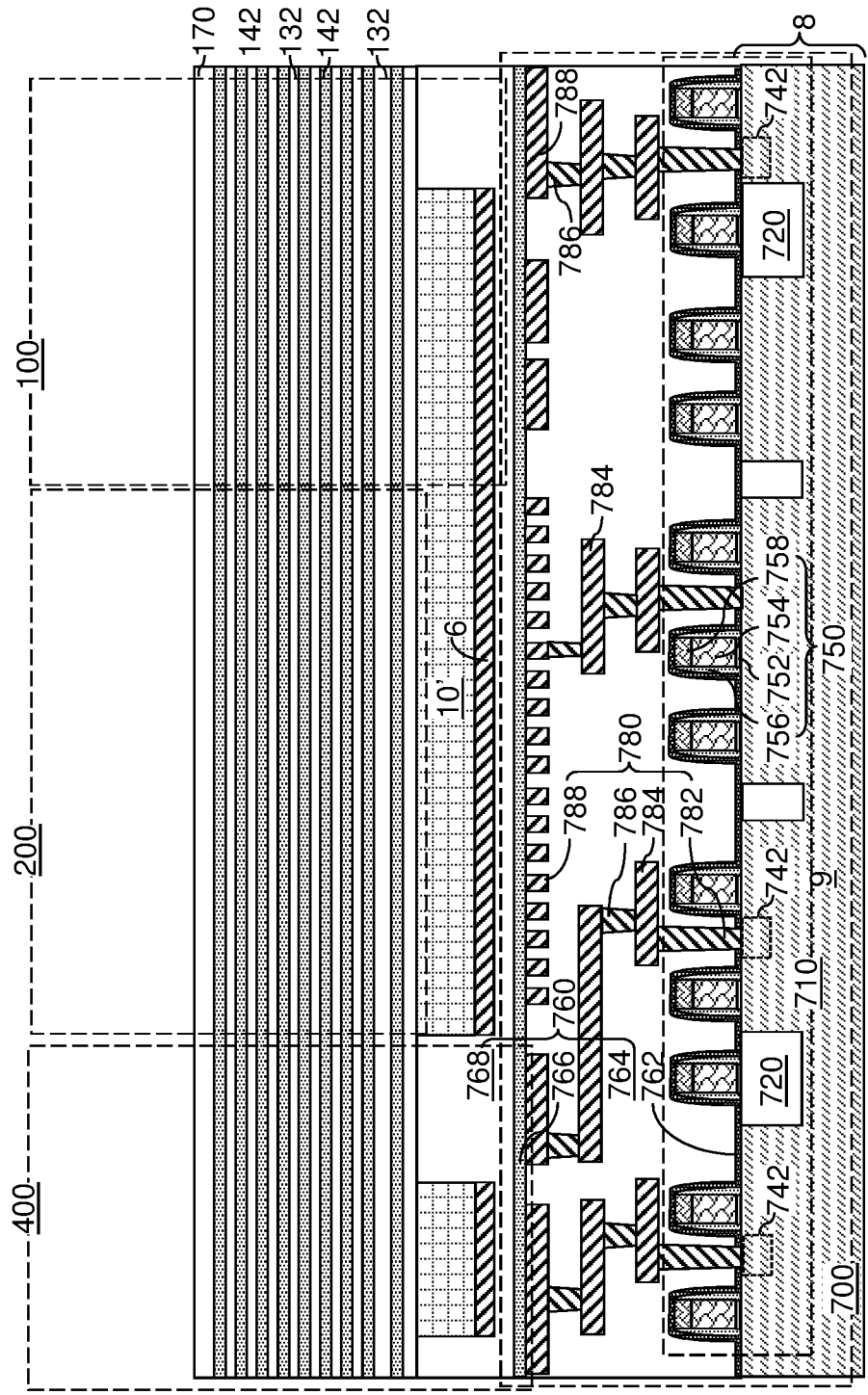
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
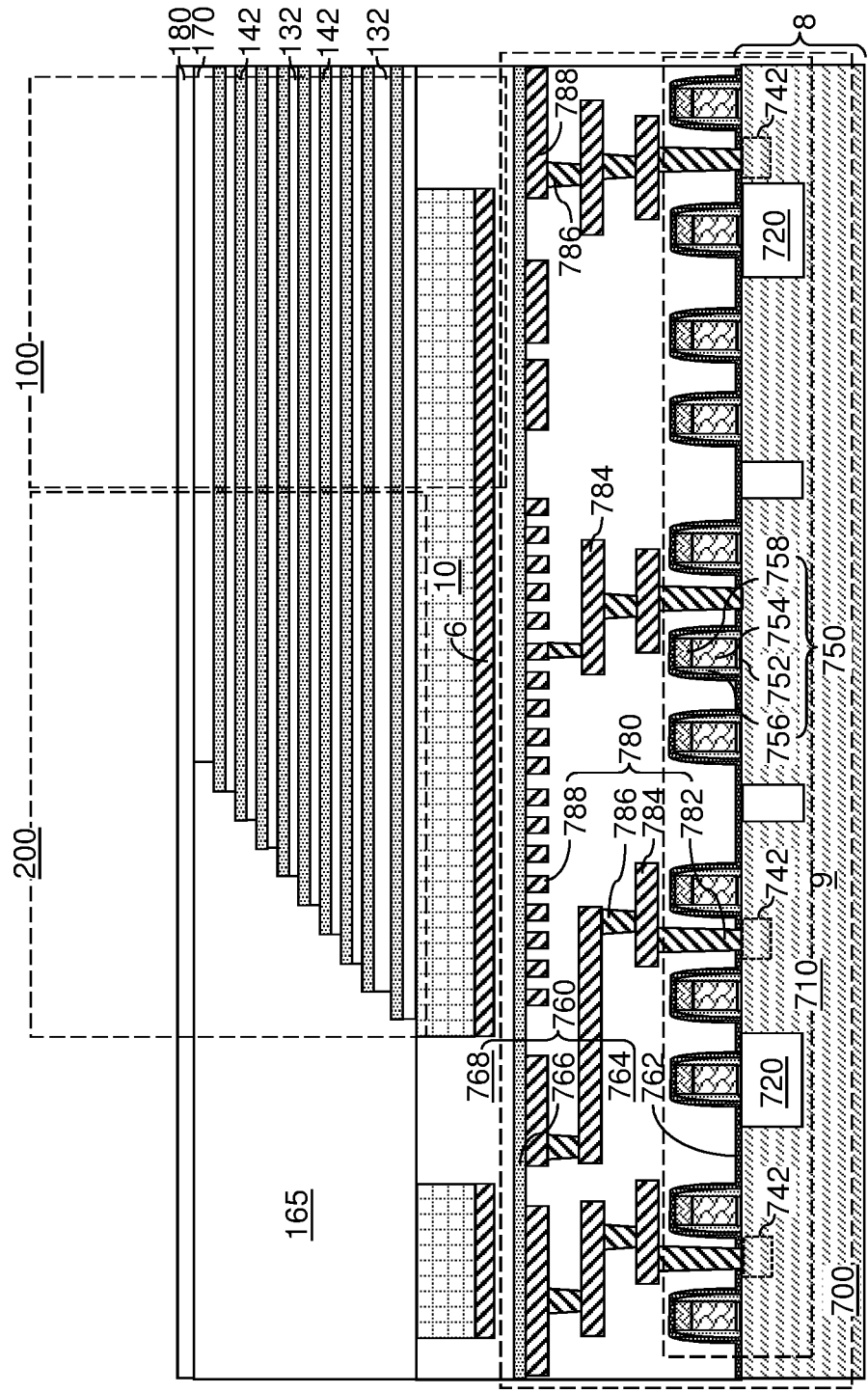
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
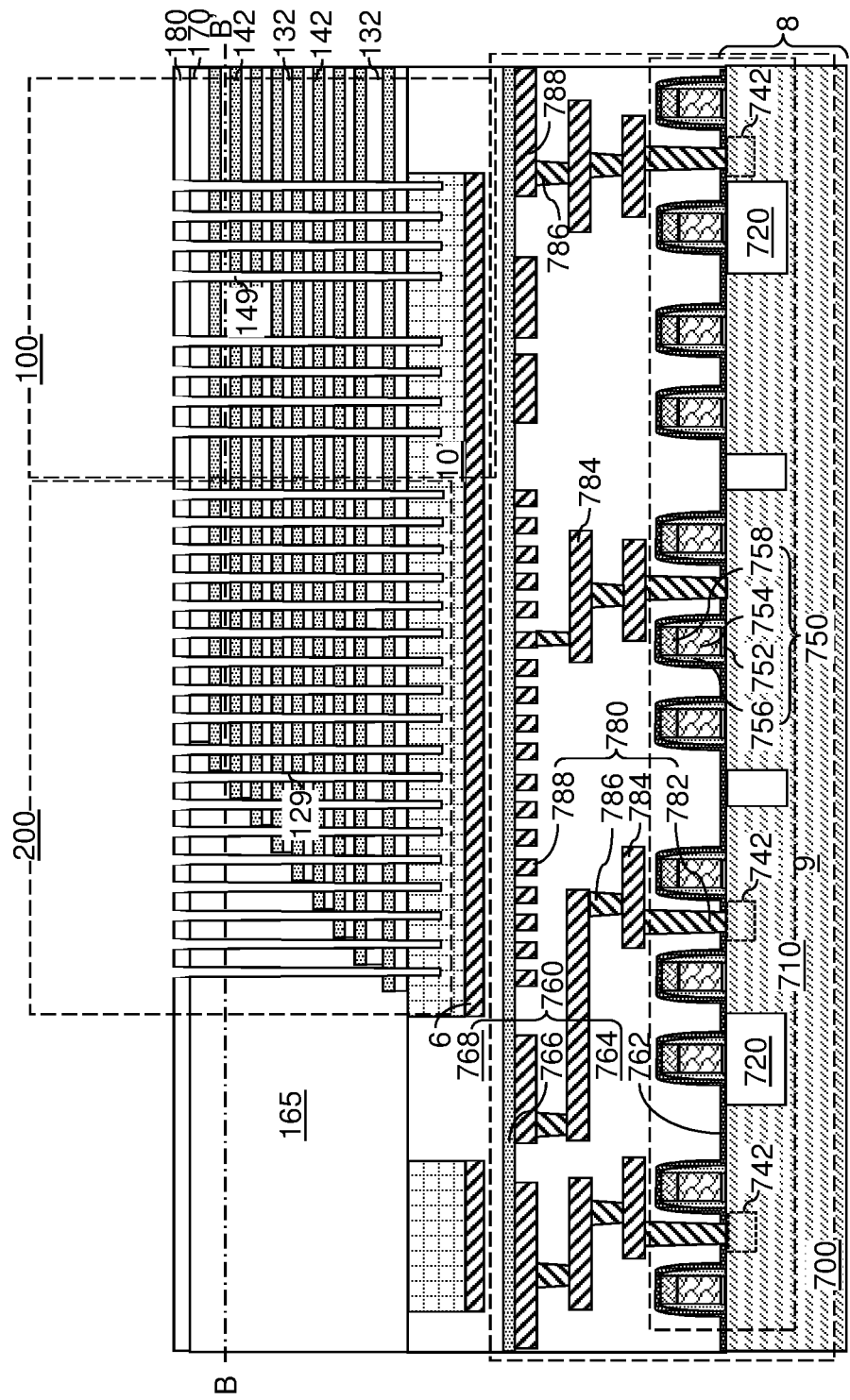
FIG. 4A is a vertical cross-sectional view of the exemplary structure after formation of first-tier memory openings and first-tier support openings according to an embodiment of the present disclosure.
Figure 4B:
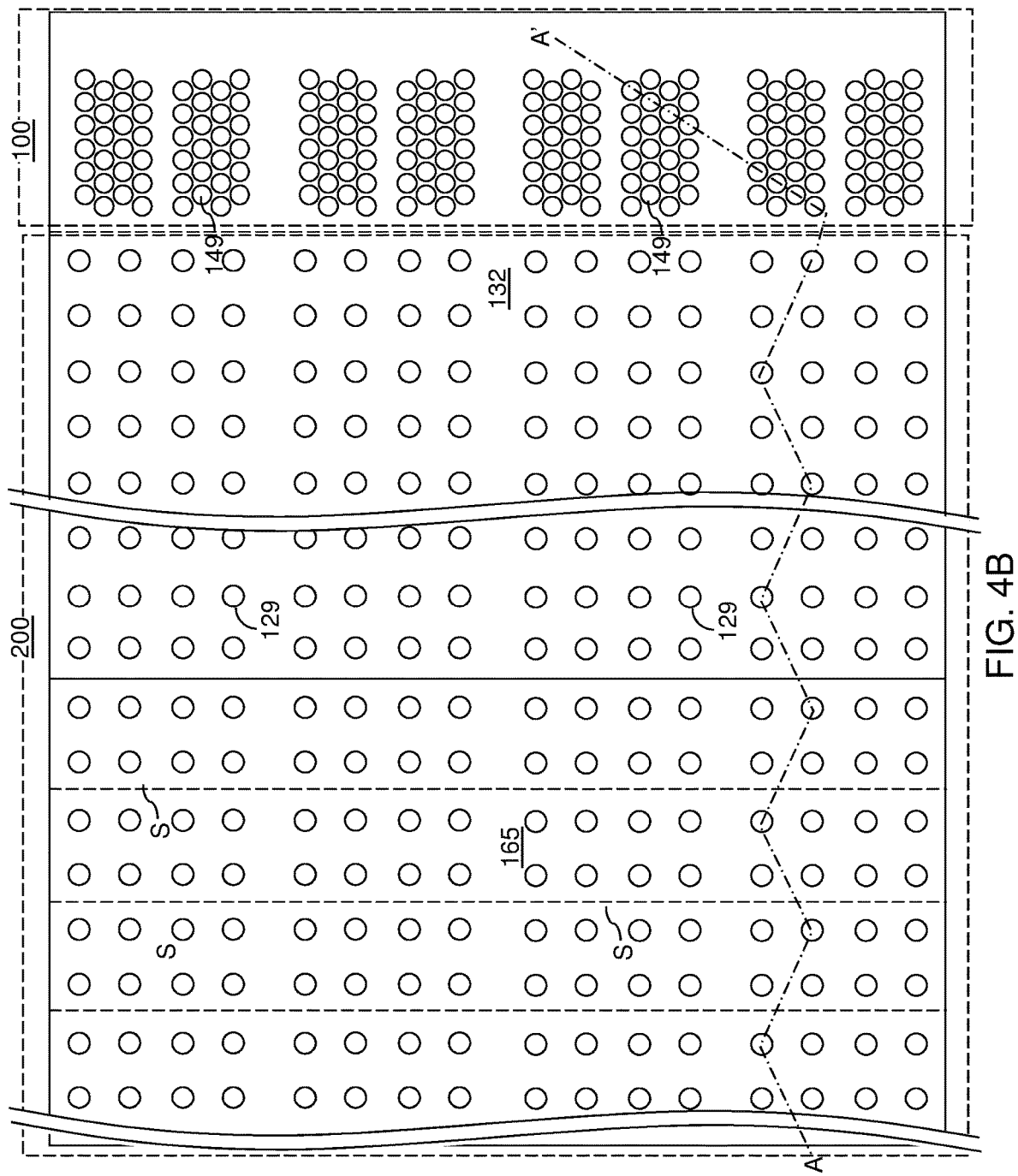
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200 and are subsequently used to form staircase-region contact via structures that interconnect a respective pair of an underlying lower-level metal interconnect structure 780 (such as a landing-pad-level metal line structure 788) and an electrically conductive layer (which may be formed as one of the spacer material layers or may be formed by replacement of a sacrificial material layer within the electrically conductive layer). A subset of the first-tier support openings 129 that is formed through the first retro-stepped dielectric material portion 165 may be formed through a respective horizontal surface of the first stepped surfaces. Further, each of the first-tier support openings 129 may be formed directly above (i.e., above, and with an areal overlap with) a respective one of the lower-level metal interconnect structure 780.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
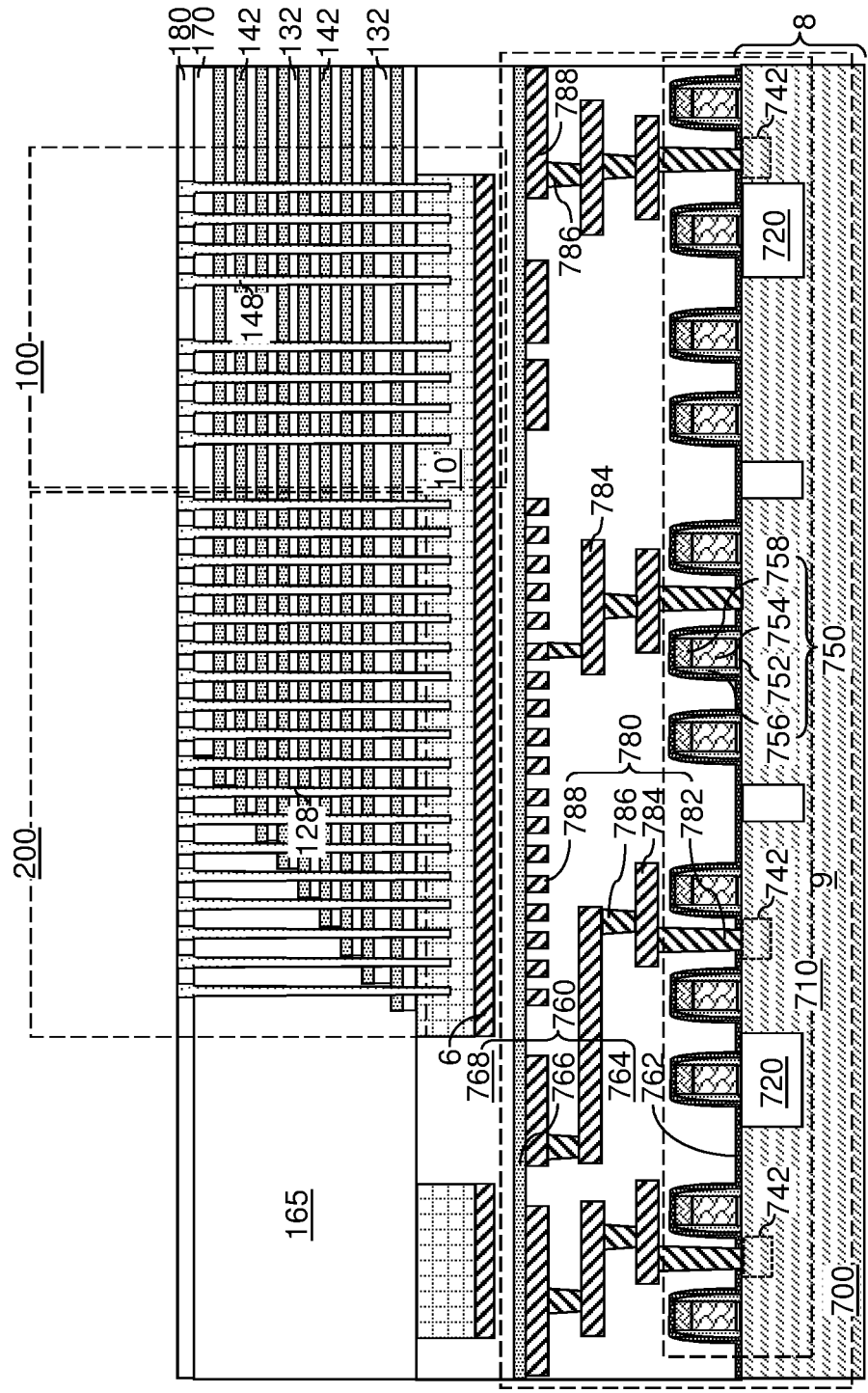
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
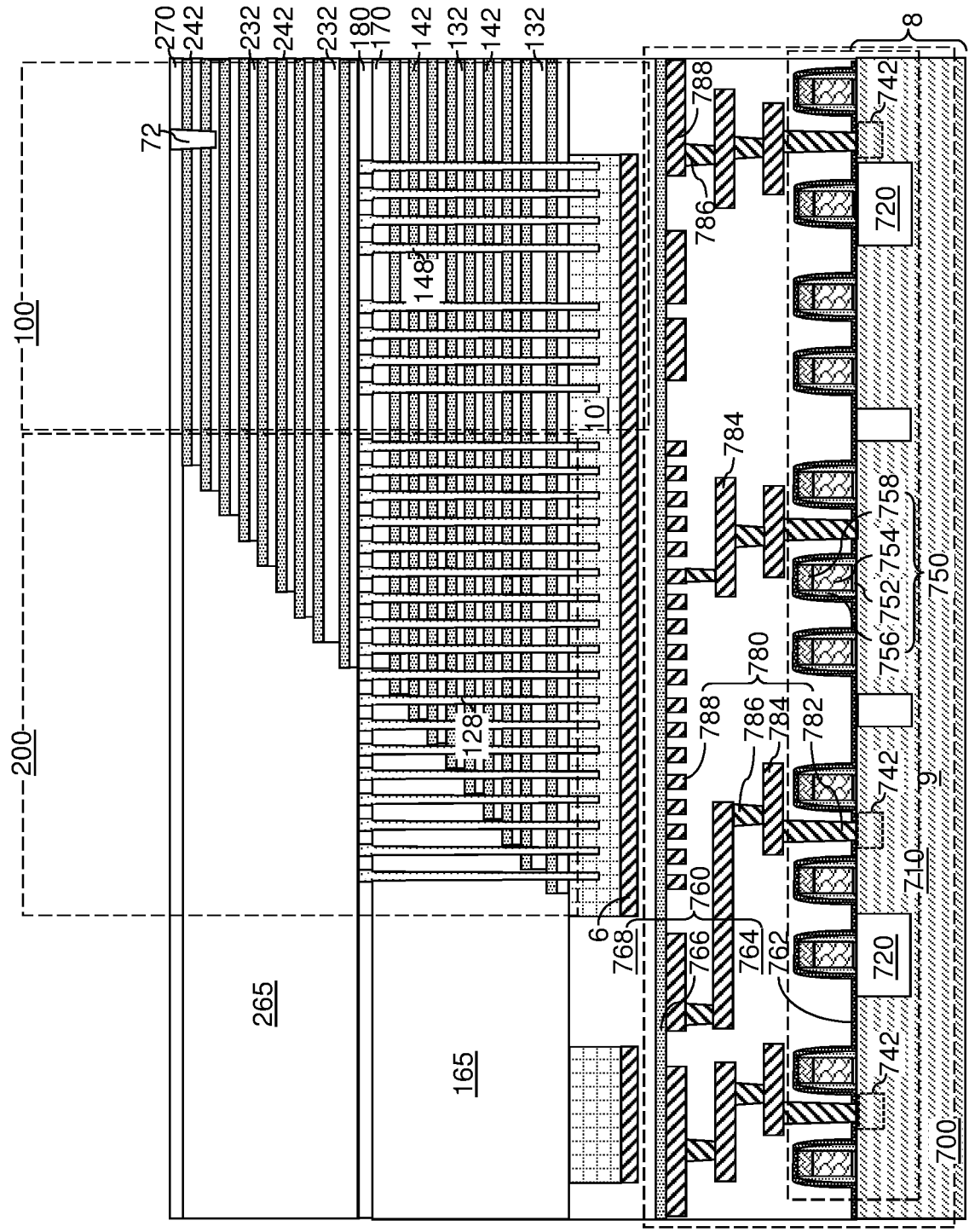
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
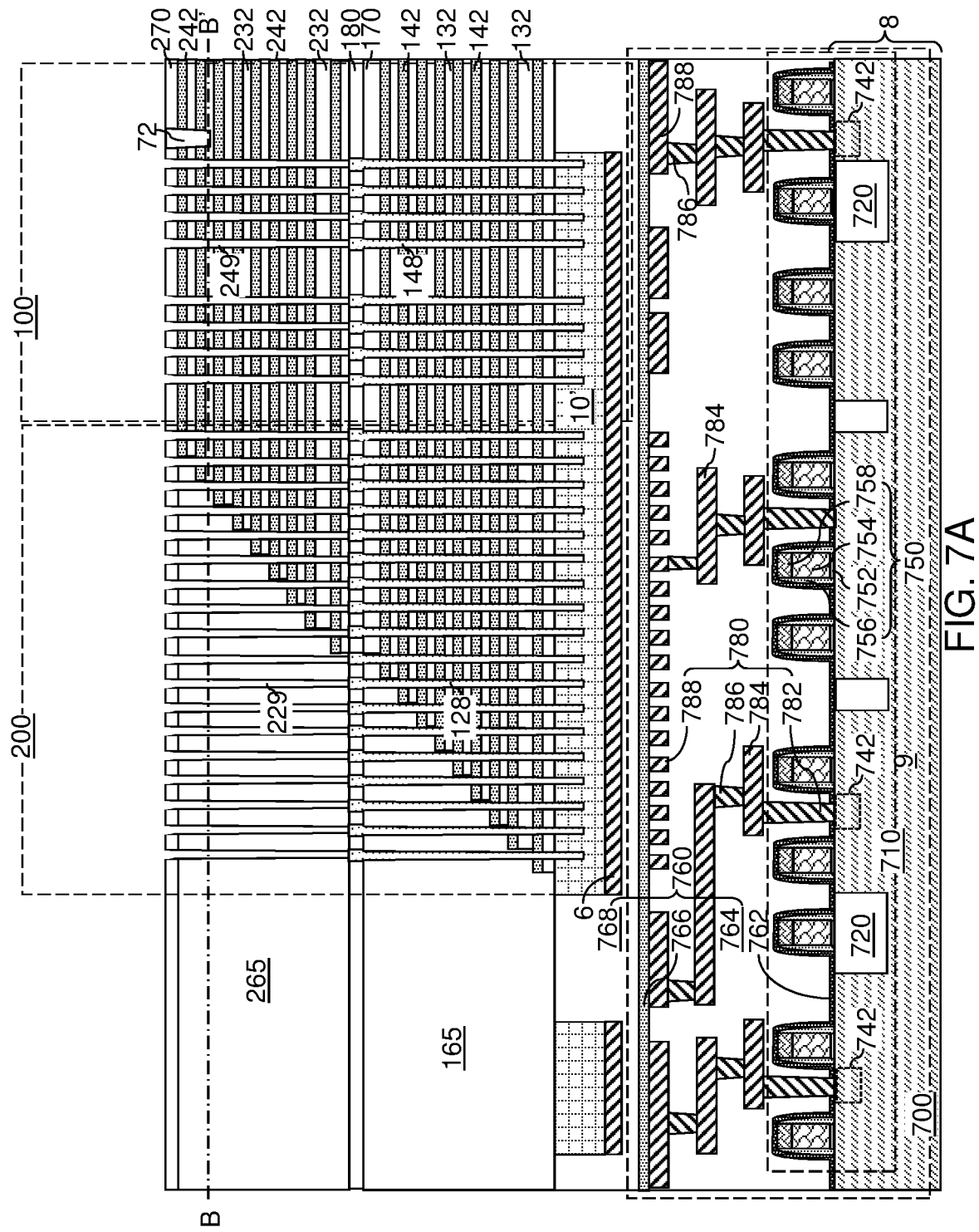
FIG. 7A is a vertical cross-sectional view of the exemplary structure after formation of second-tier memory openings and second-tier support openings according to an embodiment of the present disclosure.
Figure 7B:
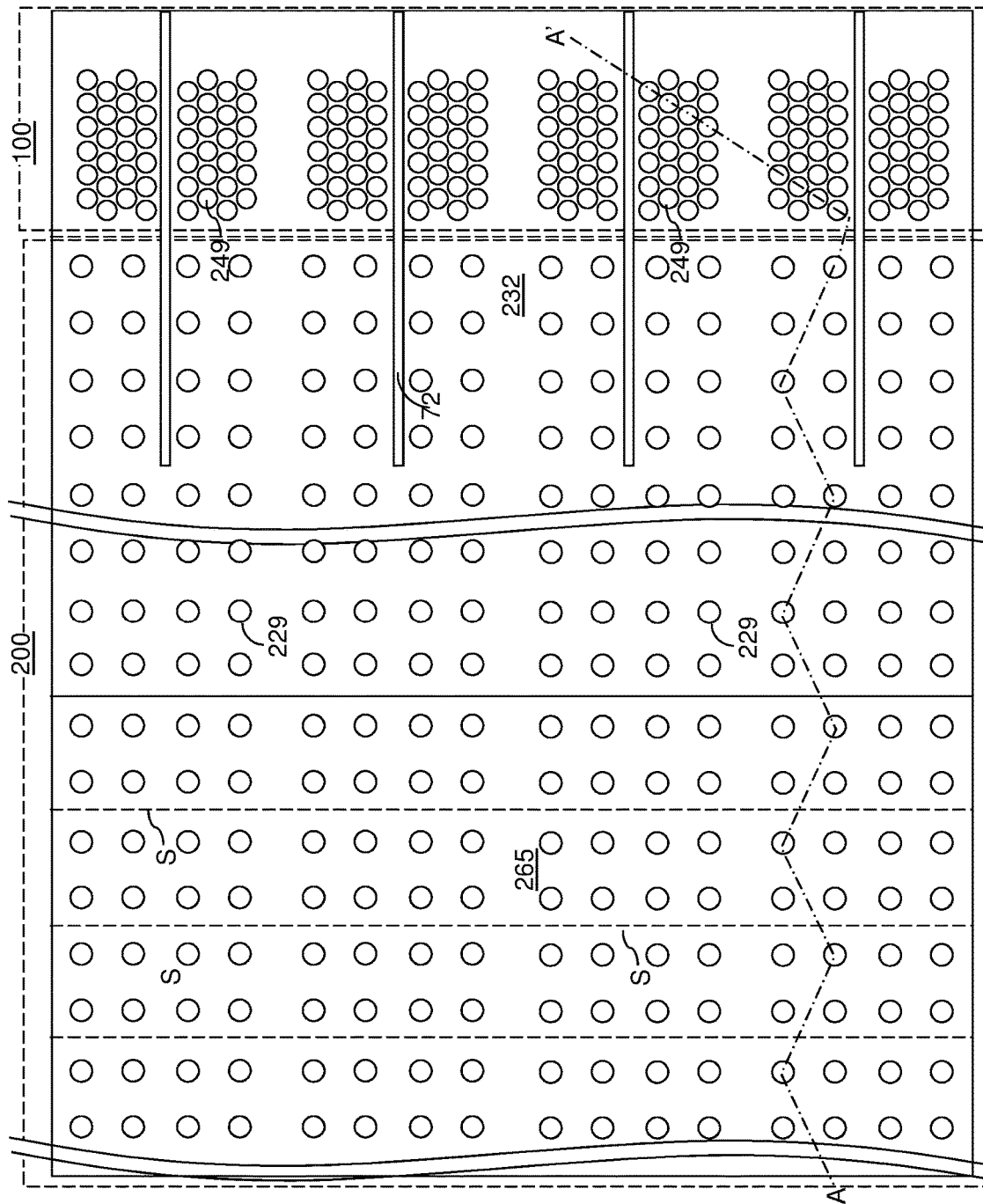
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
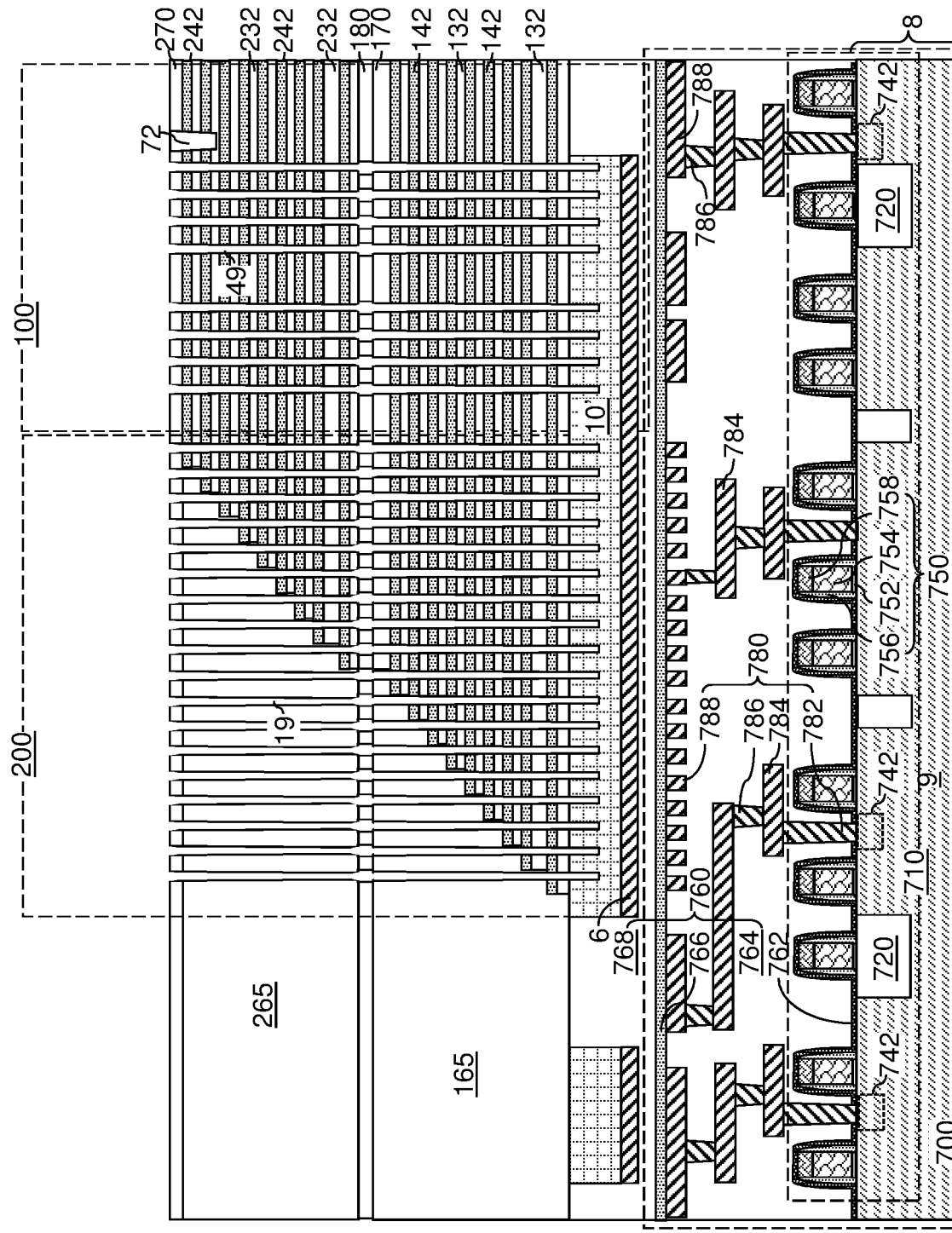
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figure 9B:
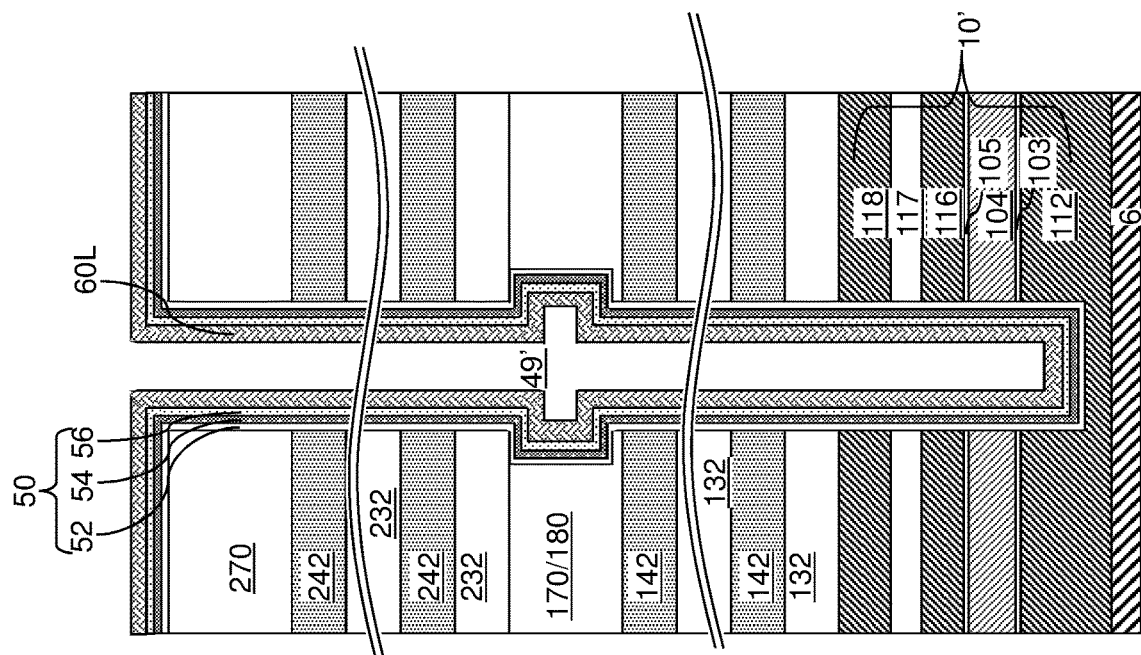
Figure 9A:
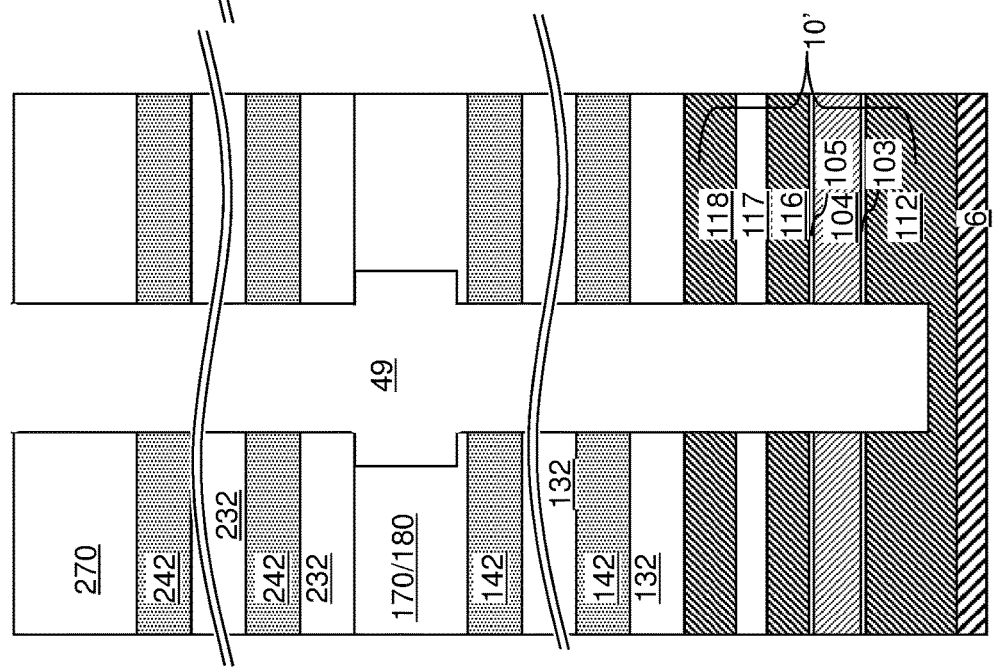

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{15}/cm^3$ to $1.0\times10^{19}/cm^3$, such as from $1.0\times10^{16}/cm^3$ to $1.0\times10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
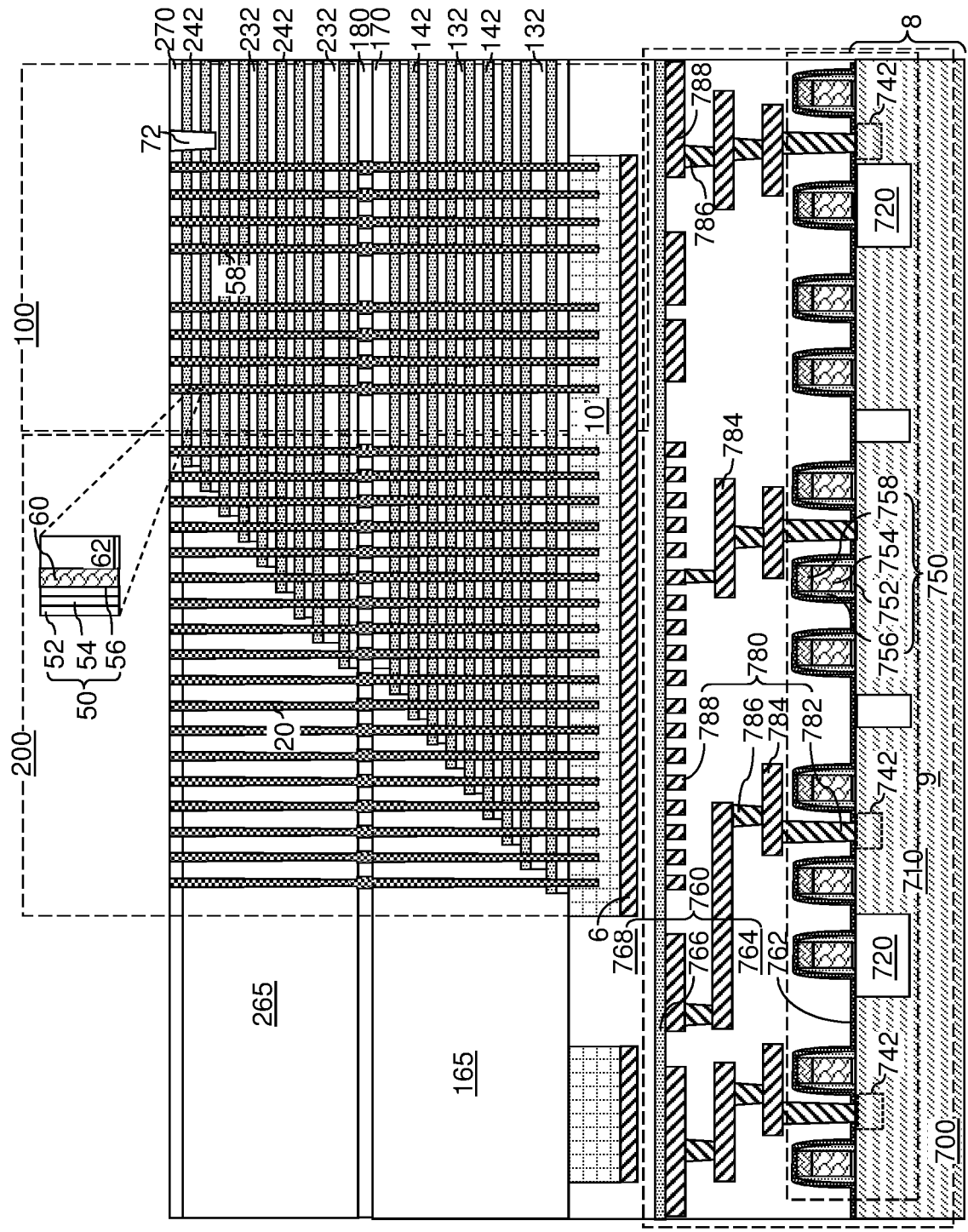
FIG. 10 is a vertical cross-sectional view of the exemplary structure after formation of memory opening fill structures and support pillar structures according to an embodiment of the present disclosure.

Referring to FIG. 10, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
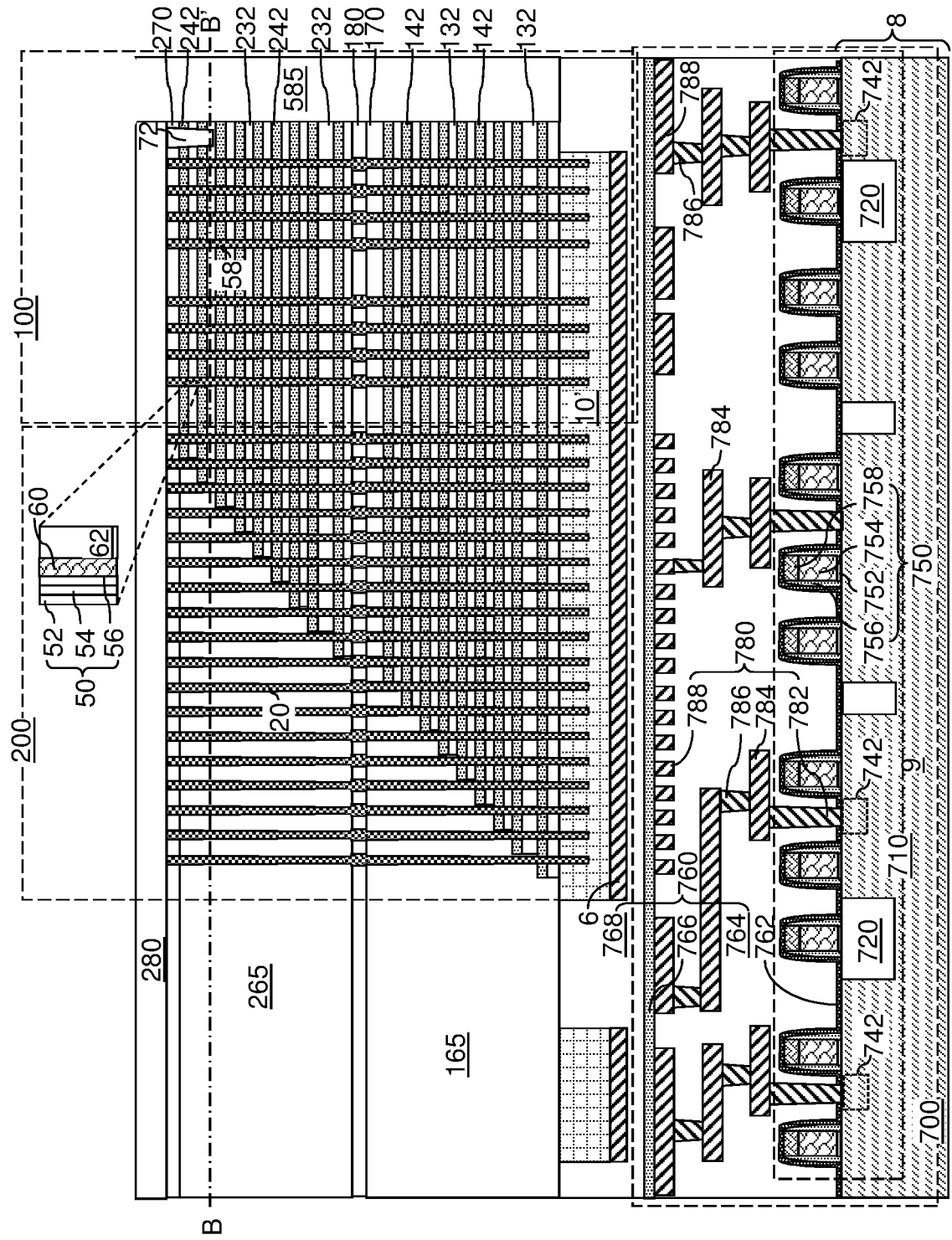
FIG. 11A is a vertical cross-sectional view of the exemplary structure after formation of pillar cavities according to an embodiment of the present disclosure.

Referring to FIGS. 11A and 11B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
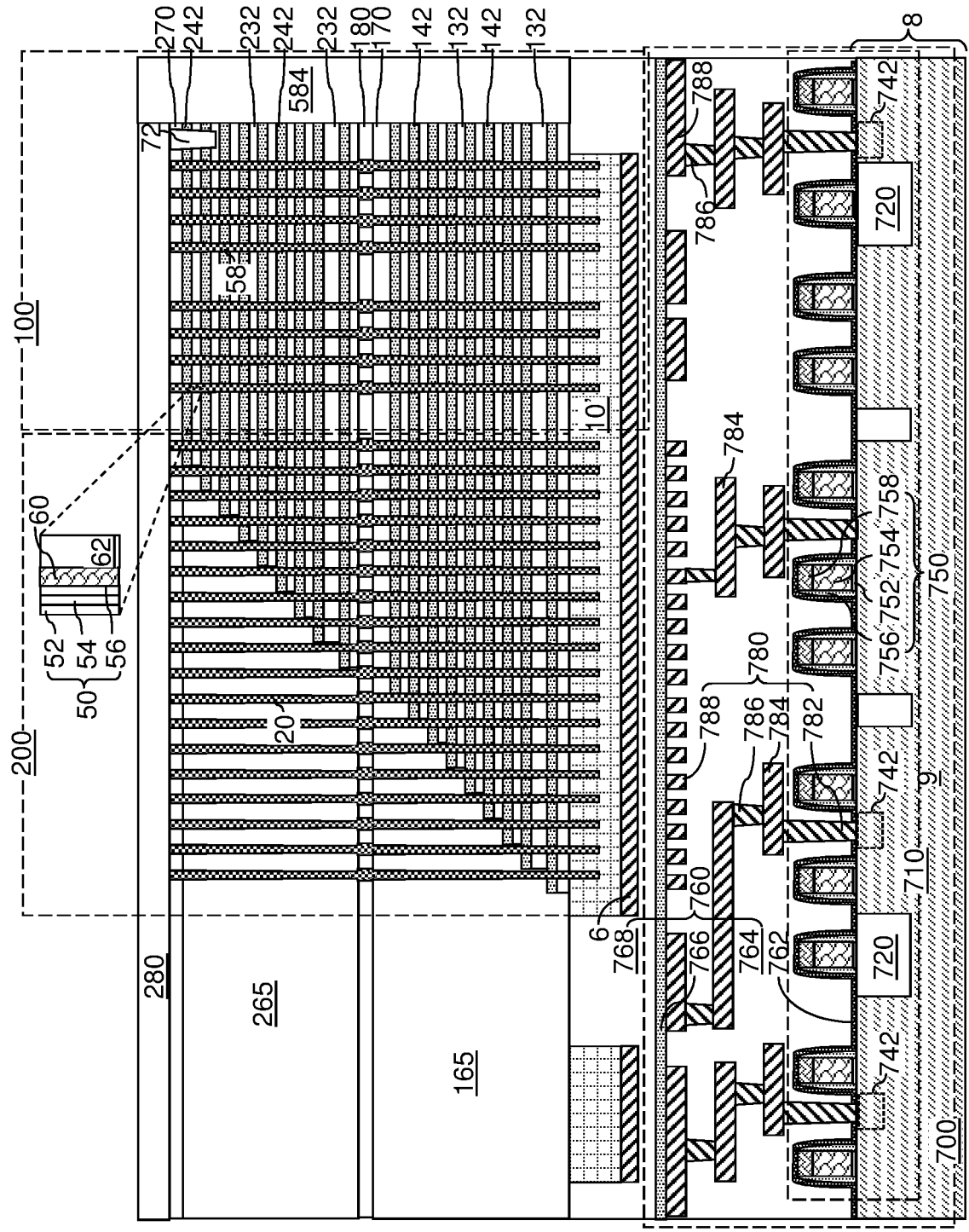
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 13A:
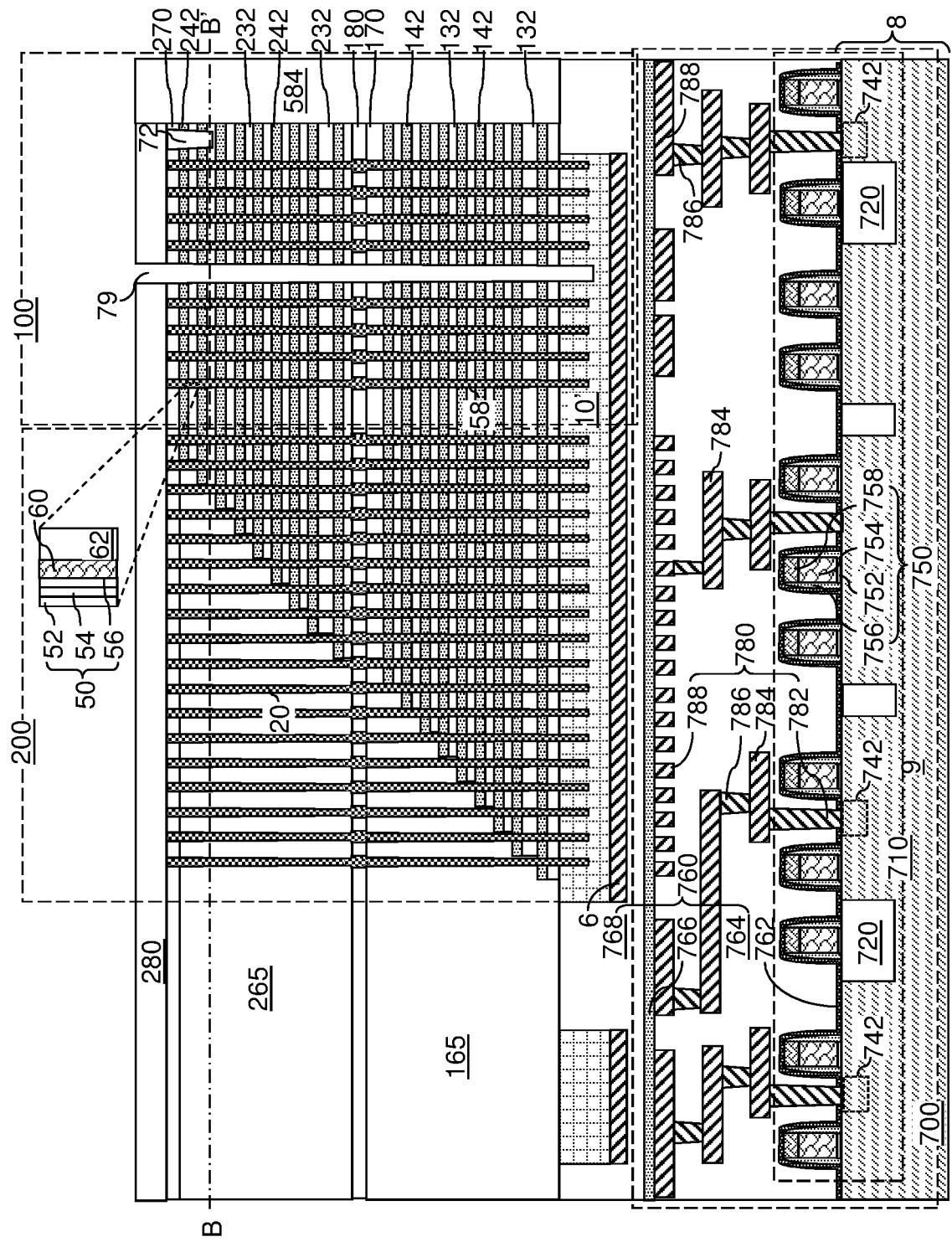
FIG. 13A is a vertical cross-sectional view of the exemplary structure after formation of a first contact level dielectric layer and backside trenches according to an embodiment of the present disclosure.

Referring to FIGS. 13A and 13B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 10'. Portions of the first contact level dielectric layer 280, the second-tier structure (232, 242, 270, 265, 72), the first-tier structure (132, 142, 170, 165), and the in-process source-level material layers 10' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 14:
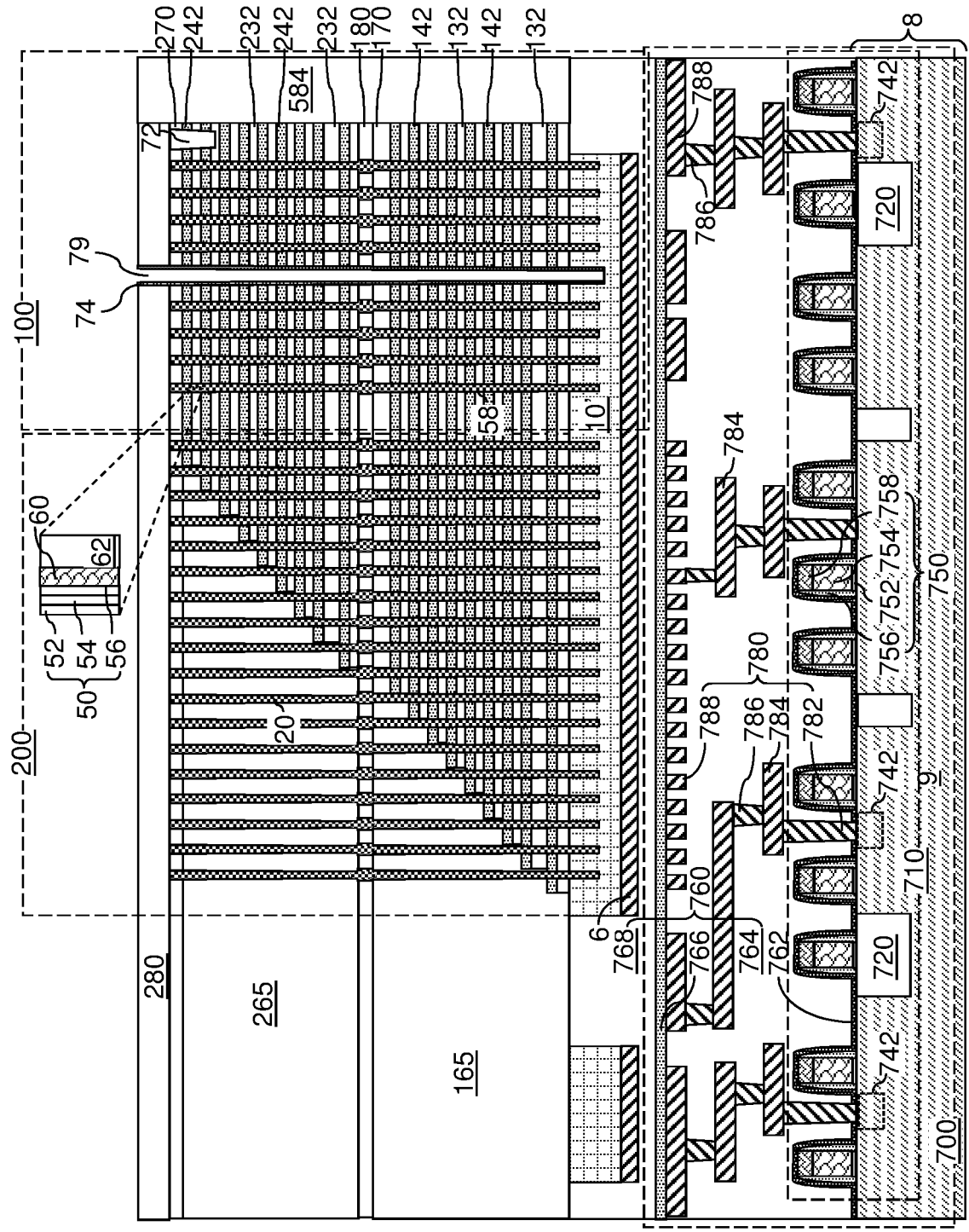
FIG. 14 is a vertical cross-sectional view of the exemplary structure after formation of backside trench spacers according to an embodiment of the present disclosure.
Figure 15A:
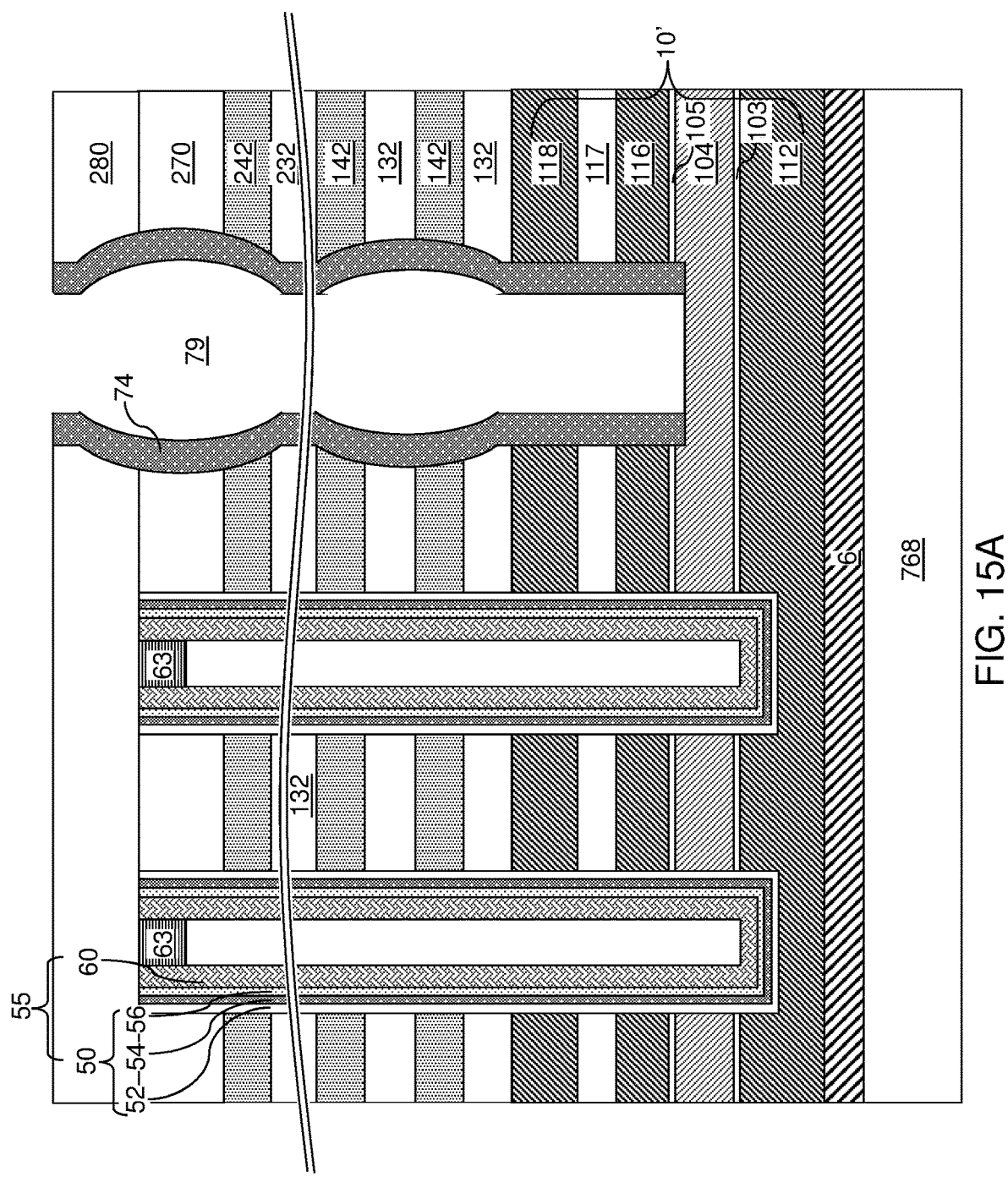
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 74 may be formed on sidewalls of each backside trench 79. For example, a conformal spacer material layer may be deposited in the backside trenches 79 and over the first contact level dielectric layer 280, and may be anisotropically etched to form the backside trench spacers 74. The backside trench spacers 74 include a material that is different from the material of the source-level sacrificial layer 104. For example, the backside trench spacers 74 may include silicon nitride.

Figure 15B:
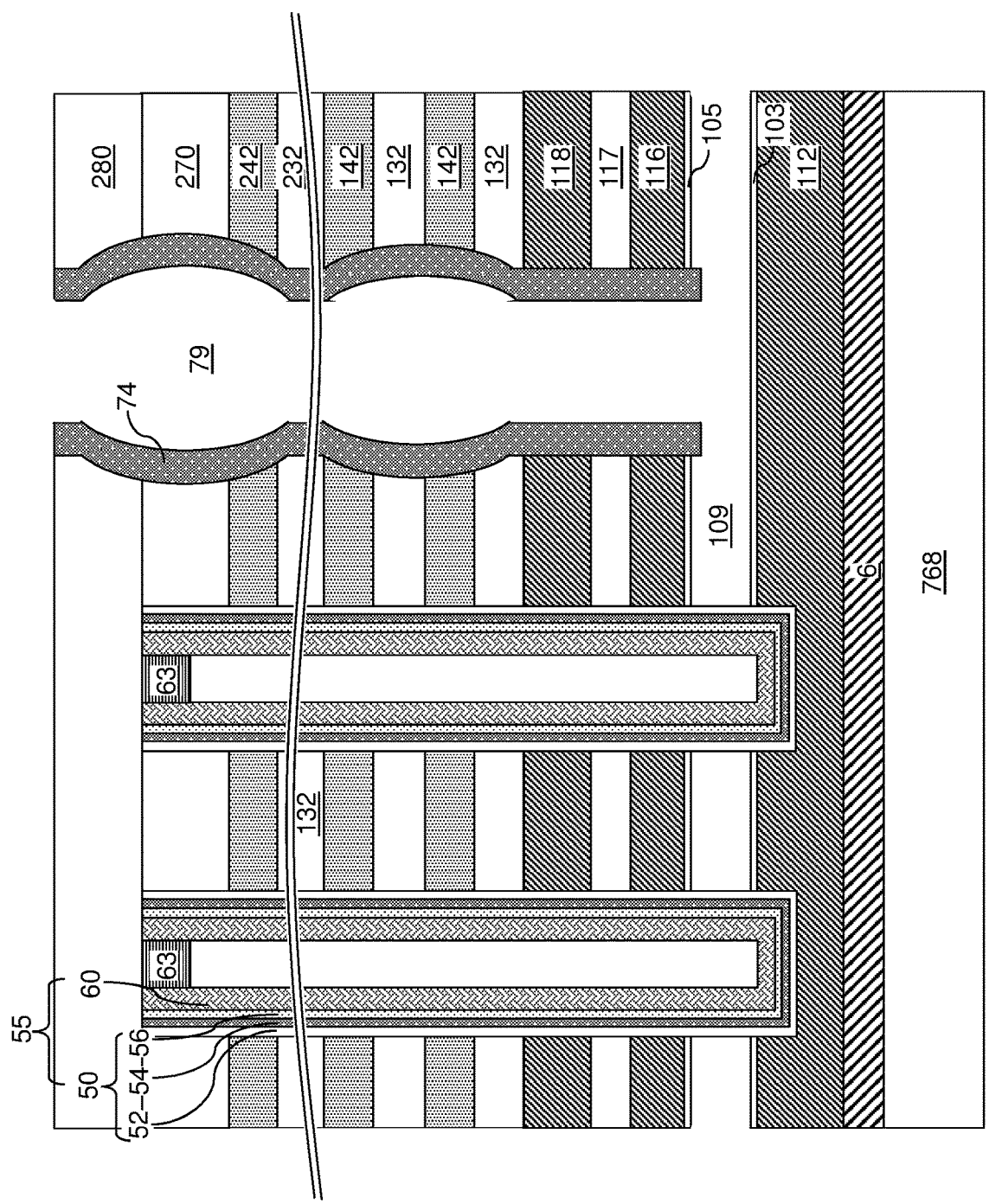

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 15C:
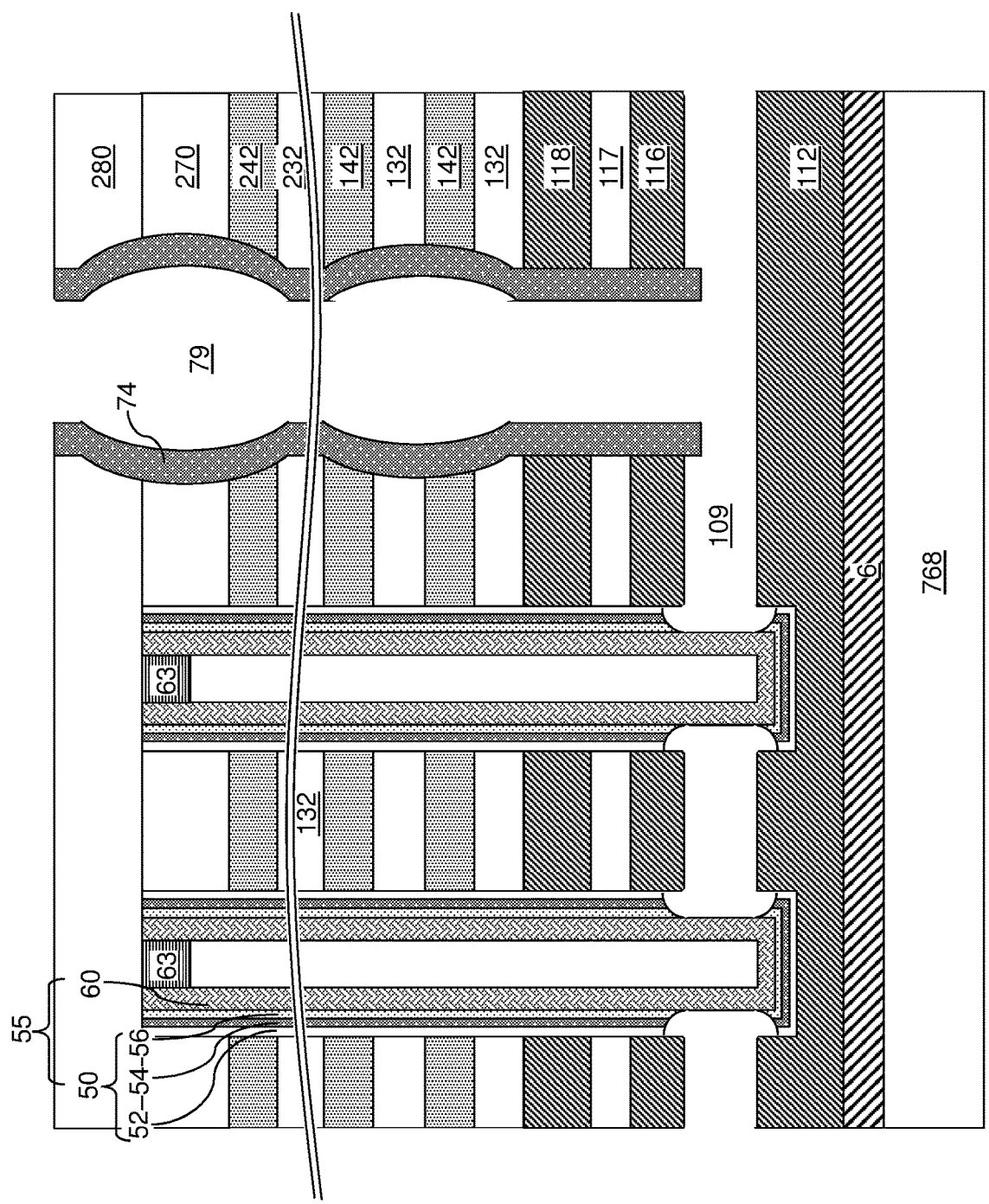

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
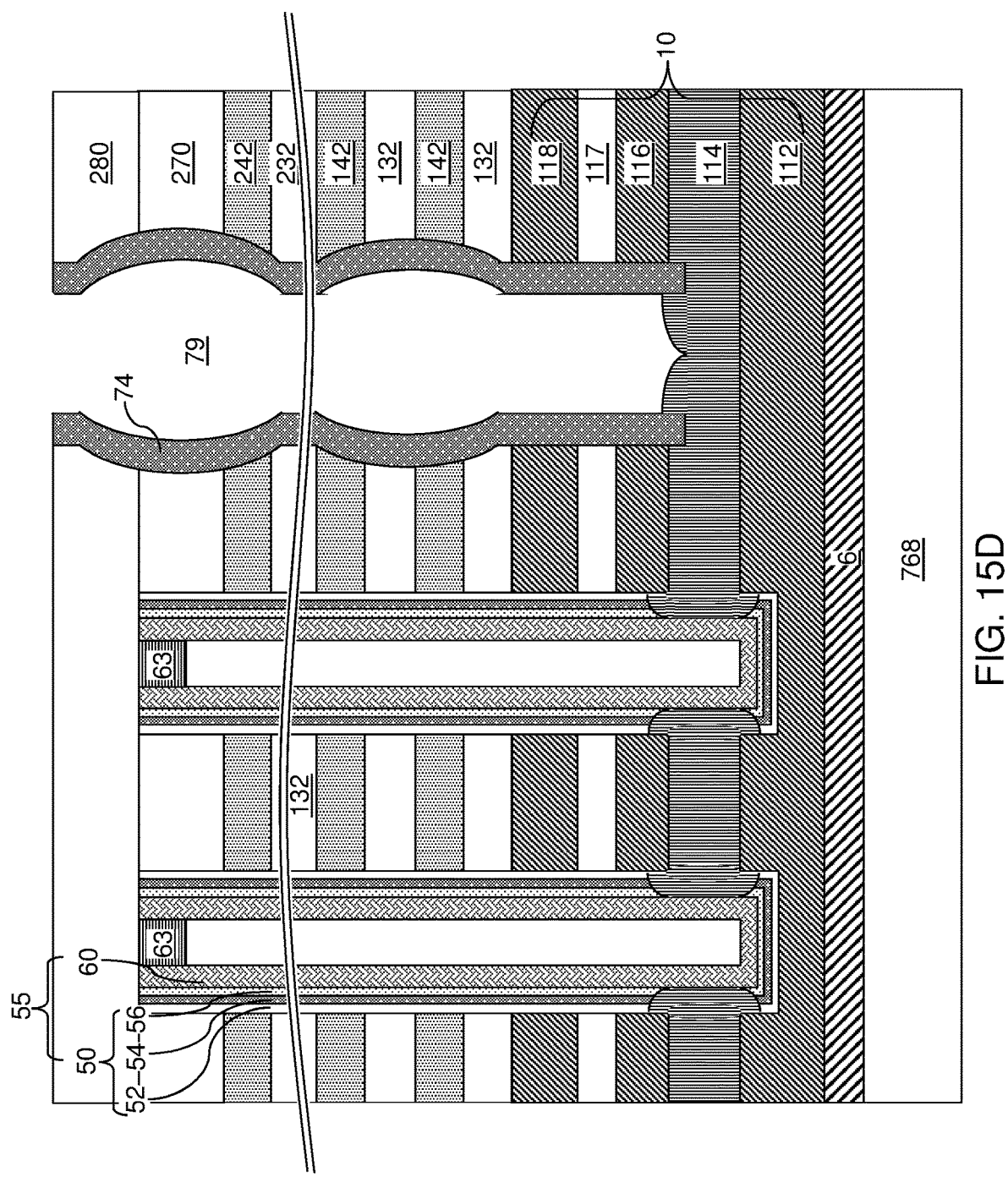

Referring to FIG. 15D, an n-doped semiconductor material may be deposited on the physically exposed semiconductor surfaces around the source cavity 109. The physically exposed semiconductor surfaces include bottom portions of outer sidewalls of the vertical semiconductor channels 60 and a boron-doped horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the n-doped semiconductor material may be deposited on the physically exposed semiconductor surfaces around the source cavity 109 by a selective semiconductor deposition process. A semiconductor precursor gas, an etchant, and an n-type dopant precursor gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an n-doped semiconductor material from physically exposed semiconductor surfaces around the source cavity 109. The deposited n-doped semiconductor material forms a source contact layer 114, which may contact sidewalls of the vertical semiconductor channels 60. The atomic concentration of the n-type dopants in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and n-type dopant atoms. Alternatively, at least one non-selective n-doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 74. In one embodiment, the source contact layer 114 may be formed by selectively depositing an n-doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). A p-n junction is present between the source contact layer 114 and the upper source-level semiconductor layer 116. The set of layers including the buried source layer (112, 114, 116), the source-level insulating layer 117, and the source-select-level conductive layer 118 constitutes source-level material layers 10, which replaces the in-process source-level material layers 10'.

Figure 15E:
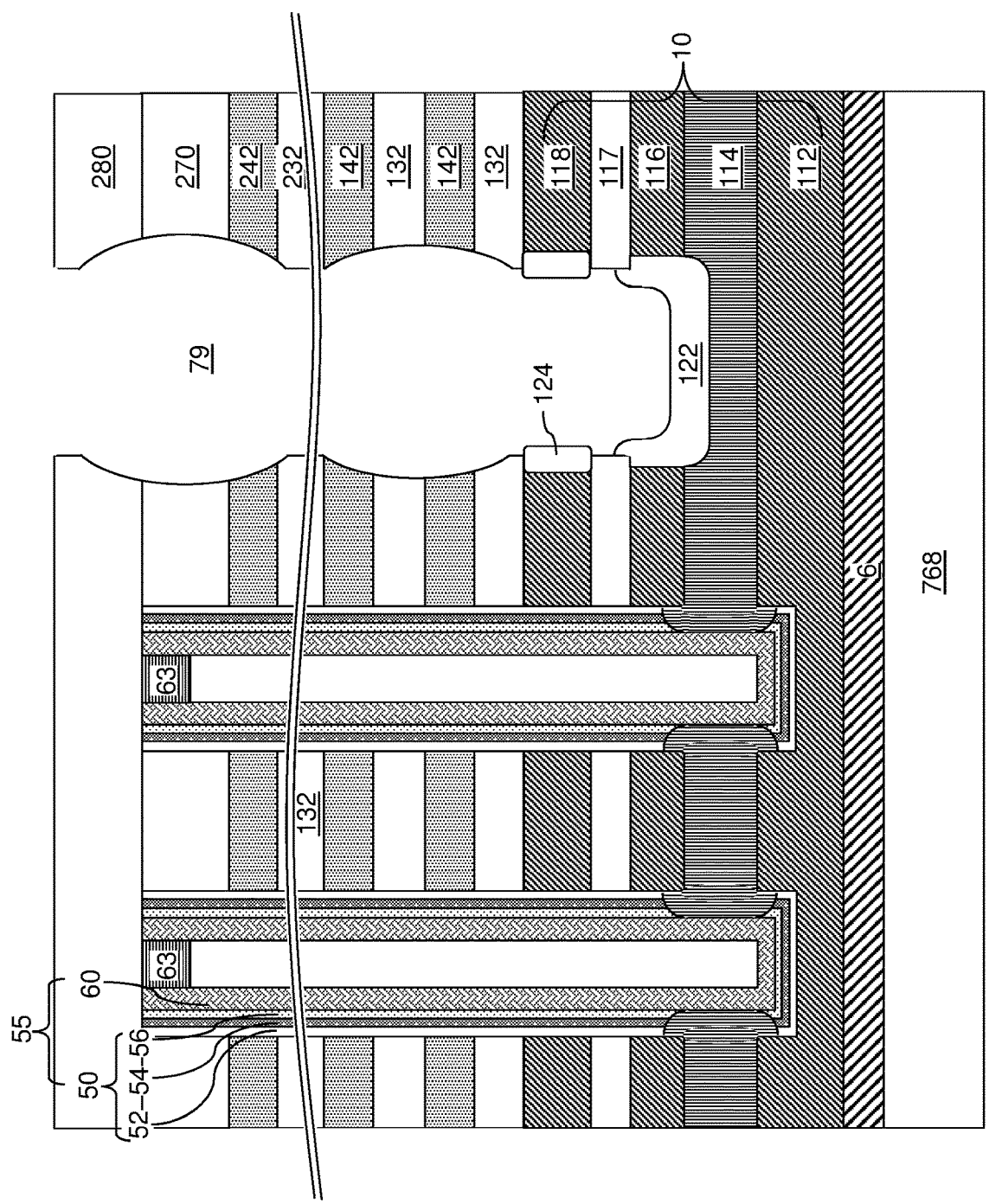
Figure 16:
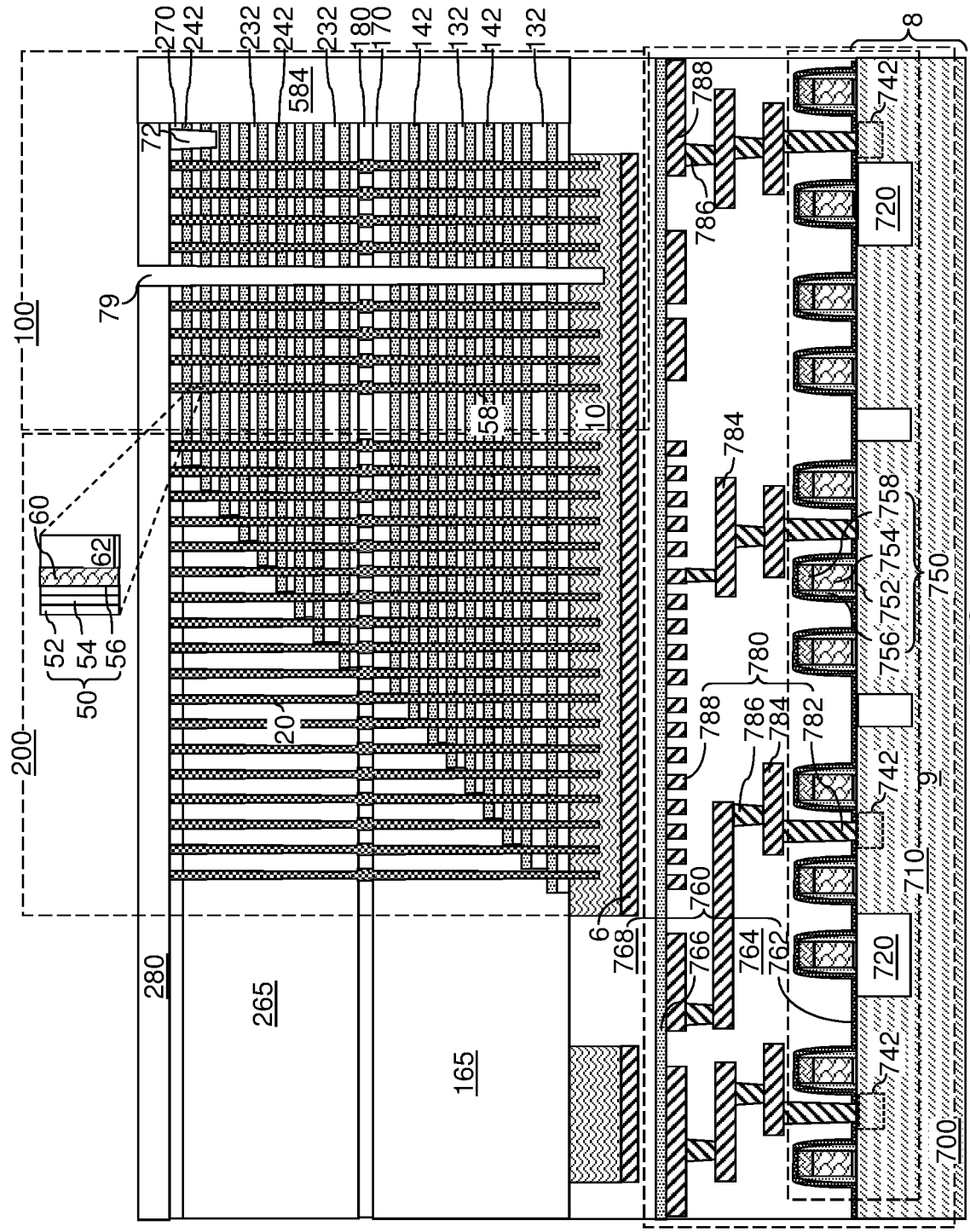
FIG. 16 is a vertical cross-sectional view of the exemplary structure after formation of source-level material layers according to an embodiment of the present disclosure.

Referring to FIGS. 15E and 16, the backside trench spacers 74 may be removed selective to the insulating layers (132, 232), the first and second insulating cap layers (170, 270), the first contact level dielectric layer 280, and the source contact layer 114 using an isotropic etch process. For example, if the backside trench spacers 74 include silicon nitride, a wet etch process using hot phosphoric acid may be performed to remove the backside trench spacers 74. In one embodiment, the isotropic etch process that removes the backside trench spacers 74 may be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17:
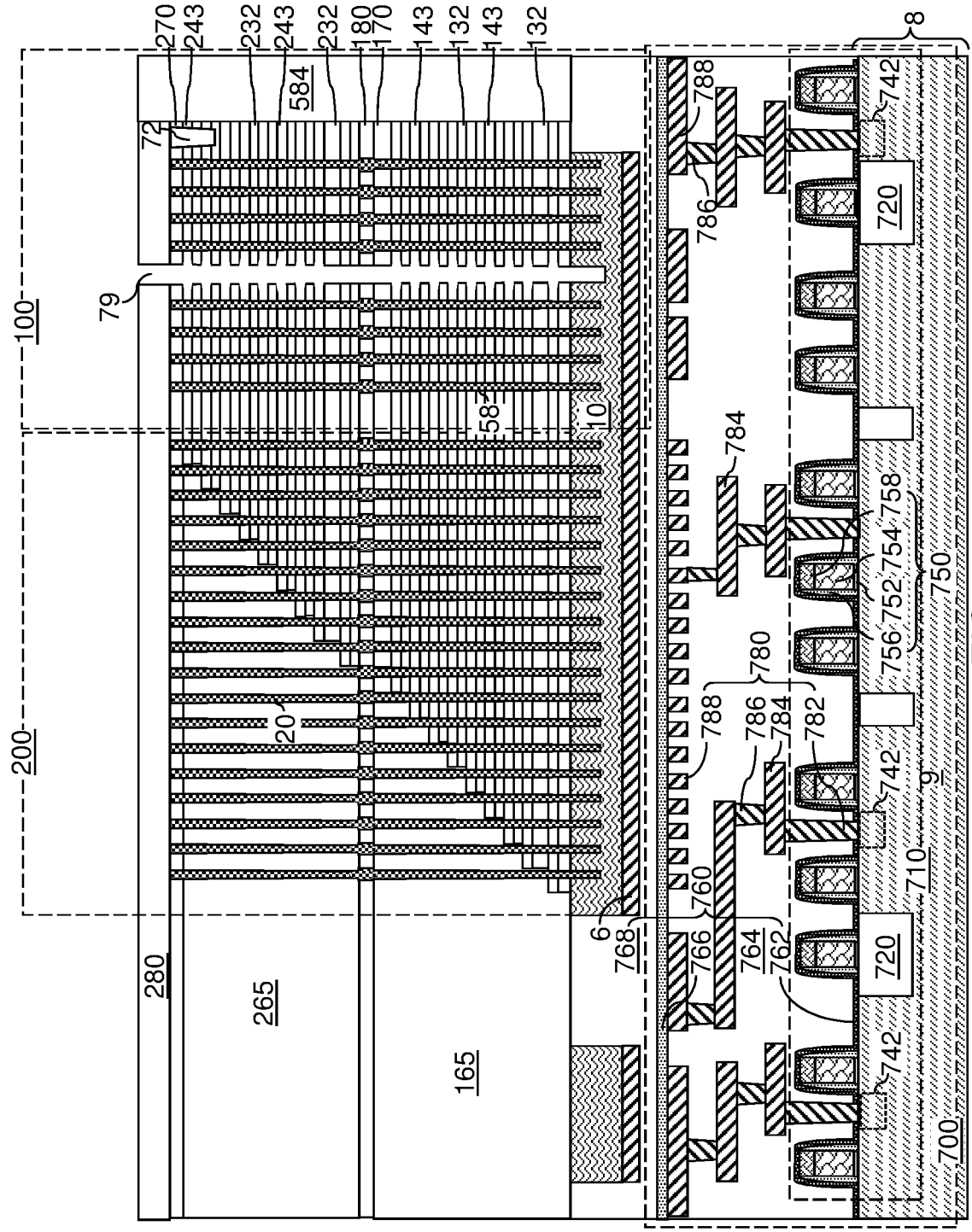
FIG. 17 is a vertical cross-sectional view of the exemplary structure after formation of backside recesses according to an embodiment of the present disclosure.

Referring to FIG. 17, the sacrificial material layers (142, 242) are may be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 18A-18E, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Figure 18A:
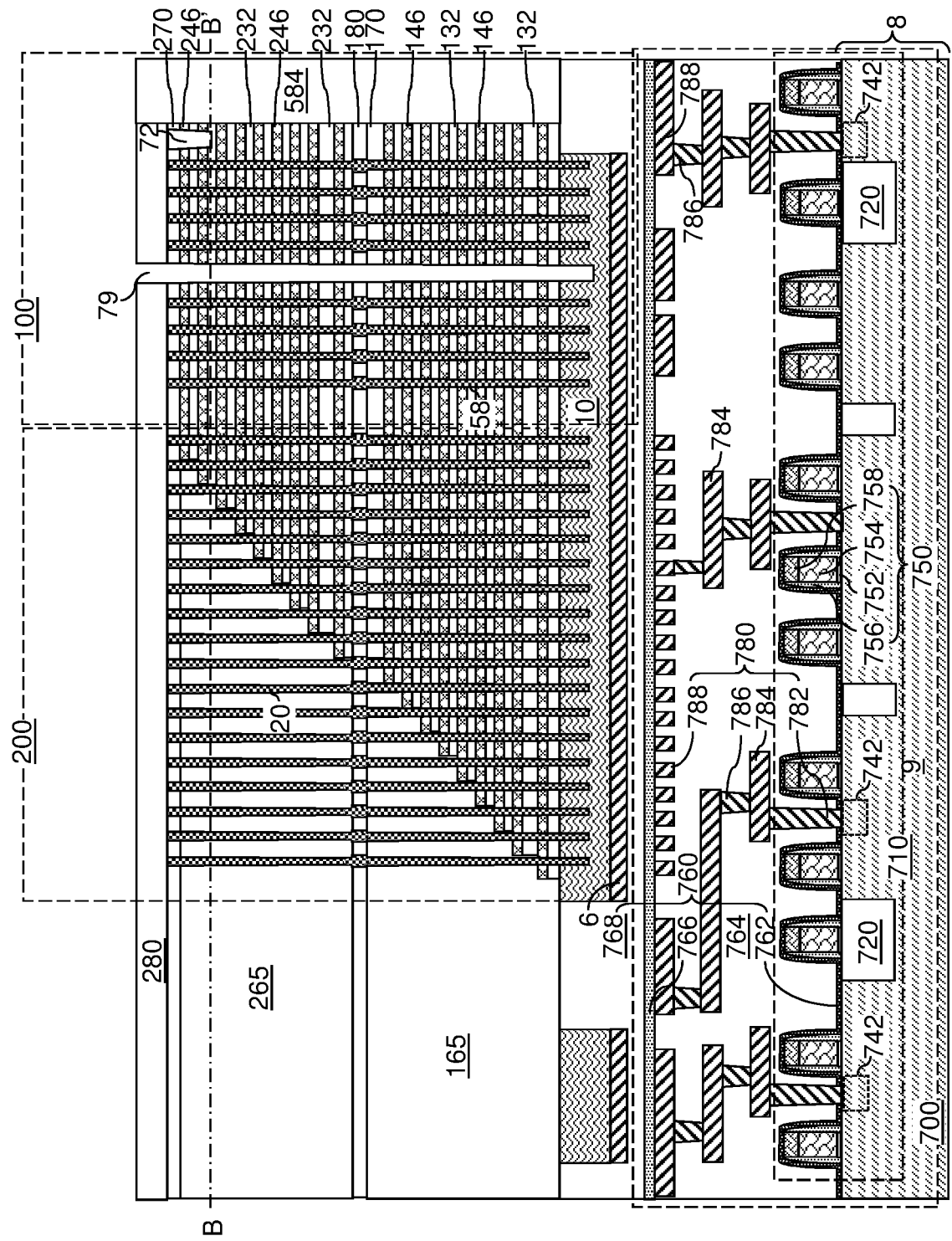
FIG. 18A is a vertical cross-sectional view of the exemplary structure after formation of electrically conductive layers according to an embodiment of the present disclosure.
Figure 18B:
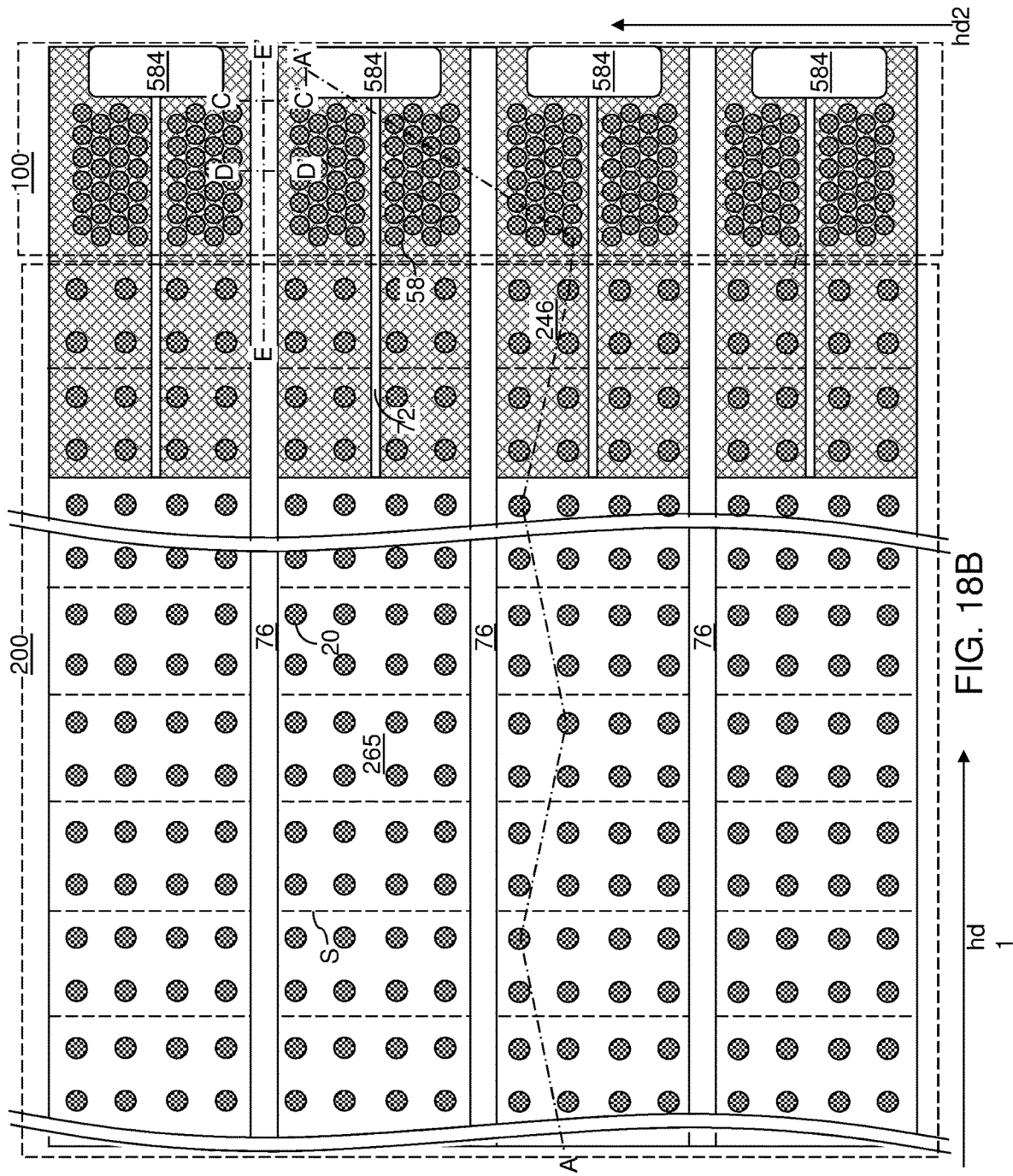
FIG. 18B is a horizontal cross-sectional of the exemplary structure along the horizontal plane B-B' of FIG. 18A. The hinged vertical plane A-A' corresponds to the plane of the vertical cross-sectional view of FIG. 18A.
Figure 18E:
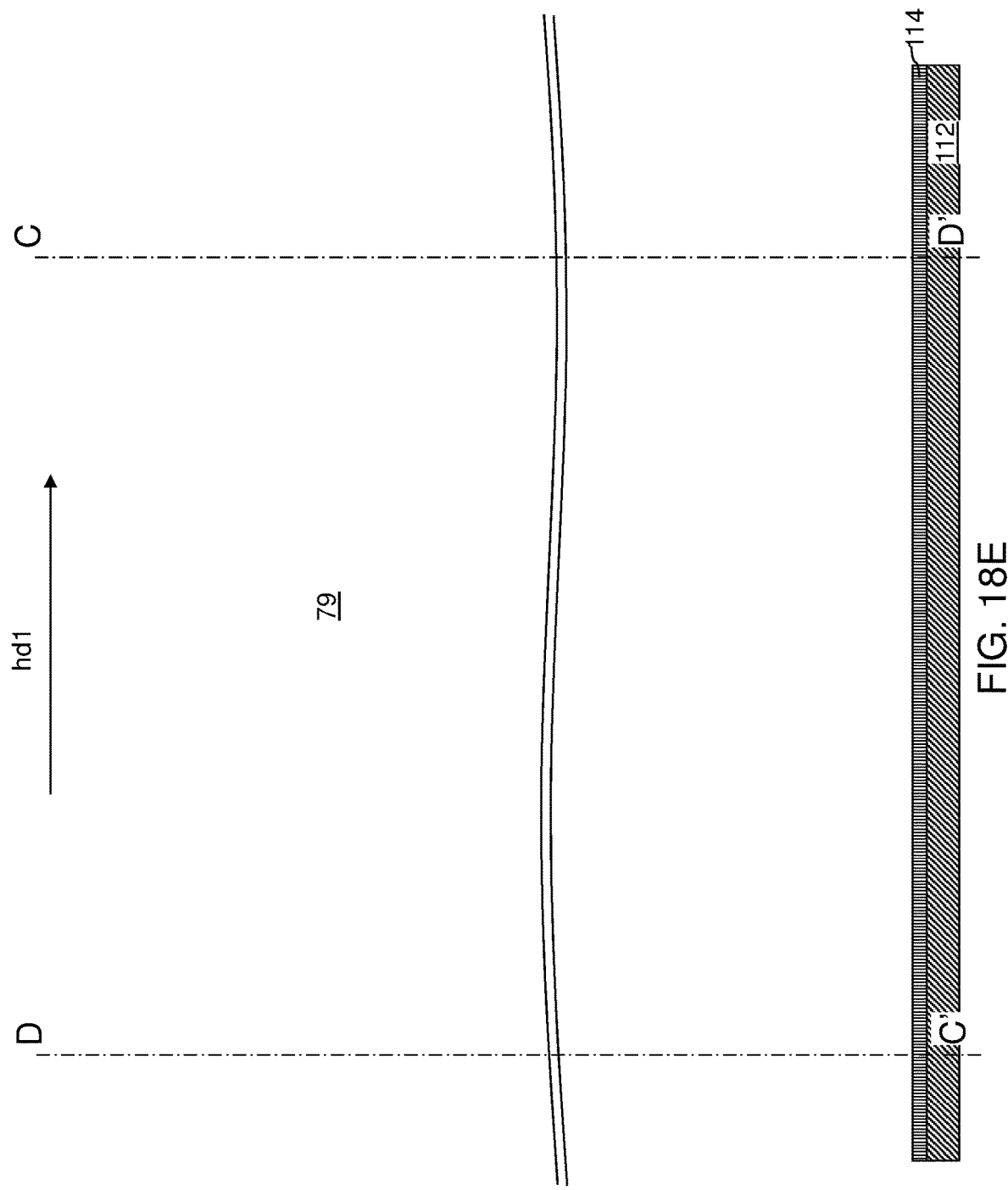
FIG. 18E is a vertical cross-sectional view of the exemplary structure along the vertical plane E-E' of FIG. 18B. The vertical plane C-C' is the plane of the vertical cross-section of FIG. 18C. The vertical plane D-D' is the plane of the vertical cross-section of FIG. 18D.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction. While FIGS. 18A and 18B illustrate apparently straight sidewalls for the backside trenches 79, it is understood that the representations of the sidewalls of the backside trenches 79 in FIGS. 18A and 18B are only schematic, and actual sidewalls of the backside trenches 79 have random width variations and non-planar surfaces (which may be convex or concave) as schematically illustrated in FIGS. 18C and 18D. The width variation within the backside trenches 79 along the first horizontal direction hd1 at a given height from the substrate 8 may be in a range from 1% to 50%, such as from 2% to 15% of the average width of the backside trenches at the given height.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 19C:
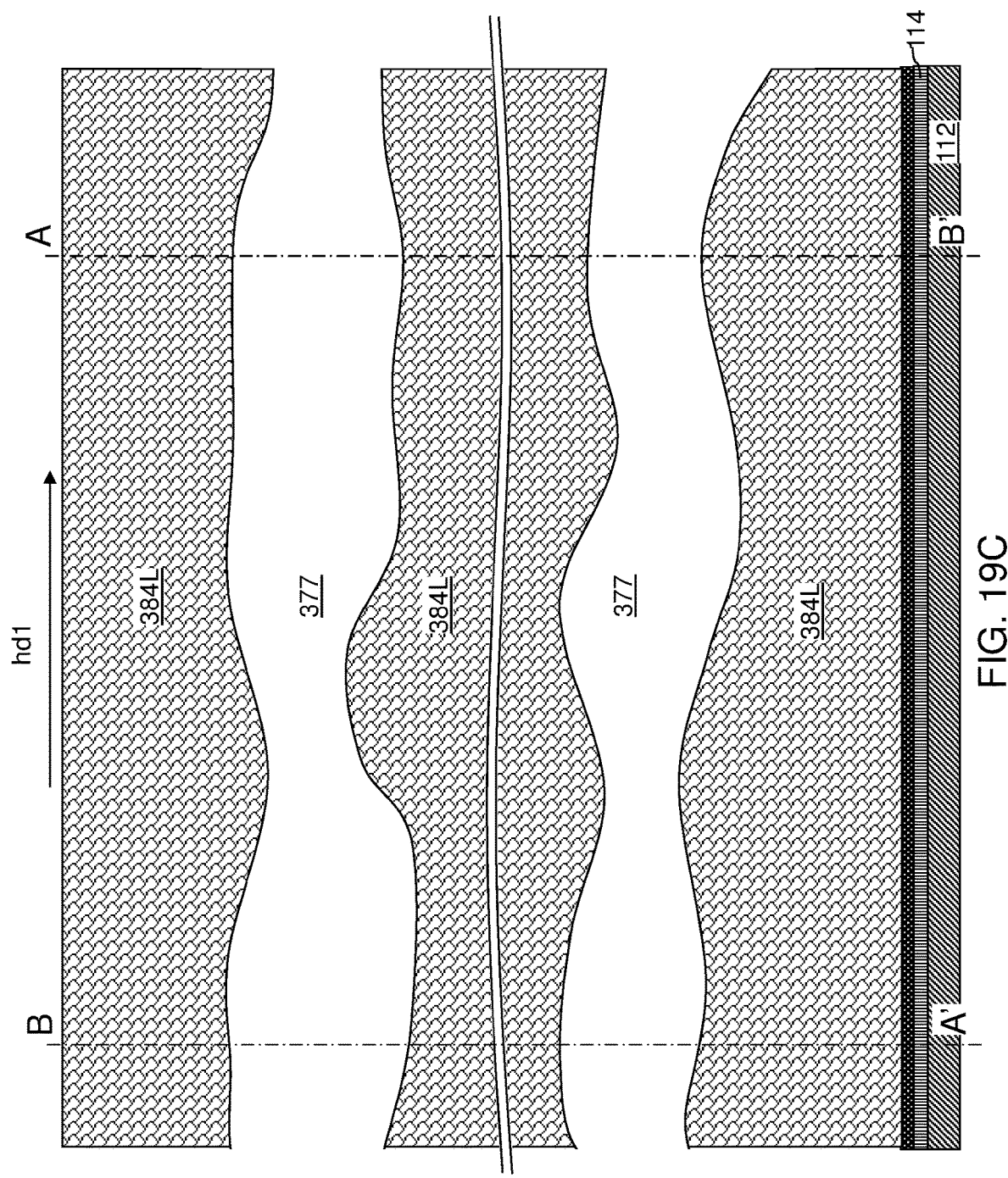
FIG. 19C is a vertical cross-sectional view of the exemplary structure of FIG. 19A along a vertical plane that corresponds to the vertical plane E-E' of FIG. 18B. The vertical plane A-A' is the plane of the vertical cross-section of FIG. 19A. The vertical plane B-B' is the plane of the vertical cross-section of FIG. 19B.
Figure 20A:
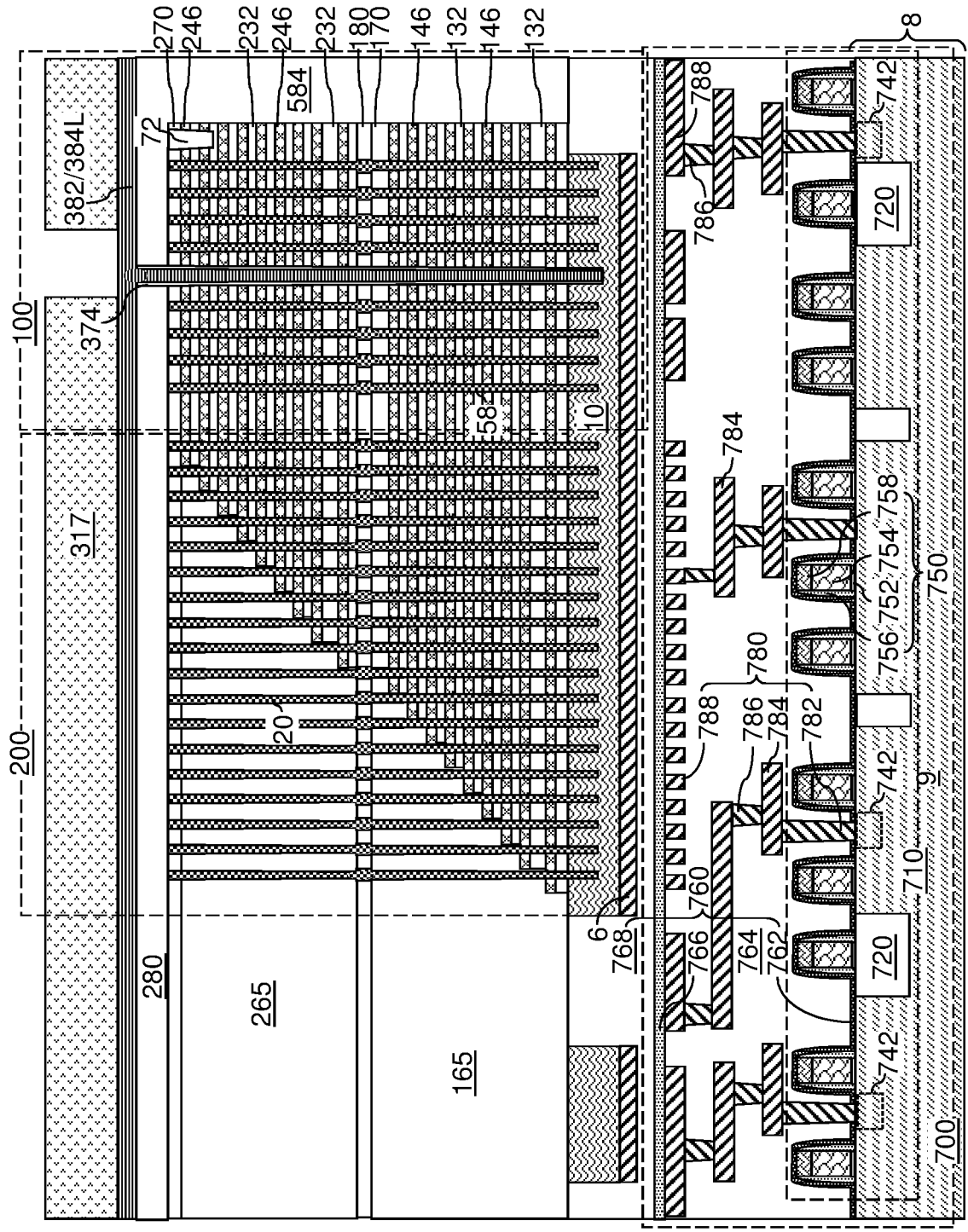
FIG. 20A is a vertical cross-sectional view of the exemplary structure application and patterning of an etch mask layer according to an embodiment of the present disclosure.
Figure 20B:
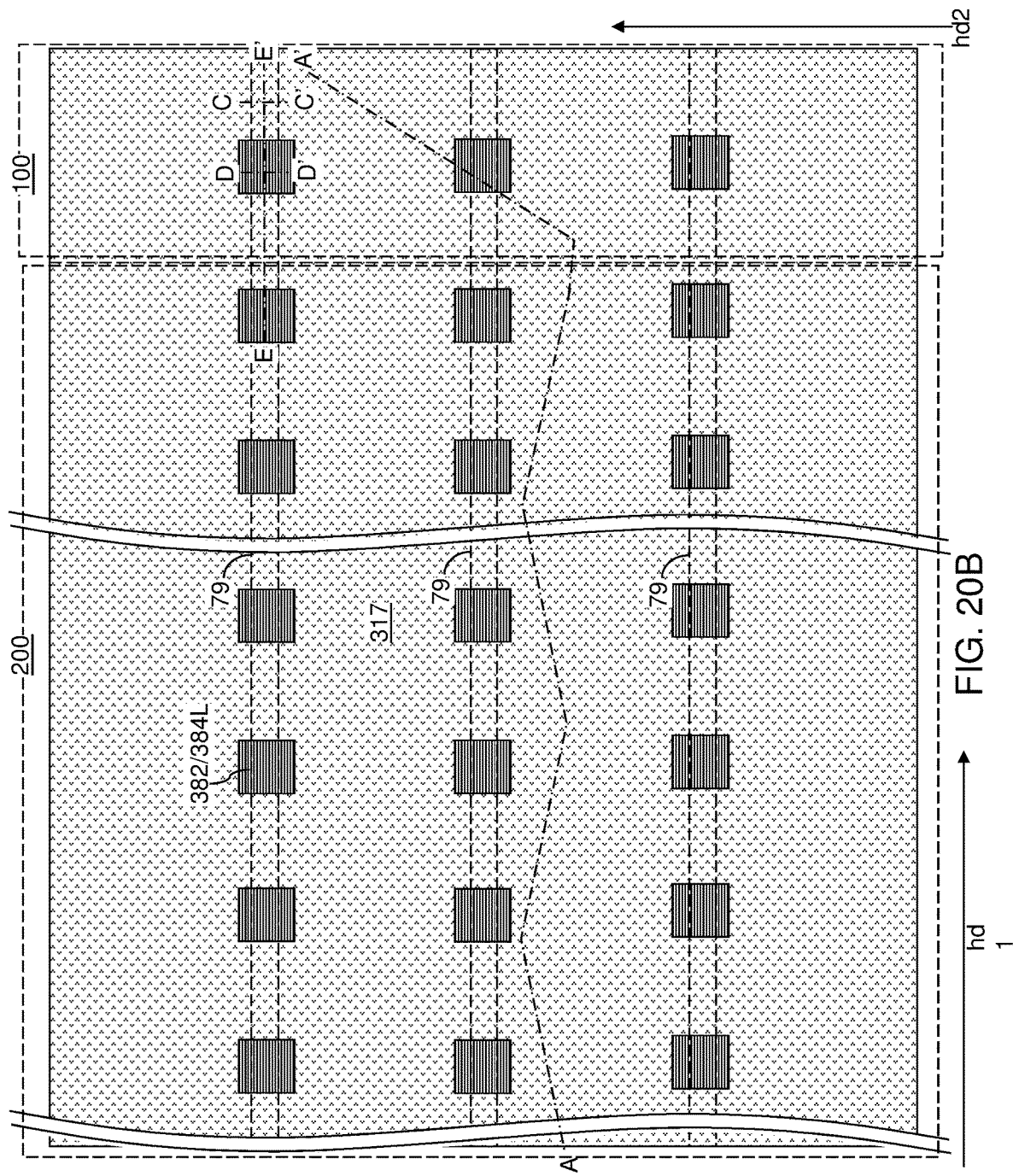
FIG. 20B is a top-down view of the exemplary of FIG. 20A. The hinged vertical plane A-A' corresponds to the plane of the vertical cross-sectional view of FIG. 20A.
Figure 20E:
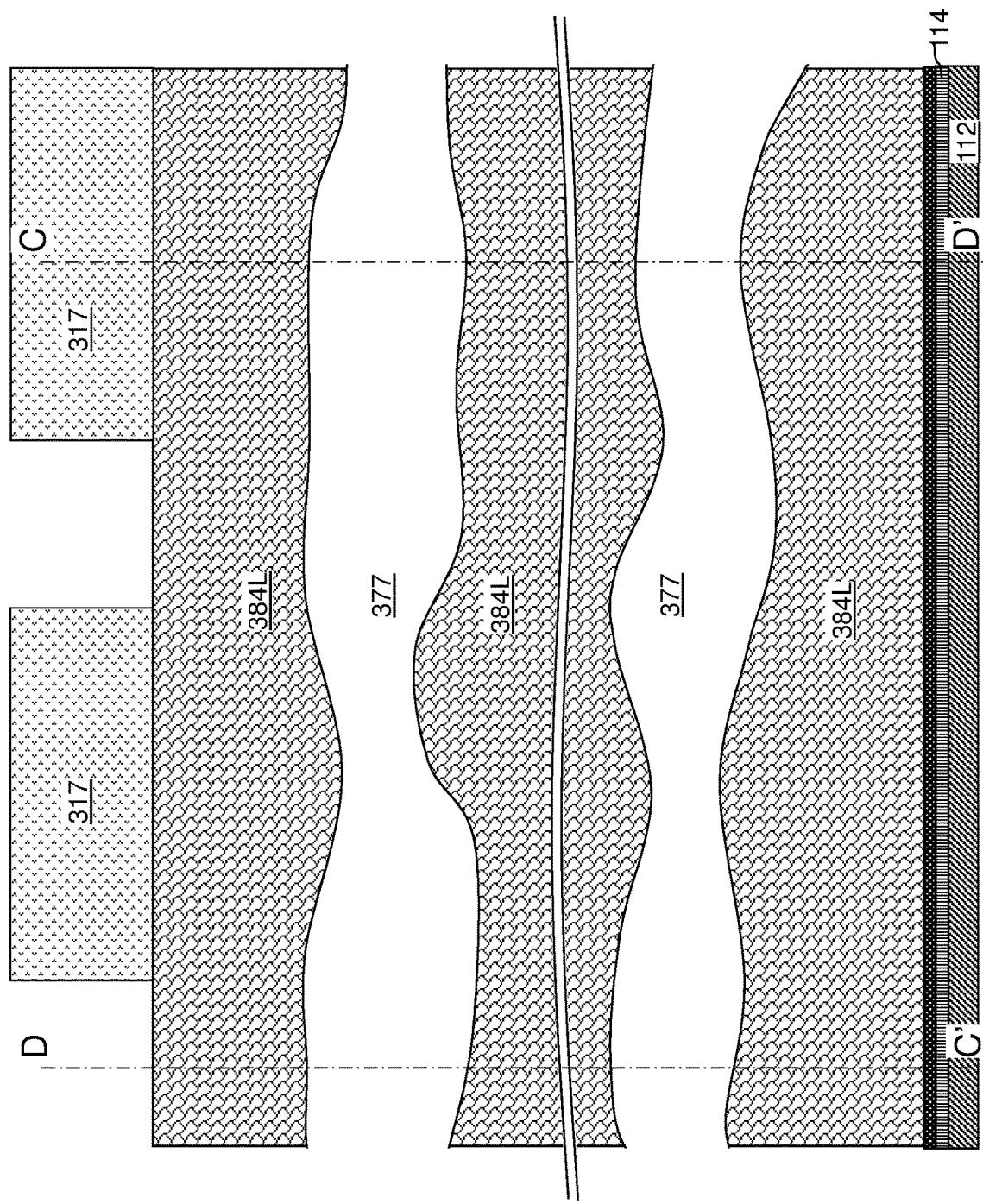
FIG. 20E is a vertical cross-sectional view of the exemplary structure along the vertical plane E-E' of FIG. 20B. The vertical plane C-C' is the plane of the vertical cross-section of FIG. 20C. The vertical plane D-D' is the plane of the vertical cross-section of FIG. 20D.

Referring to FIGS. 19A-19C, a dielectric material layer may be conformally deposited in the backside trenches 79 and over the first contact level dielectric layer 280 by a conformal deposition process. The dielectric material layer may include, for example, silicon oxide. An anisotropic etch process may be performed to remove horizontal portions of the dielectric material layer from above the first contact level dielectric layer 280 and at the bottom of each backside trench 79. Each remaining vertical tubular portion of the dielectric material layer in the backside trenches is herein referred to as an insulating spacer 374. The insulating spacers 374 are insulating spacers provided at a periphery of each backside trench 79. The insulating spacers 374 may have a maximum thickness in a range from 4 nm to 50 nm, such as from 8 nm to 25 nm, although lesser and greater thicknesses may also be used. The insulating spacers 374 should be sufficiently thick to prevent dielectric breakdown during device operation but sufficiently thin to avoid completely filling and closing the backside trench 79.

A first metallic liner 382 may be deposited as a continuous material layer directly on physically exposed surfaces of the source contact layer 114 (which is a semiconductor material layer), inner sidewalls of the insulating spacers 374, and over the first contact level dielectric layer 280 without closing the backside trench 79. The first metallic liner 382 may include a metallic nitride material (such as TiN, TaN, and/or WN) and/or an elemental metal (such as Ti, Ta, or W) or an intermetallic alloy. The first metallic liner 382 may be deposited by a conformal deposition process such as chemical vapor deposition or atomic layer deposition. The thickness of the first metallic liner 382 may be in a range from 3 nm to 30 nm, such as from 6 nm to 15 nm, although lesser and greater thicknesses may also be used. The width of each backside trench 79, the thickness of each insulating spacer 374, and the thickness of the first metallic liner 382 are selected such that a vertically-extending continuous cavity is present within each backside trench 79 after formation of the first metallic liner 382.

A first doped semiconductor material may be deposited by a conformal deposition process over the first metallic liner 382 to form a first doped semiconductor material layer 384L. The first doped semiconductor material may be p-doped or n-doped, and may include dopant atoms at an atomic concentration in a range from $5.0 \times 10^{19}/cm^3$ to $2.0 \times 10^{21}/cm^3$. For example, the first doped semiconductor material may be a conductive material, and may include doped silicon or a doped silicon-containing semiconductor alloy. In one embodiment, the first doped semiconductor material may include p-doped or n-doped amorphous silicon.

The first doped semiconductor material is deposited conformally on the non-planar surfaces of the inner sidewalls of the first metallic liner 382, which has laterally-undulating widths along the first horizontal direction hd1 and vertically-undulating widths along the vertical direction. Unfilled volumes within the backside trenches 79 may form voids that extend along a lateral direction (such as the first horizontal direction hd1), which are herein referred to as laterally-extending voids 377. The laterally-extending voids 377 may laterally extend generally along the first horizontal direction hd1, i.e., along a lengthwise direction of a respective laterally-extending void 377, with a lateral extent along the first horizontal direction that is greater than the maximum lateral extent along the second horizontal direction hd2, i.e., along the widthwise direction of the respective laterally-extending void 377. For example, the ratio of the lateral extent of a laterally-extending void 377 along the first horizontal direction hd1 to the lateral extent of the laterally-extending void 377 along the second horizontal direction hd2 may be in a range from 5 to 1,000,000, such as from 10 to 10,000. The ratio of the lateral extent of a laterally-extending void 377 along the first horizontal direction hd1 to the length of the backside trench 79 that contains the laterally-extending void 377 along the first horizontal direction hd1 may be in a range from 0.000001 to 0.999999. The ratio of the maximum height of a laterally-extending void 377 to the height of a backside trench 79 may be in a range from 0.001 to 0.9. A horizontal portion of the first doped semiconductor material layer 384L may continuously extend over the first contact level dielectric layer 280.

Referring to FIGS. 20A-20E, an etch mask layer 317 may be formed and patterned over the first doped semiconductor material layer 384L. The etch mask layer 317 may be patterned to provide a laterally alternating sequence of covered regions and uncovered regions for each portion of the first doped semiconductor material layer 384L that fills a backside trench 79. In one embodiment, the patterned etch mask layer 317 may be a photoresist layer that is patterned by lithographic exposure and development. A row of discrete openings may be formed through the etch mask layer 317 over each backside trench 79. Each row of discrete openings may include a periodic repetition of openings or an irregular (non-periodic) repetition of openings. The average distance between geometrical centers of a neighboring pair of openings in a row of opening in the etch mask layer 317 may be greater than the average width of the backside trenches 79 along the second horizontal direction hd2. For example, the average distance between geometrical centers of a neighboring pair of openings in a row of opening in the etch mask layer 317 may be in a range from twice the average width of the backside trenches 79 along the second horizontal direction hd2 to 30 times the average width of the backside trenches 79 along the second horizontal direction hd2, such as from four the average width of the backside trenches 79 along the second horizontal direction hd2 to 20 times the average width of the backside trenches 79 along the second horizontal direction hd2. The lateral dimension of each opening in the etch mask layer 317 along the first horizontal direction hd1 may be in a range from one-half the average width of the backside trenches 79 along the second horizontal direction hd2 to 10 times the average width of the backside trenches 79 along the second horizontal direction hd2, such as from 1.5 the average width of the backside trenches 79 along the second horizontal direction hd2 to 5 times the average width of the backside trenches 79 along the second horizontal direction hd2. The lateral dimension of each opening in the etch mask layer 317 along the second horizontal direction hd2 may be greater than the width of each underlying backside trench 79 along the second horizontal direction hd2. In one embodiment, each opening in the etch mask layer 317 may overlie a pair of lengthwise sidewalls of an underlying backside trench 79.

Figure 21C:
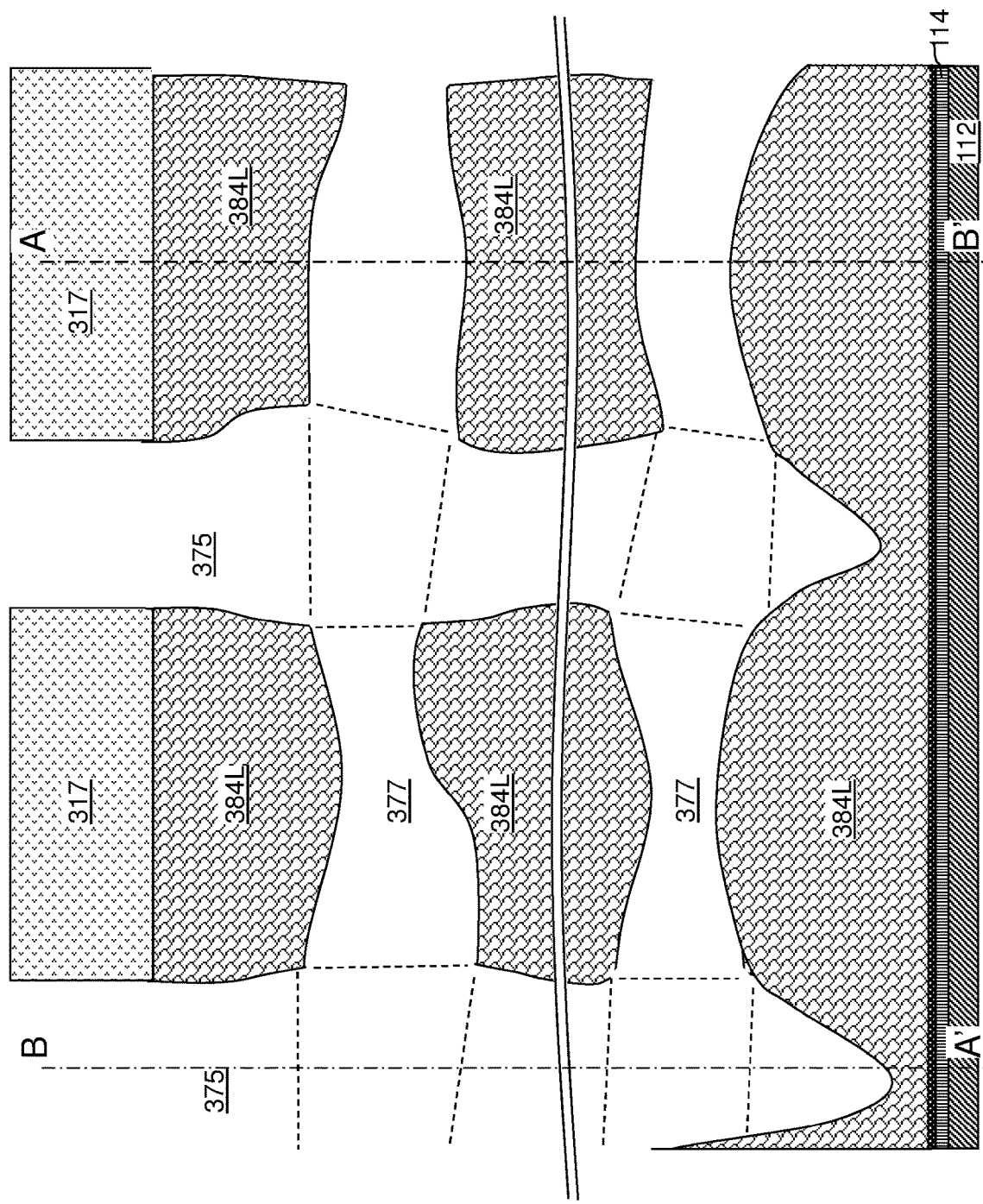
FIG. 21C is a vertical cross-sectional view of the exemplary structure of FIG. 21A along a vertical plane that corresponds to the vertical plane E-E' of FIG. 20B. The vertical plane A-A' is the plane of the vertical cross-section of FIG. 21A. The vertical plane B-B' is the plane of the vertical cross-section of FIG. 21B.

Referring to FIGS. 21A-21C, an anisotropic etch process is performed to etch portions of the first doped semiconductor material layer 384L that are not covered by the etch mask layer 317. The first doped semiconductor material is etched from underneath each row of discrete openings in the etch mask layer 317. First portions of the first doped semiconductor material are vertically recessed at discrete locations that are laterally spaced apart along the first horizontal direction hd1, while second portions of the first doped semiconductor material between the discrete locations are not removed within each backside trench 79. The anisotropic etch process forms multiple cavities, which are herein referred to as vertically-extending voids 375. A vertically-extending void 375 is formed underneath each opening through the etch mask layer 317. The vertically-extending voids 375 connect to multiple regions of the laterally-extending void 377 that are laterally spaced apart along the first horizontal direction hd1 underneath each opening in the etch mask layer 317.

The vertically-extending voids 375 are connected to underlying portions of the laterally-extending voids 377 to form interconnected networks of laterally-extending voids 377 and vertically-extending voids 375. The vertically-extending voids 375 may, or may not, extend to bottom portions of the first metallic liner 382 located at the bottom of the backside trenches 79. If the vertically-extending voids 375 do not extend to the bottom portions of the first metallic liner 382, the first doped semiconductor material layer 384L may include at least one laterally-extending portion that underlies a plurality of vertically-extending voids 375 in a backside trench 79. If the vertically-extending voids 375 extend to the bottom portions of the first metallic liner 382, the vertically-extending voids 375 may divide the first doped semiconductor material layer 384L into multiple discrete portions at each location of the vertically-extending voids 375. A subset of semiconductor material portions of the first doped semiconductor material layer 384L may laterally encircle a respective remaining portion of the laterally-extending voids 377 within vertical cross-sectional views that are perpendicular to the first horizontal direction hd1.

Figure 22A:
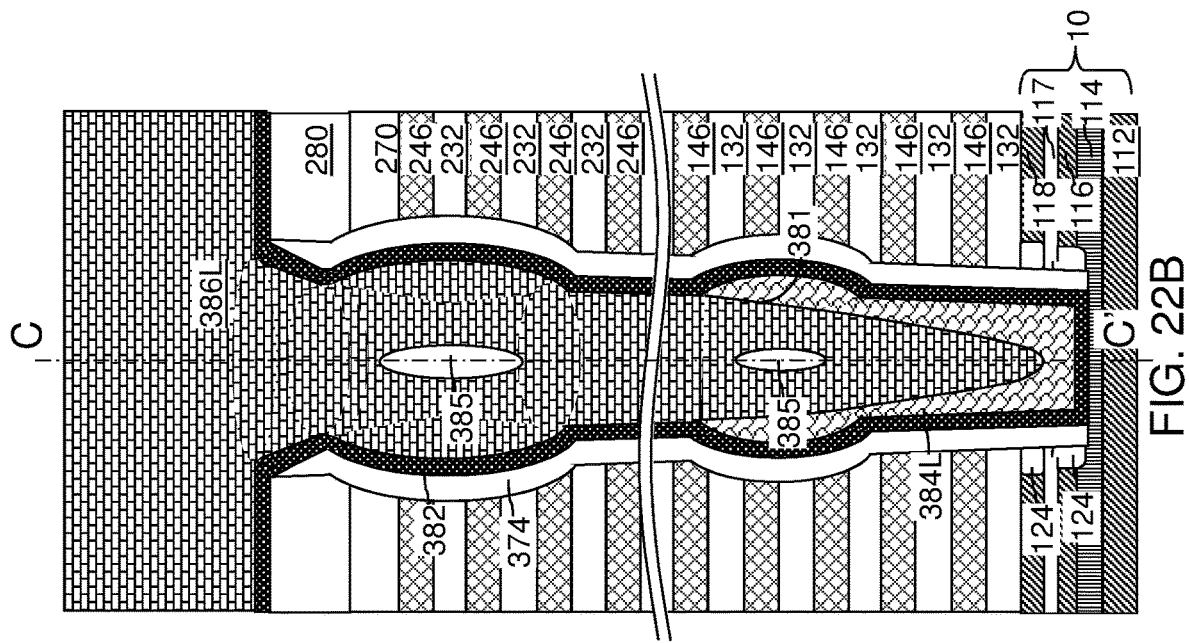
FIG. 22A is a vertical cross-sectional view of the exemplary structure after deposition of a second doped semiconductor material along a vertical plane that corresponds to the vertical plane C-C' of FIG. 20B according to an embodiment of the present disclosure. The vertical plane C-C' is the plane of the vertical cross-section of FIG. 22C.
Figure 22B:
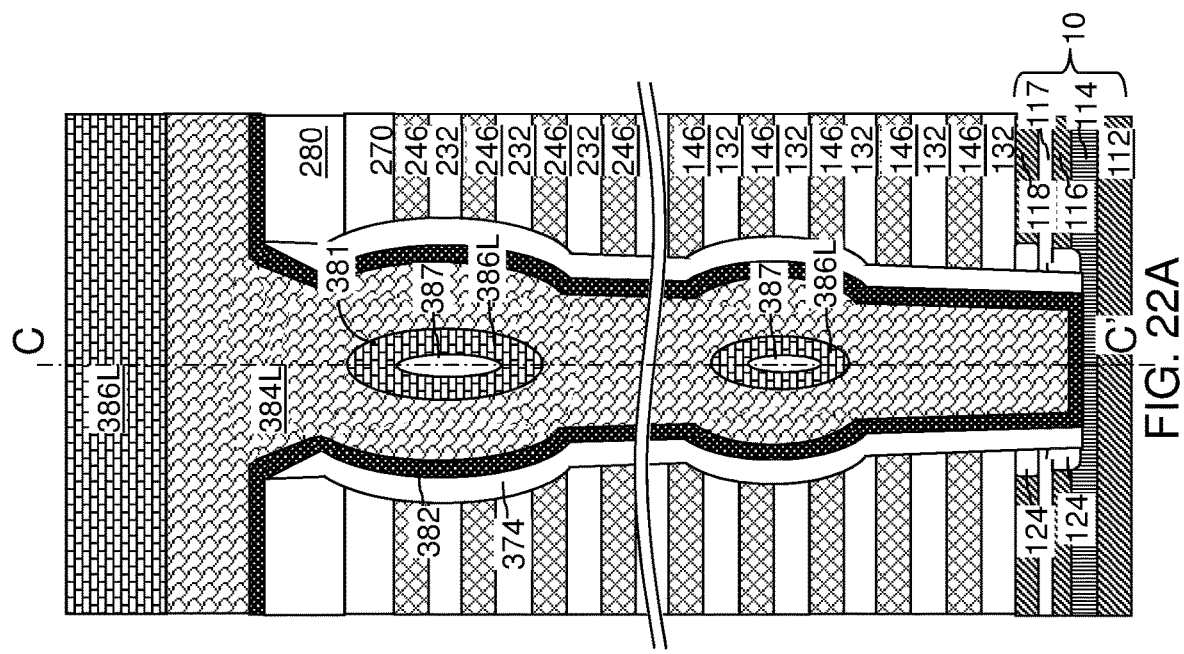
FIG. 22B is a vertical cross-sectional view of the exemplary structure of FIG. 22A along a vertical plane that corresponds to the vertical plane D-D' of FIG. 20B. The vertical plane C-C' is the plane of the vertical cross-section of FIG. 22C.
Figure 22C:
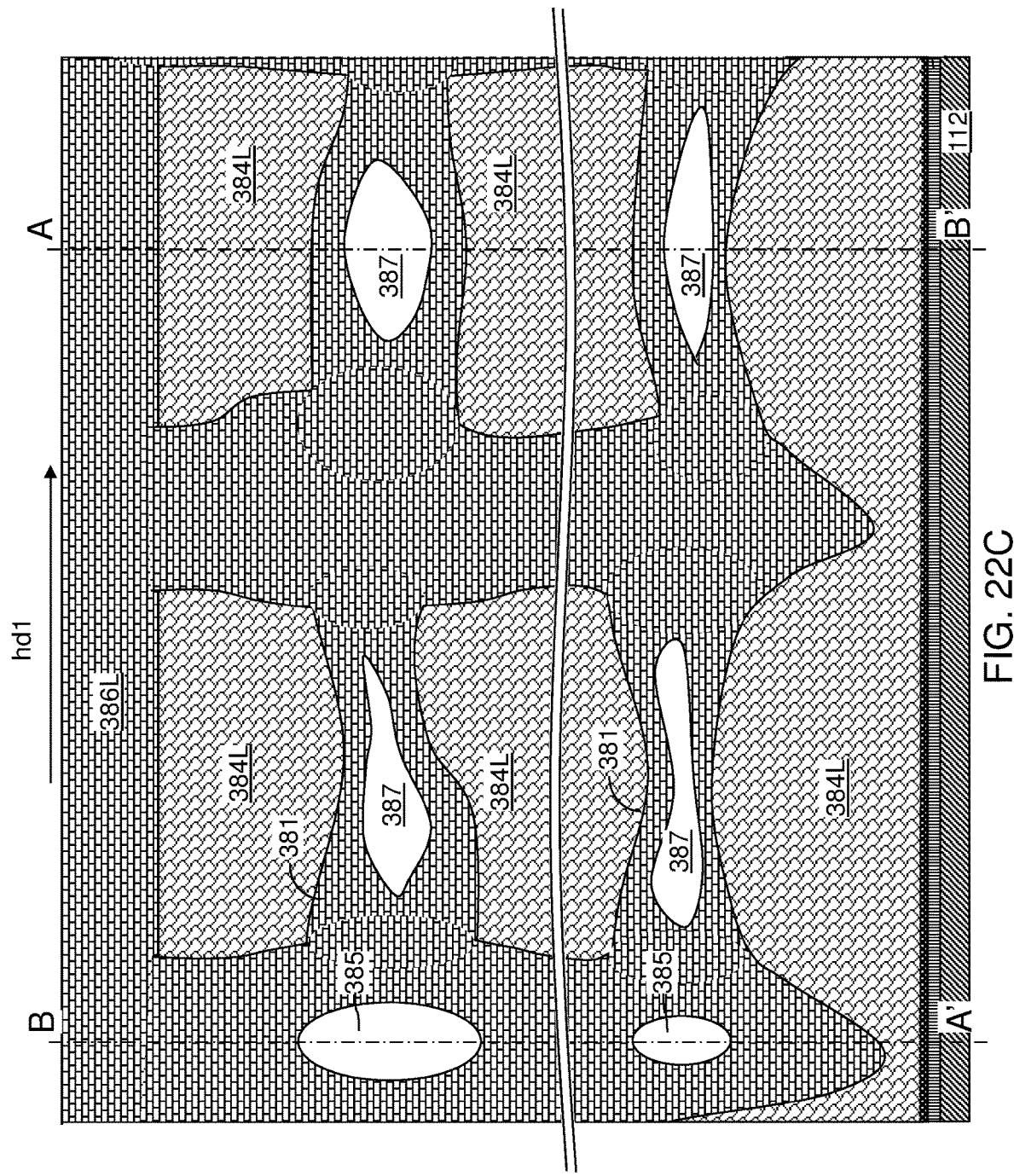
FIG. 22C is a vertical cross-sectional view of the exemplary structure of FIG. 22A along a vertical plane that corresponds to the vertical plane E-E' of FIG. 20B. The vertical plane A-A' is the plane of the vertical cross-section of FIG. 22A. The vertical plane B-B' is the plane of the vertical cross-section of FIG. 22B.

Referring to FIGS. 22A-22C, the etch mask layer 317 may be removed selective to the material of the first doped semiconductor material layer 384L. For example, if the etch mask layer 317 include a photoresist material, the etch mask layer 317 may be removed by ashing. A second doped semiconductor material may be deposited by a conformal deposition process in the interconnected networks of laterally-extending voids 377 and vertically-extending voids 375 directly on physically exposed surfaces of the first doped semiconductor material layer 384L. A second doped semiconductor material layer 386 is formed directly on the first doped semiconductor material layer 384L. The second doped semiconductor material may be p-doped or n-doped, and may include dopant atoms at an atomic concentration in a range from $5.0 \times 10^{19}/cm^3$ to $2.0 \times 10^{21}/cm^3$. For example, the second doped semiconductor material may be a conductive material, and may include doped silicon or a doped silicon-containing semiconductor alloy. In one embodiment, the second doped semiconductor material may include p-doped or n-doped amorphous silicon.

The second doped semiconductor material is deposited in volumes formed by removal of the first portions of the first doped semiconductor material. The second semiconductor material may have the same material composition as, or a different material composition than, the first semiconductor material. In one embodiment, an interfacial semiconductor oxide layer 381 having a thickness that provides conductive electrical contact thereacross may be formed at the interface between each neighboring pair of at least one first doped semiconductor material portion of the first doped semiconductor material layer 384L and at least one second doped semiconductor material portion of the second doped semiconductor material layer 386. The thickness of the interfacial semiconductor oxide layer 381 may be in a range from 0.3 nm to 1.2 nm, such as from 0.5 nm to 1.0 nm. The interfacial semiconductor oxide layer 381 includes a native semiconductor oxide such as native silicon oxide that may be formed by exposure of the semiconductor surfaces of the first doped semiconductor material layer 384L to an oxygen-containing ambient (such as the atmospheric gas composition at 1 atmospheric pressure) for a duration of 3 or more hours at room temperature, or for a duration of more than 1 second at an elevated temperature above 500 degrees Celsius.

In another embodiment, the interfacial semiconductor oxide layer 381 may consist essentially of silicon oxide. In another embodiment, the semiconductor oxide layer 381 may be omitted (e.g., removed by dilute HF cleaning, use of nitrogen ambient during layer formation and/or decreasing the time between deposition of layers). In another embodiment, an etch damaged region due to etch damage may be located at the location of the semiconductor oxide layer 381. In yet another embodiment, a compositional boundary may be located between the first and second doped semiconductor layers if the first and the second doped semiconductor layers have a different composition from each other.

The second doped semiconductor material layer 386 is deposited conformally on the various non-planar physically exposed surfaces of the first doped semiconductor material layer 384L. The second doped semiconductor material layer 386 is deposited within fractions of volumes of the laterally-extending void 377 such that remaining voids within volumes of the laterally-extending void 377 are laterally spaced apart from one another along the first horizontal direction hd1 by deposited material portions of the second doped semiconductor material layer 386. In one embodiment, the sum of thickness of all layers 374, 382, 384 and 386 should be about two times the width of the backside trench 79.

The laterally-extending voids 377 and the vertically-extending voids 375 are partially filled by the second doped semiconductor material layer 386. Encapsulated voids (387, 385) that are bounded entirely by surfaces of the second semiconductor material is formed within deposited material portions of the second doped semiconductor material. Each unfilled volume of the laterally-extending voids 377 may become a first encapsulated void 387 that is encapsulated by surfaces of the second doped semiconductor material layer 386 and surrounded by a portion of the first doped semiconductor material layer 384L. The first encapsulated voids 387 are encircled by the at least one first doped semiconductor material portion in a vertical cross-sectional view, and are spaced from the at least one first doped semiconductor material portion by the at least one second doped semiconductor material portion including the second semiconductor material. A subset of the first encapsulated voids 387 may be located underneath a respective overlying portion of the first doped semiconductor material layer 384L. Each unfilled volume of the vertically-extending void 375 may become a second encapsulated void 385 that is encapsulated by surfaces of the second doped semiconductor material layer 386. The second encapsulated voids 385 may be located within regions that do not underlie the first doped semiconductor material layer 384L.

Figure 23C:
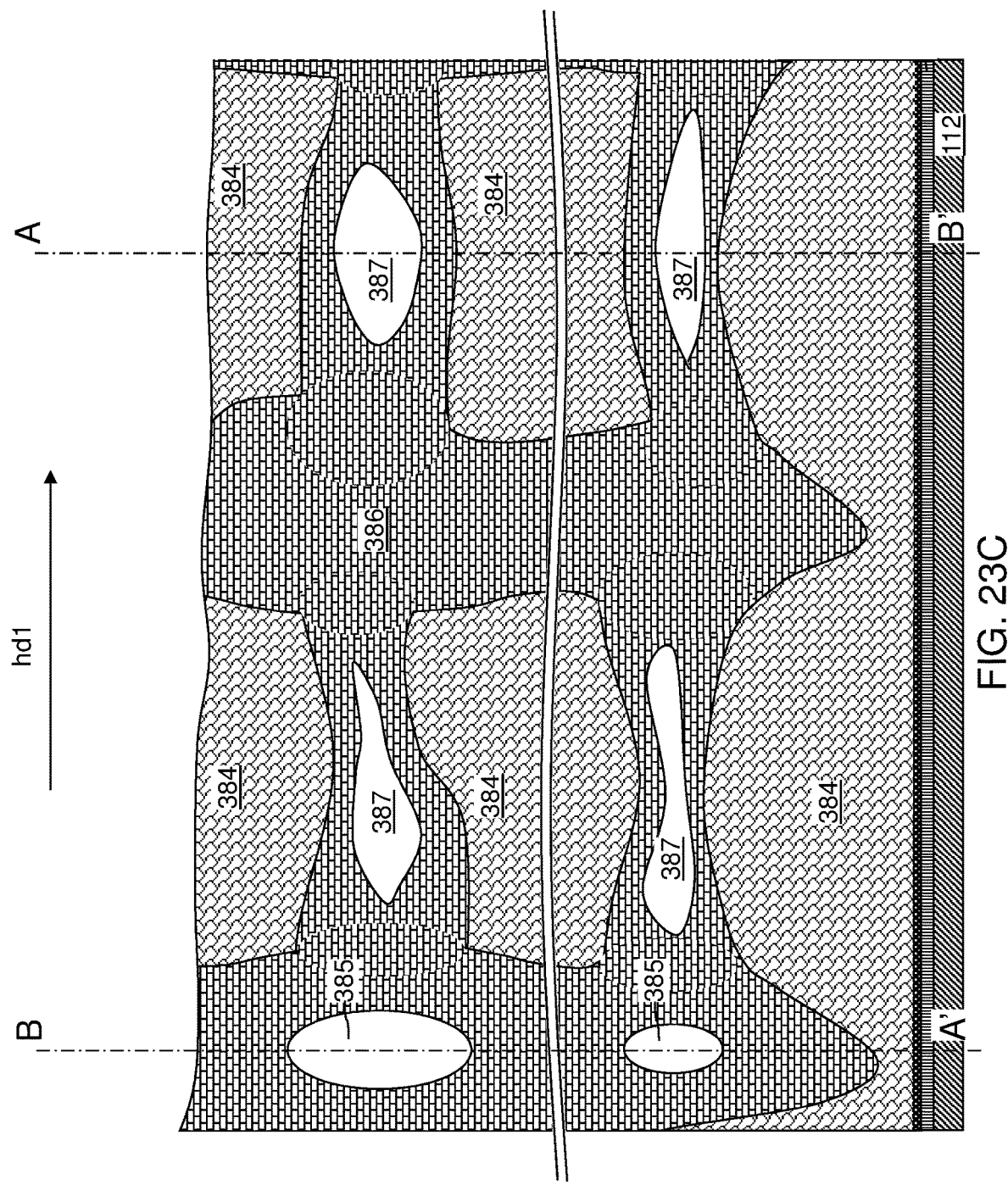
FIG. 23C is a vertical cross-sectional view of the exemplary structure of FIG. 23A along a vertical plane that corresponds to the vertical plane E-E' of FIG. 20B. The vertical plane A-A' is the plane of the vertical cross-section of FIG. 23A. The vertical plane B-B' is the plane of the vertical cross-section of FIG. 23B.

Referring to FIGS. 23A-23C, portions of the first doped semiconductor material layer 384L and the second doped semiconductor material layer 386L overlying the horizontal portion of the first metallic liner 382 above the first contact level dielectric layer 280 may be removed by a recess etch, which may include an isotropic etch process and/or an anisotropic etch process. In one embodiment, an anisotropic etch process that etches the semiconductor materials of the first and second doped semiconductor material layers (384L, 386L) selective to the material of the first metallic liner 382 may be performed to remove portions of the first and second doped semiconductor material layers (384L, 386L) that overlie the first contact level dielectric layer 280. In one embodiment, uppermost portions of the first and second doped semiconductor material layers (384L, 386L) located at upper ends of the backside trenches 79 may be recessed by the anisotropic etch process. In this case, the recessed top surfaces of the first and second doped semiconductor material layers (384L, 386L) may be located at the level of the second insulating cap layer 270 and/or the first contact level dielectric layer 280.

Remaining portions of the first doped semiconductor material layer 384L include multiple first doped semiconductor material portions 384. Remaining portions of the second doped semiconductor material layer 386L include multiple second doped semiconductor material portions 386. Each backside trench 79 may include at least one first doped semiconductor material portion 384 including a respective portion of the first doped semiconductor material, and each backside trench 79 may include at least one second doped semiconductor material portion 386 including a respective portion of the second doped semiconductor material. In one embodiment, the topmost surfaces of the first and second doped semiconductor material portions (384, 386) may have concave surfaces. The concave surfaces of the first and second doped semiconductor material portions (384, 386) may include physically exposed surfaces of the first doped semiconductor material portions 384 and the second doped semiconductor material portions 386. The first metallic liner 382 may function as an etch stop layer for the anisotropic etch process.

Referring to FIGS. 24A-24F and 25A-25C, a second metallic liner 392 and a metallic fill material portion 394 may be formed at an upper portion of each backside trench 79. FIGS. 24C-24F are alternative configurations that may be formed within each backside trench 79. Generally, the second metallic liner 392 may be formed on top surfaces of the at least one first doped semiconductor material portion 384 and/or the at least one second doped semiconductor material portion 386. The second metallic liner 392 may include a metallic nitride material (such as TiN, TaN, and/or WN) and/or an elemental metal (such as Ti, Ta, or W) or an intermetallic alloy. The second metallic liner 392 may be deposited by a conformal or non-conformal deposition process. The thickness of the second metallic liner 392 may be in a range from 3 nm to 60 nm, such as from 6 nm to 30 nm, although lesser and greater thicknesses may also be used. A metallic fill material such as W, Cu, Mo, Co, Ru, or a combination or an alloy thereof may be deposited over the second metallic liner 392. Excess portions of the metallic fill material and the second metallic liner 392 may be removed from above the horizontal plane including the top surface of the first contact level dielectric layer 280 by a planarization process such as chemical mechanical planarization. Each remaining portion of the metallic fill material constitutes a metallic fill material portion 394.

A backside contact via structure (382, 384, 386, 392, 394, 387, 385) is formed within each insulating spacer 374. The backside contact via structure (382, 384, 386, 392, 394, 387, 385) comprises at least one first doped semiconductor material portion 384 comprising the first semiconductor material and at least one second doped semiconductor material portion 386 comprising the second semiconductor material. Each combination of a backside contact via structure (382, 384, 386, 392, 394, 387, 385) and an insulating spacer 374 constitutes a laterally-insulated backside contact assembly 76.

A three-dimensional semiconductor device of the present disclosure may comprise: alternating stacks of insulating layers (132 and/or 232) and electrically conductive layers (146 and/or 246) located over a semiconductor material layer (such as a source contact layer 114), wherein a neighboring pair of alternating stacks {(132, 146), (232, 246)} is laterally spaced apart from each other by a backside trench 79 that laterally extends along a first horizontal direction hd1; memory stack structures 55 vertically extending through a respective one of the alternating stacks {(132, 146), (232, 246)} and comprising a respective vertical semiconductor channel 60; an insulating spacer 374 contacting sidewalls of the backside trench 79; and a backside contact via structure (382, 384, 386, 392, 394, 387, 385) located within the insulating spacer 374 and comprising: at least one first doped semiconductor material portion 384 comprising a first semiconductor material and located within a volume laterally surrounded by the insulating spacer 374; and at least one second doped semiconductor material portion 386 comprising a second semiconductor material and located within the volume, wherein the backside contact via structure (382, 384, 386, 392, 394, 387, 385) has at least one feature selected from: the second semiconductor material has a different material composition than the first semiconductor material; and an interfacial semiconductor oxide layer 381 having a thickness that provides conductive electrical contact thereacross is located at an interface between each neighboring pair of the at least one first doped semiconductor material portion 384 and the at least one second doped semiconductor material portion 386.

In one embodiment, the anisotropic etch process of FIGS. 21A-21C does not physically extend the vertically-extending voids 375 to top surfaces of the first metallic layer 382 located at bottom portions of the backside trenches 79. In this case, at least one first doped semiconductor material portion 384 located in a backside trench 79 may be a single continuous doped semiconductor material portion 384 as illustrated in FIG. 24C.

In one embodiment, the anisotropic etch process of FIGS. 21A-21C physically extends the vertically-extending voids 375 to top surfaces of the first metallic layer 382 located at bottom portions of the backside trenches 79. In this case, at least one first doped semiconductor material portion 384 located in a backside trench 79 may include a plurality of disjoined first doped semiconductor material portions 384 as illustrated in FIGS. 24D and 24F.

Figure 24B:
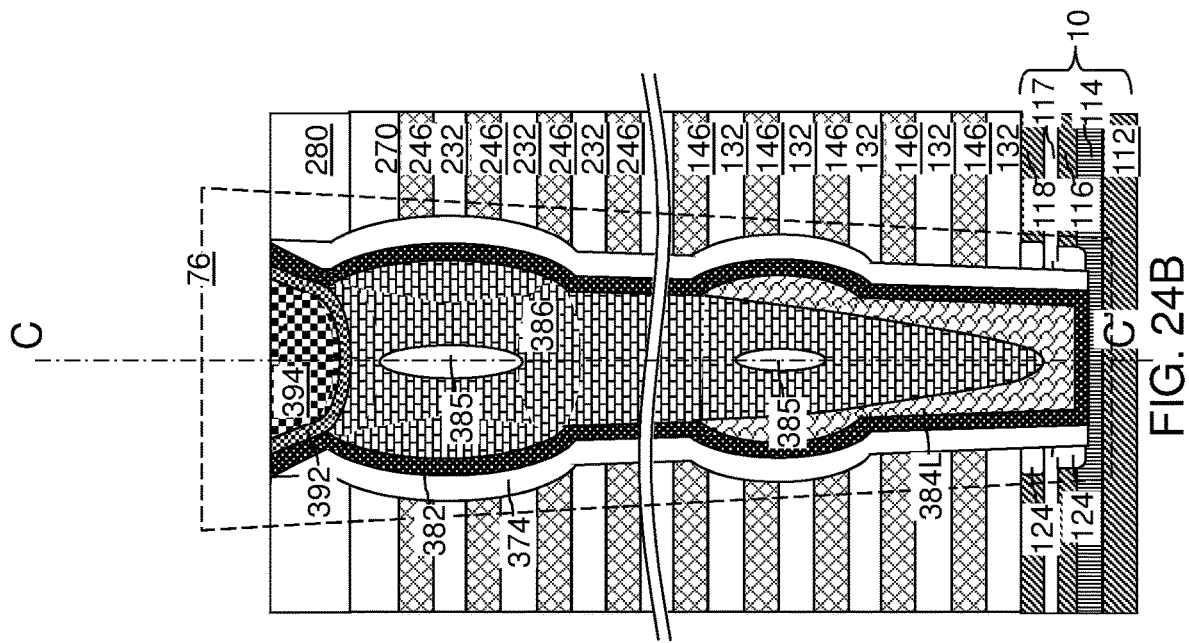
FIG. 24B is a vertical cross-sectional view of the exemplary structure of FIG. 24A along a vertical plane that corresponds to the vertical plane D-D' of FIG. 20B. The vertical plane C-C' is the plane of the vertical cross-section of FIG. 24C.
Figure 24A:
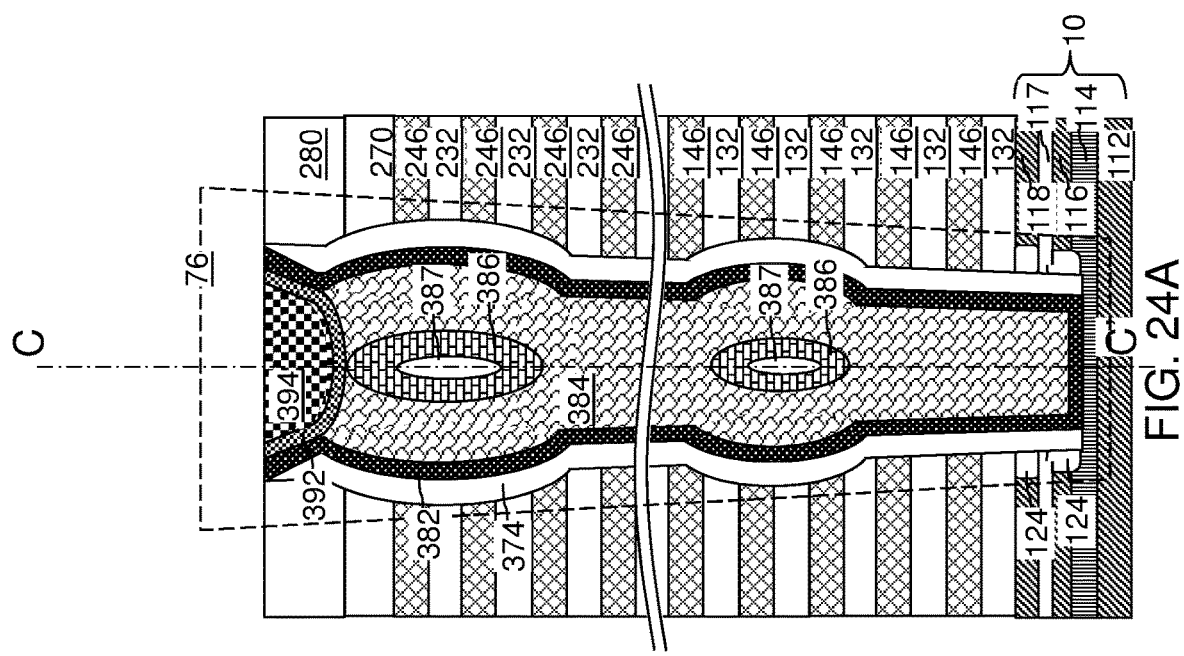
FIG. 24A is a vertical cross-sectional view of the exemplary structure after deposition and planarization of a second metallic liner and a metallic fill material along a vertical plane that corresponds to the vertical plane C-C' of FIG. 20B according to an embodiment of the present disclosure. The vertical plane C-C' is the plane of the vertical cross-section of FIG. 24C.
Figure 24C:
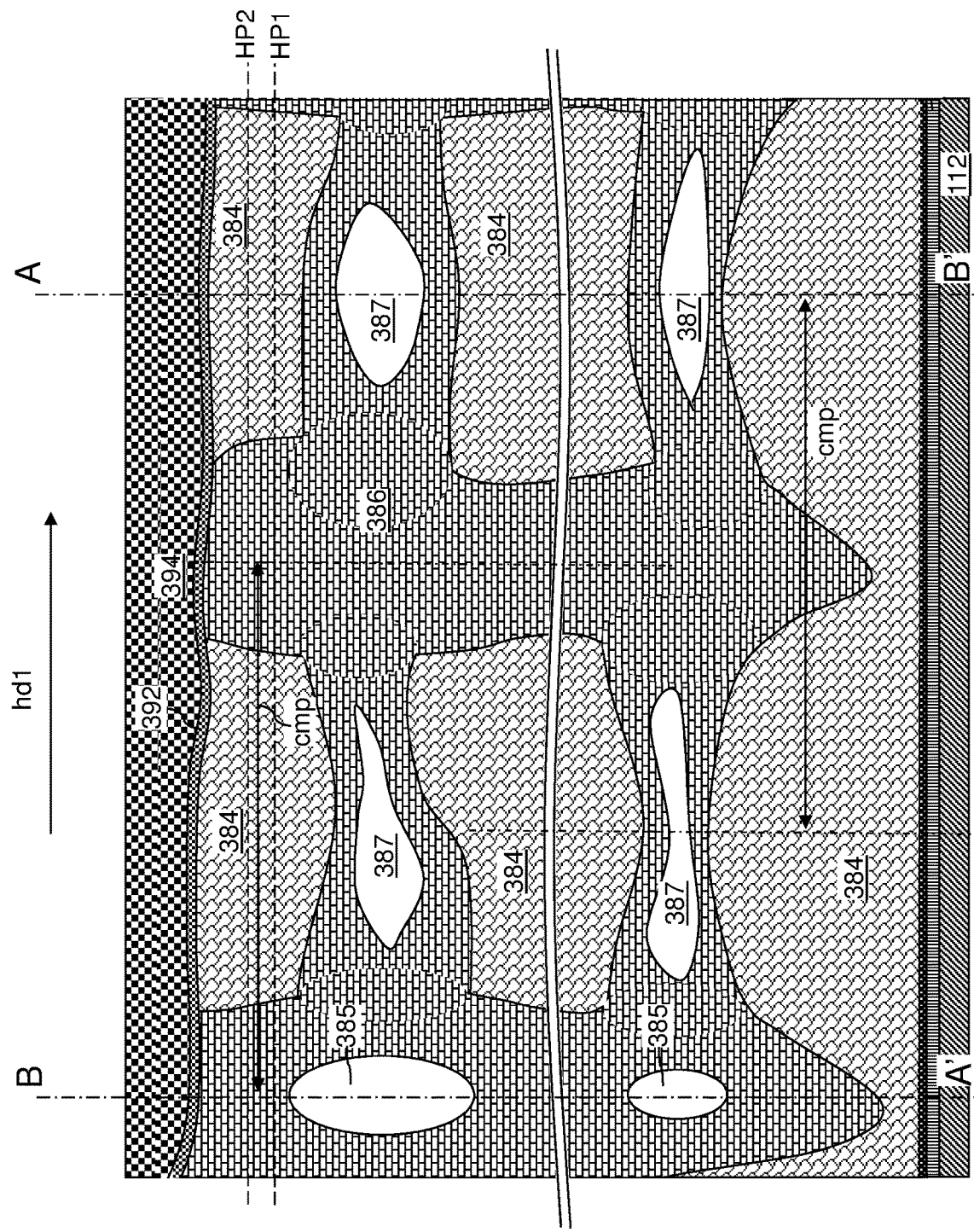
FIG. 24C is a vertical cross-sectional view of the exemplary structure of FIG. 24A along a vertical plane that corresponds to the vertical plane E-E' of FIG. 20B. The vertical plane A-A' is the plane of the vertical cross-section of FIG. 24A. The vertical plane B-B' is the plane of the vertical cross-section of FIG. 24B.

In one embodiment, the at least one second doped semiconductor material portion 386 within the backside trench 79 may be interconnected with one another and may form a single continuous second doped semiconductor material portion 386 as illustrated in FIG. 24C.

Figure 24D:
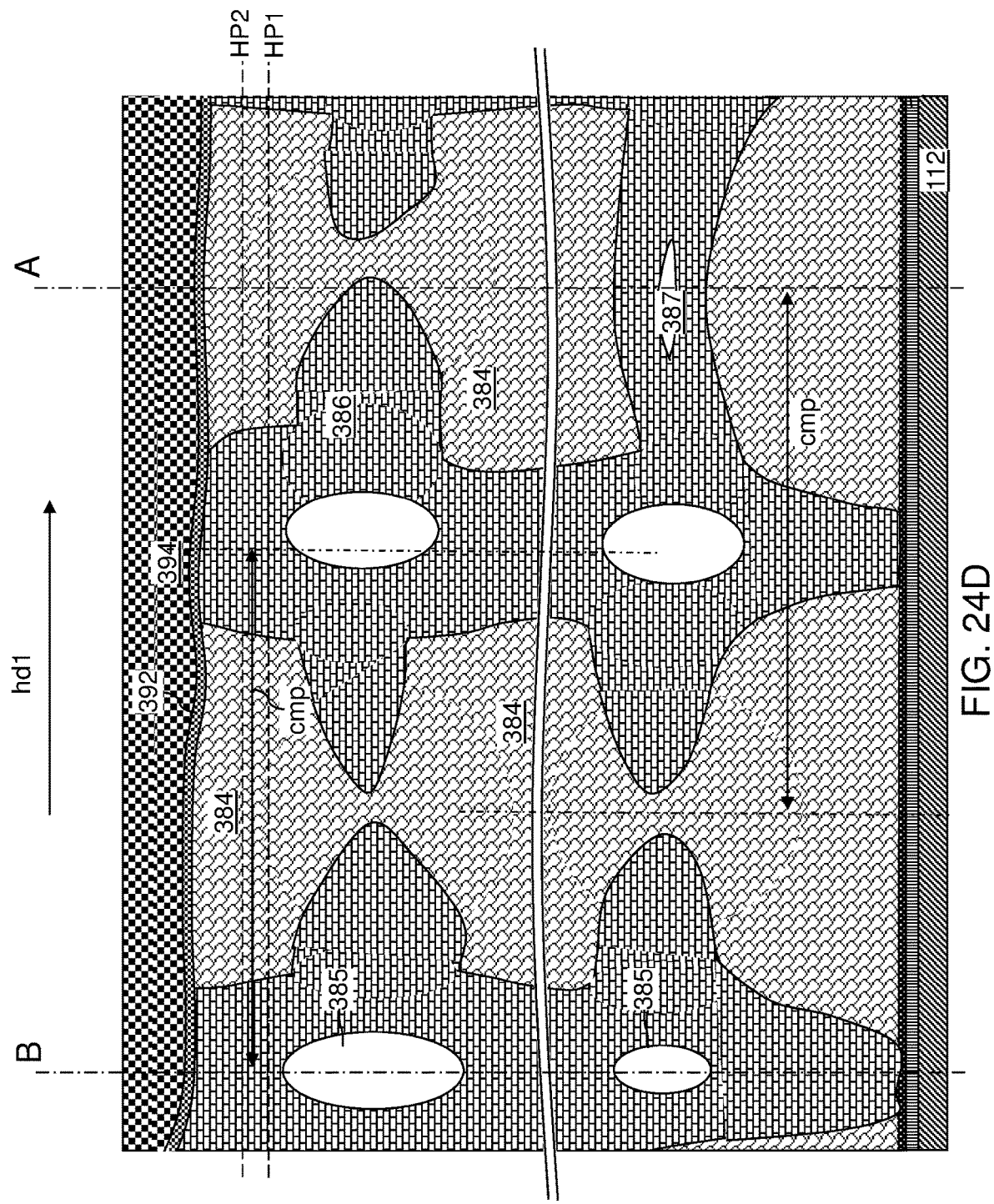
FIGS. 24D, 24E, and 24F illustrate alternative configurations of the exemplary structure at the processing steps of FIGS. 24A-24C according to embodiments of the present disclosure. The vertical planes A-A' correspond to the plane of the vertical cross-section of FIG. 24A. The vertical planes B-B' correspond to the plane of the vertical cross-section of FIG. 24B.
Figure 24E:
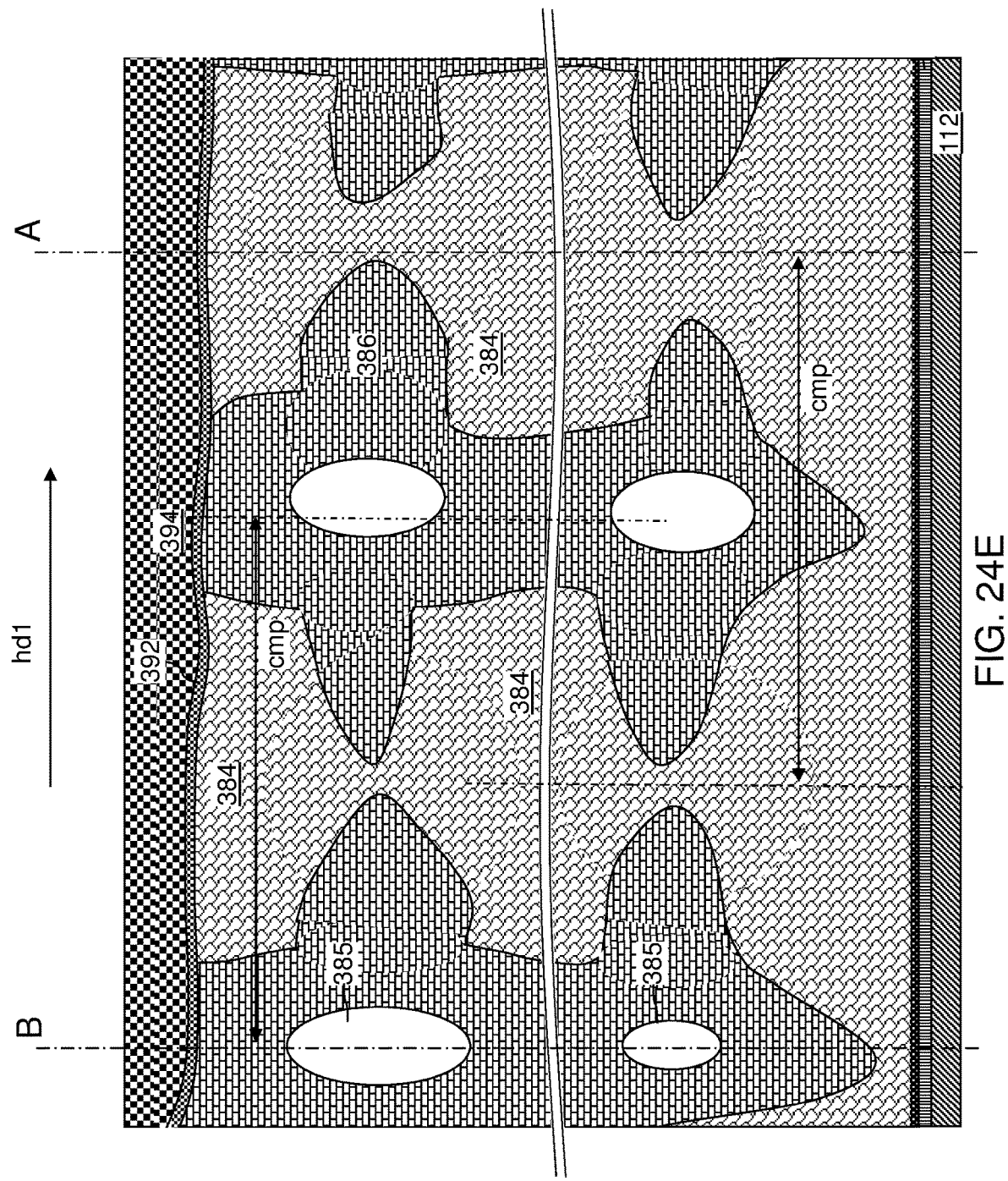
Figure 24F:
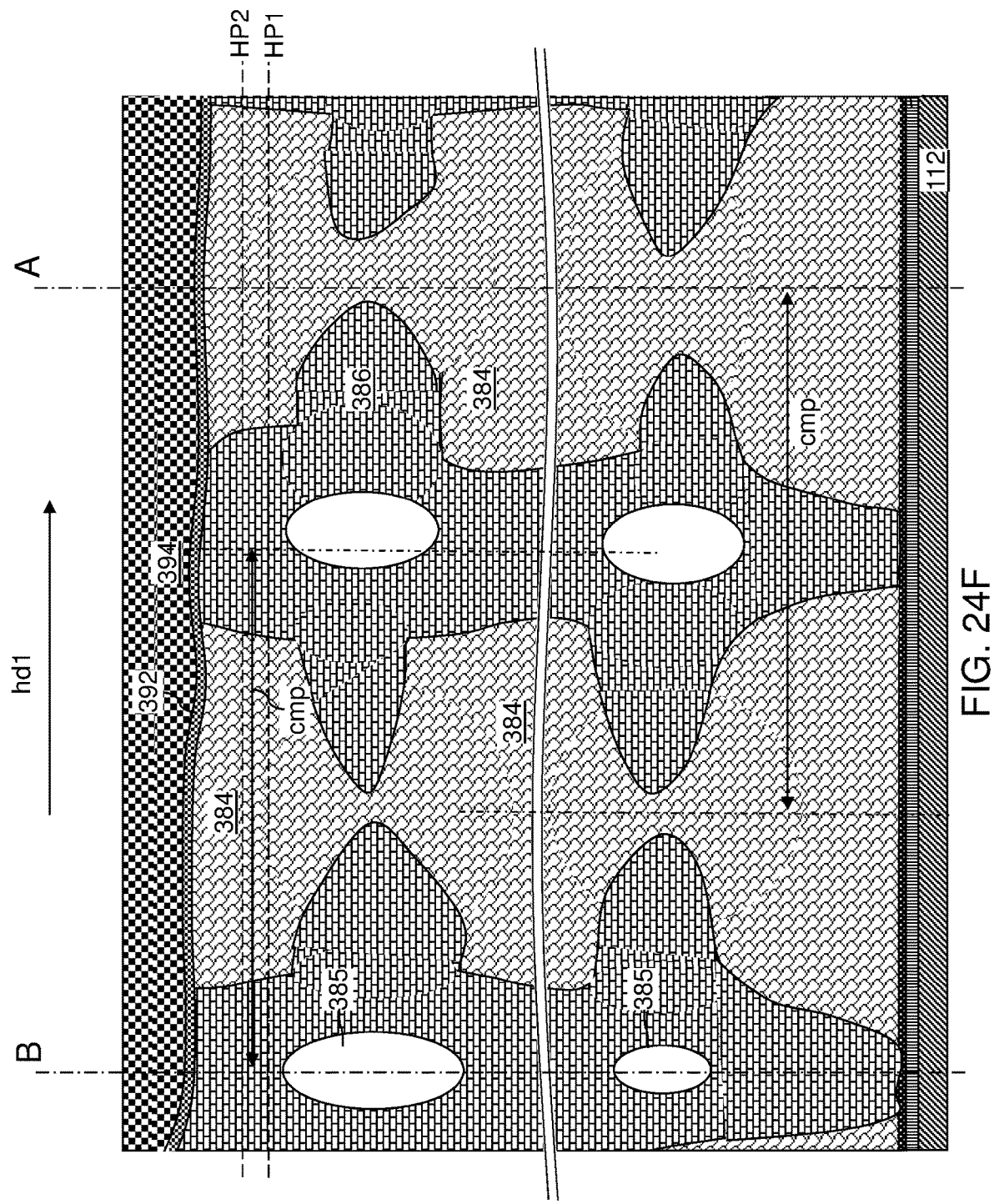
Figure 25A:
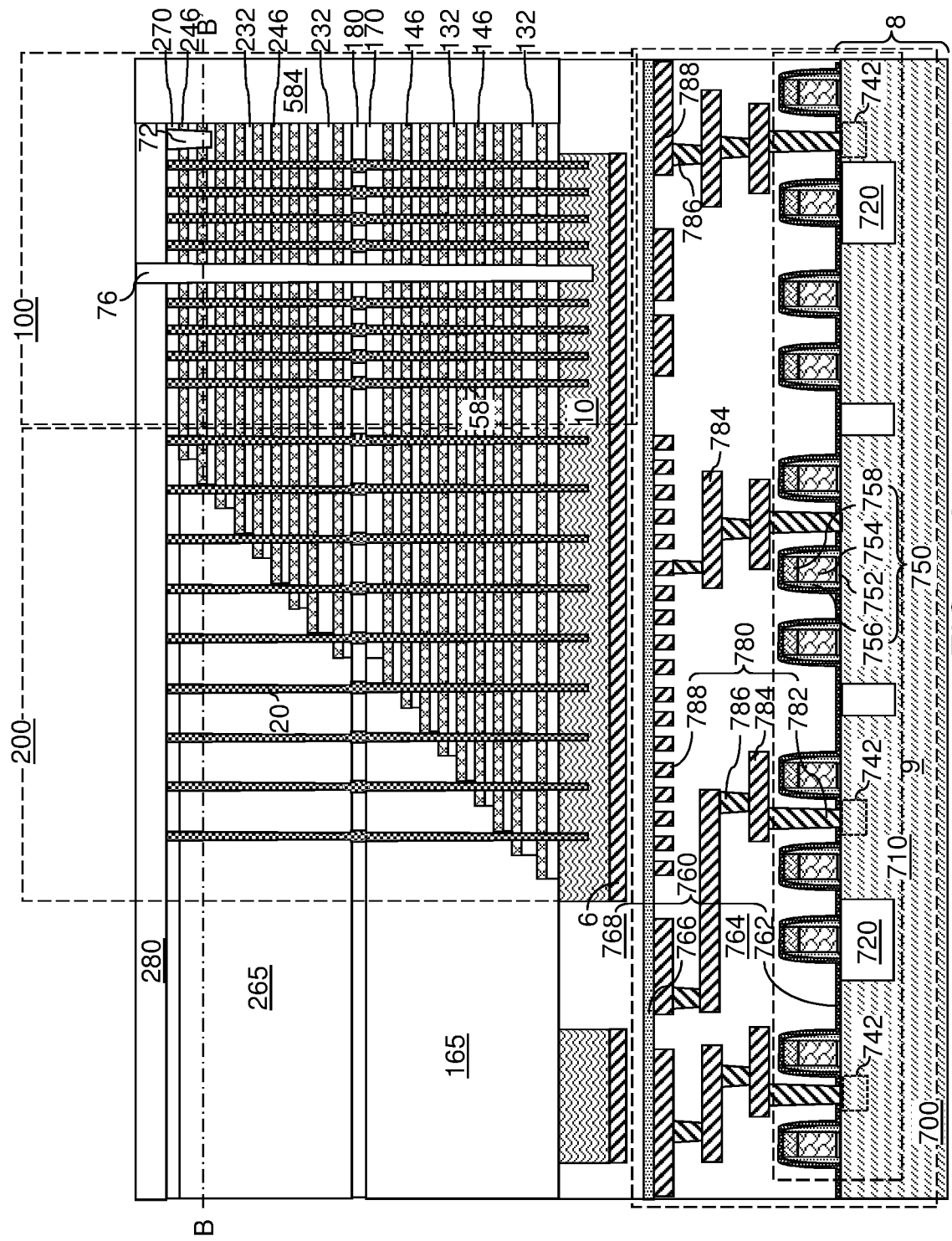
FIG. 25A is a vertical cross-sectional view of the exemplary structure after formation of backside trench fill structures in the backside trenches according to an embodiment of the present disclosure.
Figure 25B:
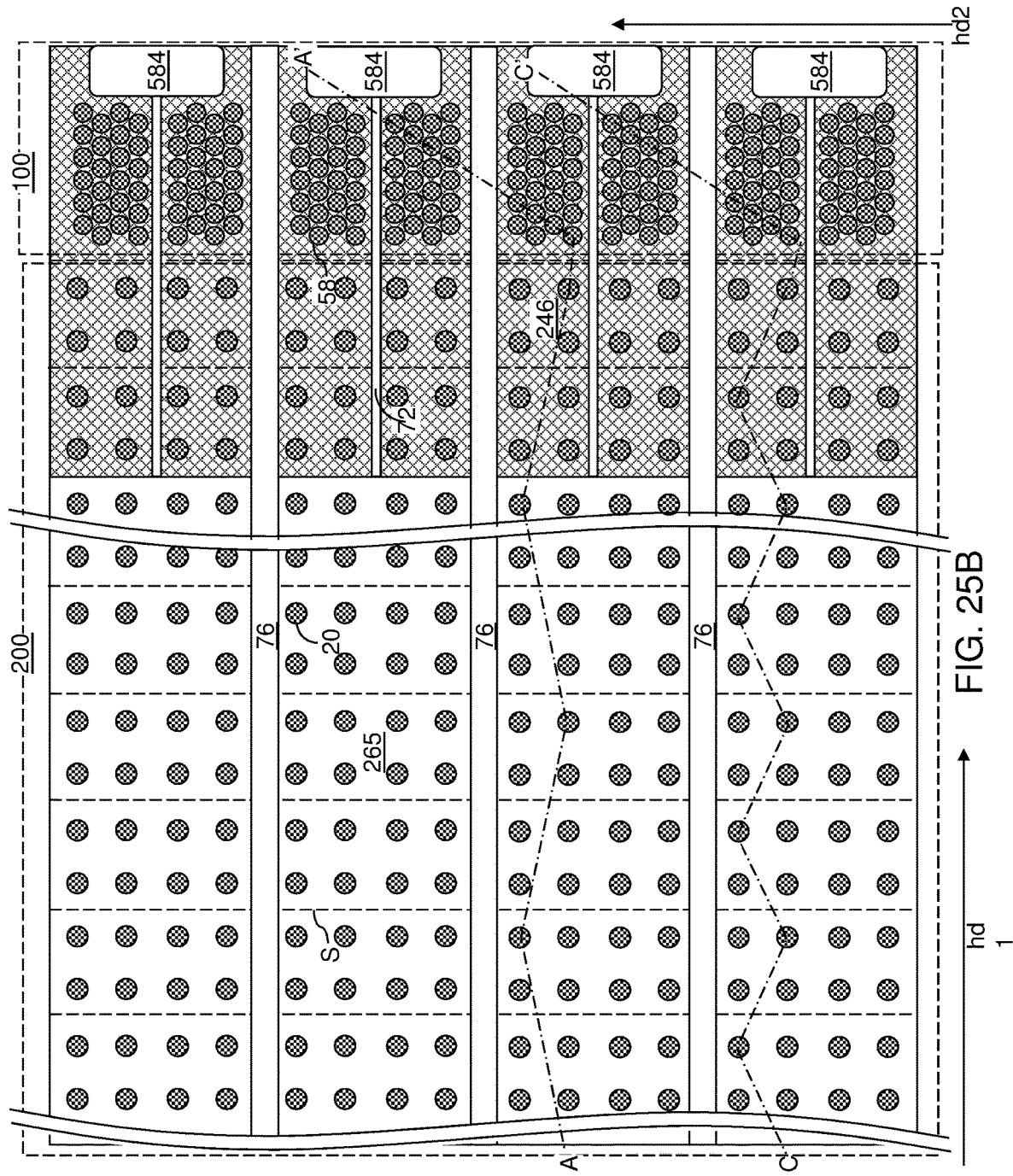
FIG. 25B is a horizontal cross-sectional of the exemplary structure along the horizontal plane B-B' of FIG. 25A. The hinged vertical plane A-A' corresponds to the plane of the vertical cross-sectional view of FIG. 25A.
Figure 25C:
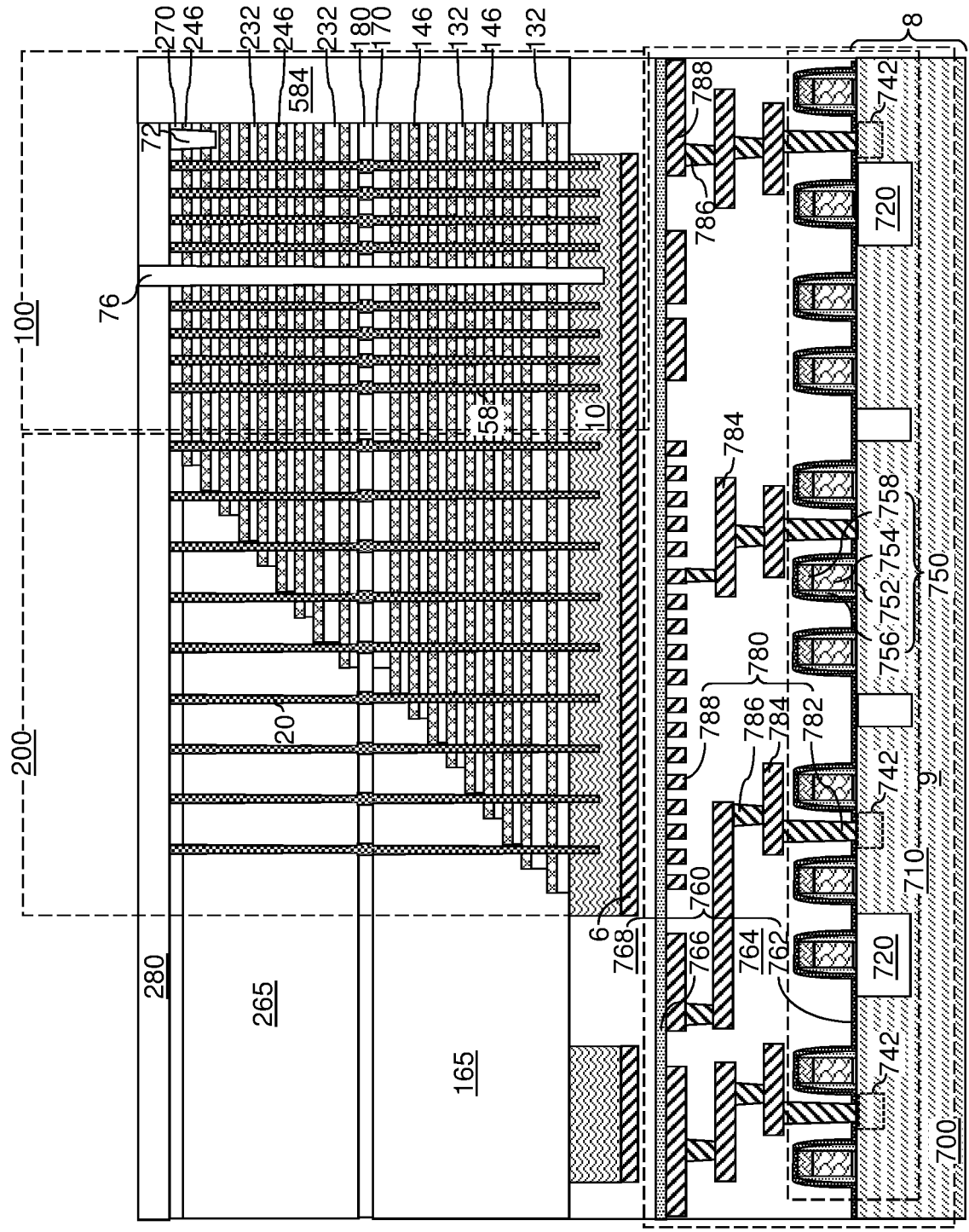
FIG. 25C is a vertical cross-sectional view of the exemplary structure along the vertical plane C-C' of FIG. 25B.

In one embodiment, one of more of the at least one second doped semiconductor material portion 386 within the backside trench 79 may be disconnected from neighboring ones of the at least one second doped semiconductor material portion 386, and may form multiple discrete second doped semiconductor material portion 386 as illustrated in FIGS. 24D, 24D, and 24F.

In one embodiment, a ratio of a total area of the at least one first doped semiconductor material portion 384 relative to a total area of a vertical cross-sectional shape of the backside contact via structure (382, 384, 386, 392, 394, 387, 385) within each of vertical cross-sectional planes that are perpendicular to the first horizontal direction hd1 varies as a function of a lateral distance of a respective vertical cross-sectional plane (such as any vertical plane illustrated in FIGS. 24C-24F) from a reference plane (such as the vertical plane A-A' in FIGS. 24C-24F) that is perpendicular to the first horizontal direction hd1.

In one embodiment, the ratio has a modulation along the first horizontal direction hd1 such that local minima of the ratio (which occurs at locations of the openings through the etch mask layer 317) and local maxima of the ratio (which occurs at locations between a neighboring pair of openings through the etch mask layer 317) alternate as the function of the lateral distance of the respective vertical cross-sectional plane from the reference plane. Each of the local minima may be less than 0.5 and each of the local maxima being greater than 0.5. For example, the local minima of the ratio may occur in each area in which the first portions of the first doped semiconductor material layer 384L are etched by the anisotropic etch process of FIGS. 21A-21C, and the local maxima of the ratio may occur between a neighboring pair of the local minima.

In one embodiment, an elongated section of each backside contact via structure (382, 384, 386, 392, 394, 387, 385) is located between a first horizontal plane HP1 including bottom surfaces of the topmost electrically conductive layers 246 within the alternating stacks {(132, 146), (232, 246)} and a second horizontal plane HP2 including top surfaces of the topmost electrically conductive layers 246 within the alternating stacks {(132, 146), (232, 246)}. Each elongated section has a lateral compositional modulation along the first horizontal direction hd1 such that portions consisting of the first doped semiconductor material alternate with portions consisting of the second doped semiconductor material.

In one embodiment, the openings through the etch mask layer 317 may be formed as a periodic one-dimensional array having a periodic pitch. In this case, an average separation distance between neighboring pairs of the local minima in the ratio of the total area of the at least one first doped semiconductor material portion 384 relative to the total area of a vertical cross-sectional shape of the backside contact via structure (382, 384, 386, 392, 394, 387, 385) may be substantially the same as the periodic pitch. For example, the average separation distance between neighboring pairs of the local minima in the ratio may be within 0.8 times the periodic pitch to 1.2 times the periodic pitch. The average separation distance between neighboring pairs of the local minima in the ratio is herein referred to as a compositional modulation pitch. In one embodiment, neighboring pairs of local minima may be laterally spaced from each other along the first horizontal direction hd1 by a distance that is within 0.9 times the compositional modulation pitch and 1.1 times the compositional modulation pitch.

In one embodiment, the three-dimensional memory device comprises first encapsulated voids 387 that are bounded entirely by surfaces of the second semiconductor material, are encircled by the at least one first doped semiconductor material portion in a vertical cross-sectional view, and are spaced from the at least one first doped semiconductor material portion 384 by the at least one second doped semiconductor material portion 386.

In one embodiment, the at least one first doped semiconductor material portion 384 comprises a plurality of first discrete doped semiconductor material portions 384 that are laterally spaced apart by the at least one second doped semiconductor material portion 386; and the at least one second doped semiconductor material portion 386 contacts three or more of the plurality of first discrete doped semiconductor material portions that are laterally spaced apart along the first horizontal direction hd1 (as illustrated in FIGS. 24D and 24F).

In one embodiment, the at least one first doped semiconductor material portion 384 comprises a plurality of first discrete doped semiconductor material portions 384 that are laterally spaced apart by the at least one second doped semiconductor material portion 386; and the at least one second doped semiconductor material portion 386 comprises a plurality of second discrete doped semiconductor material portions 386 that are interlaced with, and alternate along the first horizontal direction hd1 with, the plurality of first discrete doped semiconductor material portions 384 (as illustrated in FIGS. 24D and 24F).

In one embodiment, the backside contact via structure (382, 384, 386, 392, 394, 387, 385) comprises a first metallic liner 382 that includes: a horizontal portion that contacts the semiconductor material layer (such as the source contact layer 114) and the at least one first doped semiconductor material portion 384; and vertical portions that contact inner sidewalls of the insulating spacer 374, the at least one first doped semiconductor material portion 384, and the at least one second doped semiconductor material portion 386.

In one embodiment, the backside contact via structure (382, 384, 386, 392, 394, 387, 385) comprises: a second metallic liner 392 contacting top surfaces of the at least one first doped semiconductor material portion 384 and contacting surfaces of the first metallic liner 382; and a metal fill material portion 394 overlying the second metallic liner 392 and having a horizontal top surface.

In one embodiment, each of the memory stack structures 55 comprises a vertical stack of memory elements that contacts a respective one of the vertical semiconductor channels 60 and located at levels of the electrically conductive layers (146, 246); and the semiconductor material layer comprises a source contact layer 114 including a doped semiconductor material and electrically connected to a bottom end of each of the vertical semiconductor channels 60.

In one embodiment, the alternating stacks {(132, 146), (232, 246)} comprise stepped surfaces in a staircase region 200, wherein each electrically conductive layer (146, 246) other than a topmost one of the electrically conductive layers 246 laterally extends farther than an overlying electrically conductive layer (146, 246); the electrically conductive layers (146, 246) comprise word lines for the vertical stacks of memory elements; and word line contact via structures (comprising a subset of the staircase-region contact via structures 86) contact a respective one of the electrically conductive layers (146, 246).

Figure 26A:
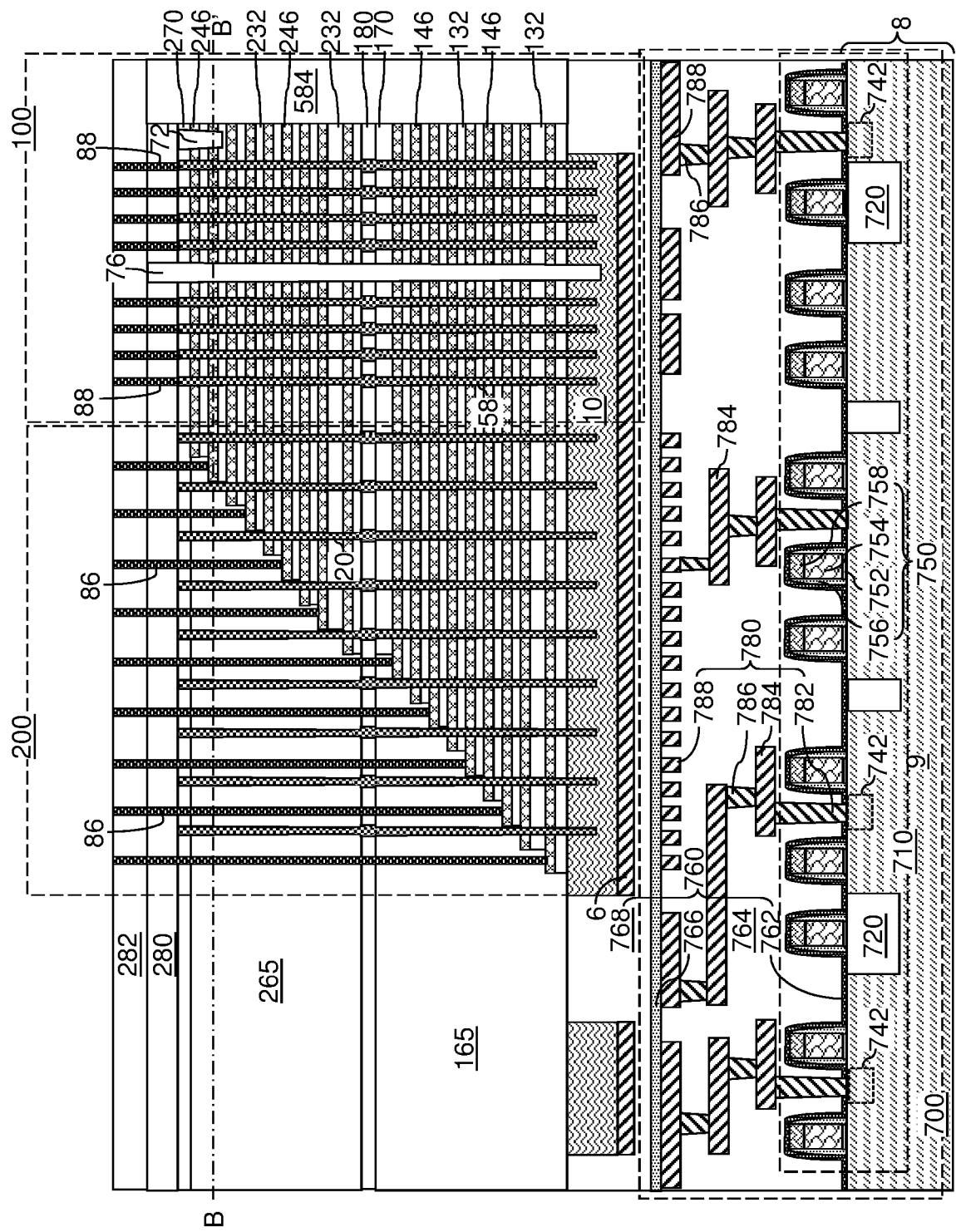
FIG. 26A is a vertical cross-sectional view of the exemplary structure after formation of a second contact level dielectric layer and various contact via structures according to an embodiment of the present disclosure.
Figure 26B:
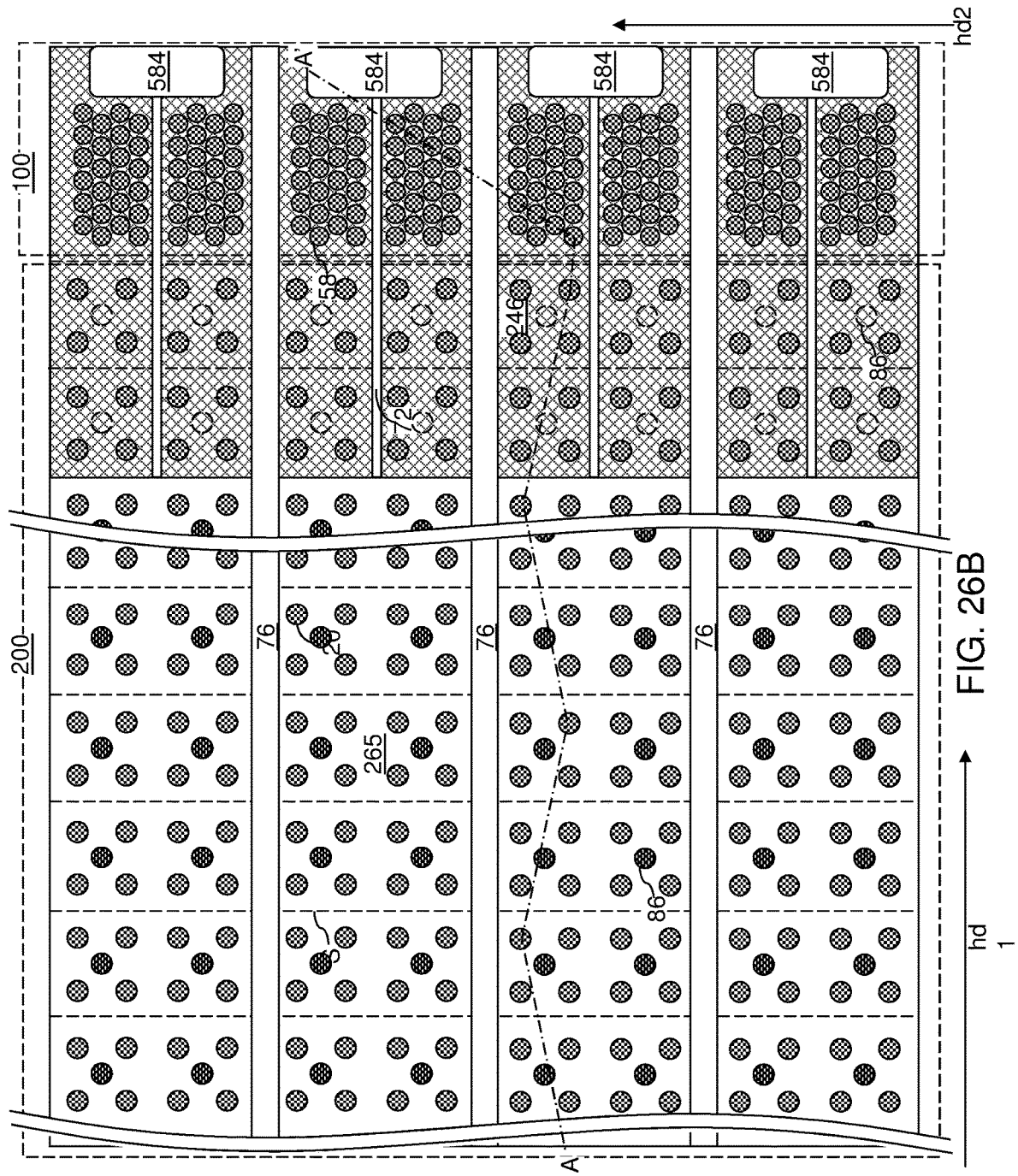
FIG. 26B is a horizontal cross-sectional view of the exemplary structure along the vertical plane B-B' of FIG. 26A. The hinged vertical plane A-A' corresponds to the plane of the vertical cross-sectional view of FIG. 26A.

Referring to FIGS. 26A and 26B, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 27:
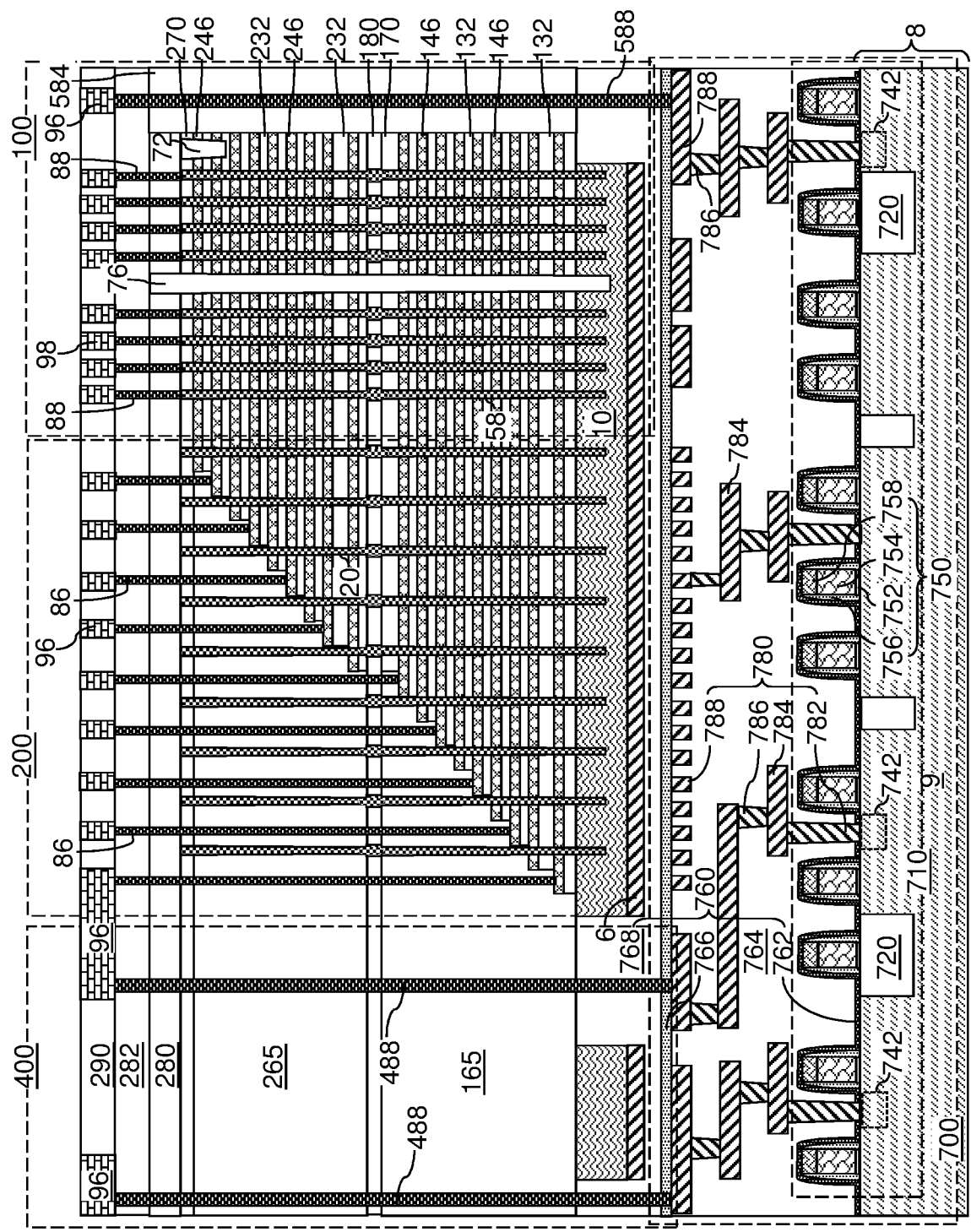
FIG. 27 is a vertical cross-sectional view of the exemplary structure after formation of through-memory-level via structures and upper metal line structures according to an embodiment of the present disclosure.

Referring to FIG. 27, peripheral-region via cavities may be formed through the second and first contact level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

The second doped semiconductor material portions 386 prevent continuous lateral extension of the laterally-extending voids 377 that are formed at the processing steps of FIGS. 19A-19C, and fills a higher fraction of the volume of each backside contact via structure (382, 384, 386, 392, 394, 387, 385) with a higher fraction of solid materials, i.e., materials of the first and second semiconductor material potions (384, 386). The backside contact via structures (382, 384, 386, 392, 394, 387, 385) are formed without any laterally-extending voids 377 that may extend over a significant fraction of the entire length of a backside trench 79. Thus, the three-dimensional memory device may be formed with a higher structural strength and lesser deformation.

The various embodiments disclosed herein provide structures and the methods for forming the same that prevent or reduce the formation of cavities in deep structures such as backside trenches. By preventing or reducing the formation of cavities, the overall structure of a semiconductor device may be strengthened to prevent deformation or collapse.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   alternating stacks of insulating layers and electrically conductive layers located over a semiconductor material layer, wherein a neighboring pair of alternating stacks are laterally spaced apart from each other by a backside trench that laterally extends along a first horizontal direction;
   memory stack structures vertically extending through a respective one of the alternating stacks and comprising a respective vertical semiconductor channel;
   an insulating spacer contacting sidewalls of the backside trench; and
   a backside contact via structure located within the insulating spacer and comprising:
     at least one first doped semiconductor material portion comprising a first semiconductor material located within a volume laterally surrounded by the insulating spacer; and
     at least one second doped semiconductor material portion comprising a second semiconductor material and located within the volume,
   wherein the backside contact via structure has at least one feature selected from:
     (i) the second semiconductor material has a different material composition than the first semiconductor material; or
     (ii) an interfacial semiconductor oxide layer having a thickness that provides conductive electrical contact thereacross is located at an interface between each neighboring pair of the at least one first doped semiconductor material portion and the at least one second doped semiconductor material portion,
   wherein the three-dimensional memory device has at least one feature selected from:
     (A) a ratio of a total area of the at least one first doped semiconductor material portion relative to a total area of a vertical cross-sectional shape of the backside contact via structure within each of vertical cross-sectional planes that are perpendicular to the first horizontal direction varies as a function of a lateral distance of a respective vertical cross-sectional plane from a reference plane that is perpendicular to the first horizontal direction; or
     (B) an elongated section of the backside contact via structure is located between a first horizontal plane including bottom surfaces of a topmost electrically conductive layer within the alternating stacks and a second horizontal plane including top surfaces of the topmost electrically conductive layer within the alternating stacks; and
     the elongated section has a lateral compositional modulation along the first horizontal direction such that portions consisting of the at least one first doped semiconductor material alternate with portions consisting of the at least one second doped semiconductor material.

2. The three-dimensional memory device of claim 1, wherein the ratio has a modulation along the first horizontal direction such that local minima of the ratio and local maxima of the ratio alternate as the function of the lateral distance of the respective vertical cross-sectional plane from the reference plane, each of the local minima being less than 0.5 and each of the local maxima being greater than 0.5.

3. The three-dimensional memory device of claim 2, wherein neighboring pairs of the local minima are laterally spaced from each other along the first horizontal direction by a distance that is within 0.9 times a compositional modulation pitch and 1.1 times the compositional modulation pitch.

4. The three-dimensional memory device of claim 1, wherein:
   each of the memory stack structures comprises a vertical stack of memory elements that contacts a respective one of the vertical semiconductor channels and located at levels of the electrically conductive layers; and
   the semiconductor material layer comprises a source contact layer including a doped semiconductor material and electrically connected to a bottom end of each of the vertical semiconductor channels.

5. The three-dimensional memory device of claim 4, wherein:
   the alternating stacks comprise stepped surfaces in a staircase region, wherein each electrically conductive layer other than a topmost one of the electrically conductive layers laterally extends farther than an overlying electrically conductive layer;
   the electrically conductive layers comprise word lines for the vertical stacks of memory elements; and
   word line contact via structures contact a respective one of the electrically conductive layers.

6. The three-dimensional memory device of claim 1, wherein three-dimensional memory device comprises the feature (A).

7. The three-dimensional memory device of claim 1, wherein three-dimensional memory device comprises the feature (B).

8. The three-dimensional memory device of claim 1, wherein the backside contact via structure has the feature (i).

9. The three-dimensional memory device of claim 1, wherein the backside contact via structure has the feature (ii).

10. A three-dimensional memory device, comprising:
    alternating stacks of insulating layers and electrically conductive layers located over a semiconductor material layer, wherein a neighboring pair of alternating stacks are laterally spaced apart from each other by a backside trench that laterally extends along a first horizontal direction;
    memory stack structures vertically extending through a respective one of the alternating stacks and comprising a respective vertical semiconductor channel;
    an insulating spacer contacting sidewalls of the backside trench; and
    a backside contact via structure located within the insulating spacer and comprising:
      at least one first doped semiconductor material portion comprising a first semiconductor material located within a volume laterally surrounded by the insulating spacer; and
      at least one second doped semiconductor material portion comprising a second semiconductor material and located within the volume,
    wherein the backside contact via structure has at least one feature selected from:
      the second semiconductor material has a different material composition than the first semiconductor material; or an interfacial semiconductor oxide layer having a thickness that provides conductive electrical contact thereacross is located at an interface between each neighboring pair of the at least one first doped semiconductor material portion and the at least one second doped semiconductor material portion, wherein:
(C) the three-dimensional memory device further comprises voids that are bounded entirely by surfaces of the second semiconductor material, are encircled by the at least one first doped semiconductor material portion in a vertical cross-sectional view, and are spaced from the at least one first doped semiconductor material portion by the at least one second doped semiconductor material portion; or (D) the at least one first doped semiconductor material portion comprises a plurality of first discrete doped semiconductor material portions that are laterally spaced apart by the at least one second doped semiconductor material portion; and the at least one second doped semiconductor material portion contacts three or more of the plurality of first discrete doped semiconductor material portions that are laterally spaced apart along the first horizontal direction.

11. The three-dimensional memory device of claim 10, wherein three-dimensional memory device comprises the feature (C).

12. The three-dimensional memory device of claim 10, wherein three-dimensional memory device comprises the feature (D).

13. The three-dimensional memory device of claim 10, wherein the backside contact via structure has the feature (i).

14. The three-dimensional memory device of claim 10, wherein the backside contact via structure has the feature (ii).

15. A three-dimensional memory device, comprising:
alternating stacks of insulating layers and electrically conductive layers located over a semiconductor material layer, wherein a neighboring pair of alternating stacks are laterally spaced apart from each other by a backside trench that laterally extends along a first horizontal direction;
memory stack structures vertically extending through a respective one of the alternating stacks and comprising a respective vertical semiconductor channel;
an insulating spacer contacting sidewalls of the backside trench; and
a backside contact via structure located within the insulating spacer and comprising:
at least one first doped semiconductor material portion comprising a first semiconductor material located within a volume laterally surrounded by the insulating spacer; and
at least one second doped semiconductor material portion comprising a second semiconductor material and located within the volume, wherein the backside contact via structure has at least one feature selected from:
the second semiconductor material has a different material composition than the first semiconductor material; or
an interfacial semiconductor oxide layer having a thickness that provides conductive electrical contact thereacross is located at an interface between each neighboring pair of the at least one first doped semiconductor material portion and the at least one second doped semiconductor material portion, wherein:
(E) the at least one first doped semiconductor material portion comprises a plurality of first discrete doped semiconductor material portions that are laterally spaced apart by the at least one second doped semiconductor material portion; and the at least one second doped semiconductor material portion comprises a plurality of second discrete doped semiconductor material portions that are interlaced with, and alternate along the first horizontal direction with, the plurality of first discrete doped semiconductor material portions; or (F) the backside contact via structure comprises a first metallic liner that includes:
a horizontal portion that contacts the semiconductor material layer and the at least one first doped semiconductor material portion; and
vertical portions that contact inner sidewalls of the insulating spacer, the at least one first doped semiconductor material portion, and the at least one second doped semiconductor material portion.

16. The three-dimensional memory device of claim 15, wherein the backside contact via structure further comprises: a second metallic liner contacting top surfaces of the at least one first doped semiconductor material portion and contacting surfaces of the first metallic liner; and a metal fill material portion overlying the second metallic liner and having a horizontal top surface.

17. The three-dimensional memory device of claim 15, wherein three-dimensional memory device comprises the feature (E).

18. The three-dimensional memory device of claim 15, wherein three-dimensional memory device comprises the feature (F).

19. The three-dimensional memory device of claim 15, wherein the backside contact via structure has the feature (i).

20. The three-dimensional memory device of claim 15, wherein the backside contact via structure has the feature (ii).

* * * * *